(12) United States Patent
Wodrich et al.

(10) Patent No.: US 11,100,261 B2
(45) Date of Patent: Aug. 24, 2021

(54) METHOD OF WIRELESS GEOLOCATED INFORMATION COMMUNICATION IN SELF-VERIFYING ARRAYS

(71) Applicant: Middle Chart, LLC, Jacksonville, FL (US)

(72) Inventors: Michael Wodrich, Jacksonville, FL (US); Michael S. Santarone, Jacksonville, FL (US); Randall Pugh, Jacksonville, FL (US); Jason E. Duff, Jacksonville, FL (US)

(73) Assignee: Middle Chart, LLC, Jacksonville, FL (US)

( * ) Notice: Subject to any disclaimer, the term of this patent is extended or adjusted under 35 U.S.C. 154(b) by 0 days.

(21) Appl. No.: 17/176,849

(22) Filed: Feb. 16, 2021

(65) Prior Publication Data

US 2021/0165927 A1   Jun. 3, 2021

Related U.S. Application Data

(63) Continuation of application No. 16/915,155, filed on Jun. 29, 2020, now Pat. No. 10,943,034, which is a
(Continued)

(51) Int. Cl.
*G06F 30/13* (2020.01)
*G06T 17/05* (2011.01)
(Continued)

(52) U.S. Cl.
CPC .............. *G06F 30/13* (2020.01); *G01S 19/48* (2013.01); *G06Q 99/00* (2013.01); *G06T 17/05* (2013.01); *G06T 19/006* (2013.01); *G01S 19/01* (2013.01)

(58) Field of Classification Search
CPC .......... G06F 30/13; G01S 19/48; G01S 19/01; G06T 19/006; G06T 17/05; G06Q 99/00
See application file for complete search history.

(56) References Cited

U.S. PATENT DOCUMENTS

| 5,884,202 A | 3/1999 | Arjomand |
| 5,933,479 A | 8/1999 | Michael et al. |

(Continued)

FOREIGN PATENT DOCUMENTS

| CN | 102147597 A | 8/2011 |
| EP | 2726817 B1 | 9/2018 |

(Continued)

OTHER PUBLICATIONS

Azeez et al., "Wireless Indoor Localization Systems and Techniques: Survey and Comparative Study" Indonesian Journal of Electrical Engineering and Computer Science, vol. 3, No. 2, Aug. 2016, pp. 392-409 (Year: 2016).
(Continued)

*Primary Examiner* — Brandon J Miller
(74) *Attorney, Agent, or Firm* — Rogers Towers, P.A.; Joseph P. Kincart

(57) ABSTRACT

Methods and apparatus for transmitting information associated with verified positions of Nodes based upon wireless communications between Nodes included in an array. Values for variables derived from multiple wireless transmissions between Nodes are aggregated, and a position of a particular Node may be determined based upon multiple data sets generated by multiple communications between disparate Nodes. Information is geolocated based upon the respective positions of the disparate Nodes. A user interface may provide a pictorial view of positions of all or some Nodes in an array, as well as associated information.

20 Claims, 45 Drawing Sheets

Related U.S. Application Data continuation of application No. 16/775,223, filed on Jan. 28, 2020, now Pat. No. 10,740,503, which is a continuation-in-part of application No. 16/721,906, filed on Dec. 19, 2019, now Pat. No. 10,726,167, and a continuation-in-part of application No. 16/688,775, filed on Nov. 19, 2019, now Pat. No. 10,628,617, which is a continuation of application No. 16/657,660, filed on Oct. 18, 2019, which is a continuation of application No. 16/528,104, filed on Jul. 31, 2019, now Pat. No. 10,671,767, which is a continuation of application No. 16/504,919, filed on Jul. 8, 2019, now Pat. No. 10,740,502.

(60) Provisional application No. 62/793,714, filed on Jan. 17, 2019.

(51) Int. Cl.
*G06Q 99/00* (2006.01)
*G06T 19/00* (2011.01)
*G01S 19/48* (2010.01)
*G01S 19/01* (2010.01)

(56) References Cited

U.S. PATENT DOCUMENTS

| | | | |
|---|---|---|---|
| 6,006,021 | A | 12/1999 | Tognazzini |
| 6,292,108 | B1 | 9/2001 | Straser et al. |
| 6,321,158 | B1 | 11/2001 | DeLorme et al. |
| 6,853,958 | B1 | 2/2005 | Turin et al. |
| 7,057,557 | B2 | 6/2006 | Lee |
| 8,843,350 | B2 | 9/2014 | Jacobi et al. |
| 8,996,156 | B2 | 3/2015 | Melzer-Jokisch et al. |
| 9,064,219 | B2 | 6/2015 | Hall et al. |
| 9,342,928 | B2 | 5/2016 | Rasane et al. |
| 9,668,106 | B2 | 5/2017 | Lin et al. |
| 9,703,517 | B2 | 7/2017 | Andolina |
| 9,772,396 | B2 | 9/2017 | Liao et al. |
| 10,054,914 | B2 | 8/2018 | Vartiainen et al. |
| 10,130,285 | B1 | 11/2018 | Singamsetty et al. |
| 10,149,141 | B1 | 12/2018 | Stamatakis et al. |
| 10,222,301 | B2 | 3/2019 | Silva et al. |
| 10,278,016 | B2 * | 4/2019 | Bitra .................. H04W 4/023 |
| 10,355,351 | B2 | 7/2019 | Cummings et al. |
| 10,444,324 | B2 | 10/2019 | Dackefjord et al. |
| 10,824,774 | B2 | 11/2020 | Santarone et al. |
| 10,825,247 | B1 | 11/2020 | Vincent et al. |
| 10,872,179 | B2 | 12/2020 | Wodrich et al. |
| 2002/0095269 | A1 | 7/2002 | Natalini et al. |
| 2002/0181405 | A1 | 12/2002 | Ying |
| 2003/0110001 | A1 | 6/2003 | Chassin et al. |
| 2003/0135324 | A1 | 7/2003 | Navab |
| 2003/0163440 | A1 | 8/2003 | Tonack |
| 2003/0195008 | A1 | 10/2003 | Mohi et al. |
| 2004/0002786 | A1 | 1/2004 | Sasaki |
| 2004/0119662 | A1 | 6/2004 | Dempski |
| 2004/0122628 | A1 | 6/2004 | Laurie |
| 2005/0165576 | A1 | 7/2005 | Jesmonth |
| 2005/0275525 | A1 | 12/2005 | Ahmed |
| 2006/0028345 | A1 | 2/2006 | Lee |
| 2006/0084436 | A1 | 4/2006 | Green et al. |
| 2006/0084463 | A1 | 4/2006 | Yoo et al. |
| 2007/0004449 | A1 | 1/2007 | Sham |
| 2008/0180246 | A1 | 7/2008 | Malik |
| 2009/0189810 | A1 | 7/2009 | Murray |
| 2009/0216438 | A1 | 8/2009 | Shafer |
| 2010/0103036 | A1 | 4/2010 | Malone et al. |
| 2010/0107635 | A1 | 5/2010 | Tsubone |
| 2010/0271263 | A1 | 10/2010 | Moshfeghi |
| 2010/0296075 | A1 | 11/2010 | Hinderling et al. |
| 2010/0309044 | A1 | 12/2010 | Ische et al. |
| 2011/0047516 | A1 | 2/2011 | Pavan et al. |
| 2011/0068906 | A1 | 3/2011 | Shafer et al. |
| 2011/0115816 | A1 | 5/2011 | Brackney |
| 2011/0182202 | A1 | 7/2011 | Olofsson et al. |
| 2011/0251787 | A1 | 10/2011 | Gupta et al. |
| 2012/0087212 | A1 | 4/2012 | Vartanian et al. |
| 2012/0188847 | A1 | 7/2012 | Miyamoto et al. |
| 2012/0204646 | A1 | 8/2012 | Lee et al. |
| 2012/0214507 | A1 | 8/2012 | Vartanian et al. |
| 2012/0296610 | A1 | 11/2012 | Hailemariam et al. |
| 2013/0010103 | A1 | 1/2013 | Ihara et al. |
| 2013/0120630 | A1 | 5/2013 | Kim et al. |
| 2013/0197685 | A1 | 8/2013 | Matsunaga et al. |
| 2013/0283529 | A1 | 10/2013 | Hayes et al. |
| 2013/0288719 | A1 | 10/2013 | Alonzo |
| 2013/0297555 | A1 | 11/2013 | Fadell et al. |
| 2013/0345975 | A1 | 12/2013 | Vulcano et al. |
| 2014/0084909 | A1 | 3/2014 | Pagani |
| 2014/0107828 | A1 | 4/2014 | Zhu et al. |
| 2014/0156455 | A1 | 6/2014 | Atwood et al. |
| 2014/0188394 | A1 | 7/2014 | Febonio et al. |
| 2014/0244160 | A1 | 8/2014 | Cragun et al. |
| 2014/0266755 | A1 | 9/2014 | Arensmeier et al. |
| 2014/0274151 | A1 | 9/2014 | Pattabiraman et al. |
| 2014/0277594 | A1 | 9/2014 | Nixon et al. |
| 2014/0278065 | A1 | 9/2014 | Ren |
| 2014/0368373 | A1 | 12/2014 | Crain et al. |
| 2015/0005903 | A1 | 1/2015 | Worek et al. |
| 2015/0116132 | A1 | 4/2015 | Nohra et al. |
| 2015/0121222 | A1 | 4/2015 | Lacaze et al. |
| 2015/0137967 | A1 | 5/2015 | Wedig et al. |
| 2015/0156423 | A1 | 6/2015 | Lundberg |
| 2015/0168154 | A1 | 6/2015 | Boerger |
| 2015/0177718 | A1 | 6/2015 | Vartiainen et al. |
| 2015/0206348 | A1 | 7/2015 | Koreeda et al. |
| 2015/0227123 | A1 | 8/2015 | Laycock et al. |
| 2015/0262421 | A1 * | 9/2015 | Bell ...................... G06T 17/20 345/423 |
| 2015/0294506 | A1 | 10/2015 | Bare et al. |
| 2015/0327010 | A1 | 11/2015 | Gottschalk et al. |
| 2015/0347854 | A1 | 12/2015 | Bare et al. |
| 2015/0356786 | A1 | 12/2015 | Bare et al. |
| 2016/0019721 | A1 | 1/2016 | Bare et al. |
| 2016/0026253 | A1 | 1/2016 | Bradski et al. |
| 2016/0026729 | A1 | 1/2016 | Gil et al. |
| 2016/0066068 | A1 | 3/2016 | Schultz et al. |
| 2016/0091217 | A1 | 3/2016 | Verberkt et al. |
| 2016/0095188 | A1 | 3/2016 | Verberkt et al. |
| 2016/0132046 | A1 | 5/2016 | Beoughter et al. |
| 2016/0135006 | A1 | 5/2016 | Fjeldsoe-Nielsen |
| 2016/0216879 | A1 | 7/2016 | Park et al. |
| 2016/0258760 | A1 | 9/2016 | Beaumont et al. |
| 2016/0284075 | A1 | 9/2016 | Phan et al. |
| 2016/0285416 | A1 | 9/2016 | Tiwari et al. |
| 2016/0323149 | A1 | 11/2016 | Hu et al. |
| 2016/0335731 | A1 | 11/2016 | Hall |
| 2016/0343093 | A1 | 11/2016 | Riland et al. |
| 2016/0343243 | A1 | 11/2016 | Rabb et al. |
| 2016/0345137 | A1 | 11/2016 | Ruiz |
| 2016/0360429 | A1 | 12/2016 | Li et al. |
| 2017/0023659 | A1 | 1/2017 | Bruemmer et al. |
| 2017/0055126 | A1 | 2/2017 | O'Keeffe |
| 2017/0079001 | A1 | 3/2017 | Lewis |
| 2017/0115022 | A1 | 4/2017 | Grosshart et al. |
| 2017/0131426 | A1 | 5/2017 | Sgarz et al. |
| 2017/0169683 | A1 | 6/2017 | Ryder |
| 2017/0200312 | A1 | 7/2017 | Smith et al. |
| 2017/0234962 | A1 | 8/2017 | Yang et al. |
| 2017/0237892 | A1 | 8/2017 | Sakai |
| 2017/0286568 | A1 | 10/2017 | Dean et al. |
| 2017/0363504 | A1 | 12/2017 | Winant et al. |
| 2018/0035263 | A1 | 2/2018 | Titus et al. |
| 2018/0075168 | A1 | 3/2018 | Tiwari et al. |
| 2018/0084623 | A1 | 3/2018 | Joppi et al. |
| 2018/0101803 | A1 | 4/2018 | Tiwari et al. |
| 2018/0102858 | A1 | 4/2018 | Tiwari et al. |
| 2018/0130260 | A1 | 5/2018 | Schmirler et al. |
| 2018/0131907 | A1 | 5/2018 | Schmirler et al. |
| 2018/0159904 | A1 | 6/2018 | Hu et al. |
| 2018/0206096 | A1 | 7/2018 | Sharma et al. |
| 2018/0242907 | A1 | 8/2018 | Bonomi |

(56) References Cited

U.S. PATENT DOCUMENTS

| | | |
|---|---|---|
| 2018/0285482 A1 | 10/2018 | Santos et al. |
| 2018/0328753 A1 | 11/2018 | Stenning et al. |
| 2018/0357823 A1 | 12/2018 | Koniki et al. |
| 2018/0374269 A1 | 12/2018 | Smith |
| 2019/0025905 A1 | 1/2019 | Godina et al. |
| 2019/0057169 A1 | 2/2019 | Santarone et al. |
| 2019/0096232 A1 | 3/2019 | Wedig et al. |
| 2019/0145648 A1 | 5/2019 | Sinha et al. |
| 2019/0216333 A1 | 7/2019 | Lai et al. |
| 2019/0228370 A1 | 7/2019 | Lien |
| 2019/0268062 A1 | 8/2019 | Josefiak |
| 2019/0281573 A1 | 9/2019 | Tyagi et al. |
| 2019/0294834 A1 | 9/2019 | Mountz |
| 2019/0355177 A1 | 11/2019 | Manickam et al. |
| 2020/0072538 A1 | 3/2020 | Woolf et al. |
| 2020/0108926 A1 | 4/2020 | Smith et al. |
| 2020/0151450 A1 | 5/2020 | Hishinuma et al. |
| 2020/0286300 A1 | 9/2020 | Shih |

FOREIGN PATENT DOCUMENTS

| | | |
|---|---|---|
| GB | 2498177 A | 7/2013 |
| WO | 2008124713 A2 | 10/2008 |
| WO | 2011019810 A1 | 2/2011 |
| WO | 2014204753 A1 | 12/2014 |
| WO | 2016130571 A1 | 8/2016 |
| WO | 2016192916 A1 | 12/2016 |
| WO | 2017149526 A2 | 9/2017 |
| WO | 2017223008 A1 | 12/2017 |

OTHER PUBLICATIONS

Brainergiser, "Large holographic projector—a real use case". Sep. 19, 2015, https://www.youtube.com/watch?v=JwnS-EKTW2A&feature=youtu.be.

Carmelo Scuro et al., IoT for Structural Health Monitoring, Dec. 2018, IEEE Instrumentation & Measurement Magazine, pp. 4-14.

Edwards, Luke, "Holograms are finally here: Plasma lasers used to create images in mid-air." Pocket-Lint.com, Nov. 5, 2014, https://www.pocket-lint.com/gadgets/news/131622-holograms-are-finally-here-plasma-lasers-used-to-create-images-in-mid-air.

Gifford, Matthew, "Indoor Positioning with Ultrasonic/Ultrasound", 2018, Oct. 19, 7 pages, https://www.leverege.com/blogpost/ultrasonic-indoor-positioning.

Hexamite, "HX19V2 RFID Ultrasonic Positioning System", 1999, https://www.hexamite.com/hx19.htm.

Hu. Wi-Fi Based Indoor Positioning System Using Smartphones. Nov. 2013. [retrieved on Apr. 23, 2018]. Retrieved from the Internet: (91 pages total).

International Search Report and Written Opinion dated May 14, 2018 issued in connection with corresponding International Application No. PCT/US2018/019154 (10 pages total).

International Search Report and Written Opinion dated May 7,2018 issued in connection with corresponding International Application No. PCT/US2018/019185 (7 pages total).

Khemapech et al., Bridge Structural Monitoring and Warning System Aplication in Thailand—Experiences Learned, 2017, TRON Forum ISBN 978-4-89362-330-0, pp. 1-8.

Kyle, "Property Management" Dearborn Real Estate, 2000—Business & Economics, pp. 40-41.

Wi, J.; Liu, G.-P. A Robust High-Accuracy Ultrasound Indoor Positioning System Based on a Wireless Sensor Network. Sensors 2017, 17, 2554.

Wang et al. Performance Evaluation of Automatically Generated Bim from Laser Scanner Data for Sustainability Analyses. 2015. [retrieved on Apr. 23, 2018]. Retrieved from the Internet:. (8 pages total).

Yang et ai, "Wi Fi-Based Indoor Positioning", 2015, pp. 150-157 downloaded from the Internet I EEE.com databases. (Year: 2015).

Zhihua Wang et al., A Review of Wearable Technologies for Elderly Care that Can Accurately Track Indoor Position, Recognize Physical Activities and Monitor Vital Signs in Real Time, Feb. 10, 2017, Sensors (Basel), 17(2), 341, p. 1-36; doi: 10.3390/s 17020341 (Year: 2017).

Zou et al., "SmartScanner: Know More in Walls with Your Smartphone!" IEEE Transactions on Mobile Computing, vol. 15, No. 11, Nov. 2016, pp. 2865-2877 (Year: 2016).

* cited by examiner

```
┌──────────────────────────────────────────────────────────────────────┐
│   ESTABLISH UNIQUE IDENTIFIER FOR EACH NODE INCLUDED IN A SELF VERIFYING │
│                              ARRAY                                    │
│                                                                   11  │
└──────────────────────────────────────────────────────────────────────┘
                                   │
┌──────────────────────────────────────────────────────────────────────┐
│   EACH NODE X COMMUNICATES WITH EACH OTHER NODE X+Y THAT IT ESTABLISHES │
│                       WIRELESS COMMUNICATION                          │
│                                                                   12  │
└──────────────────────────────────────────────────────────────────────┘
                                   │
┌──────────────────────────────────────────────────────────────────────┐
│  EACH NODE GENERATES SETS OF VALUES FOR VARIABLES OF EACH COMMUNICATION │
│  IN WHICH THAT NODE PARTICIPATED IN AND FROM WHICH A RELATIVE POSITION OF │
│   EACH INVOLVED IN THE RESPECTIVE COMMUNICATION MAY BE DETERMINED  13 │
└──────────────────────────────────────────────────────────────────────┘
                                   │
┌──────────────────────────────────────────────────────────────────────┐
│      EACH NODE RECORDS ASPECTS OF A COMMUNICATION THAT MAY INFLUENCE  │
│                   ACCURACY OF A RECORDED VARIABLE                     │
│                                                                   14  │
└──────────────────────────────────────────────────────────────────────┘
                                   │
┌──────────────────────────────────────────────────────────────────────┐
│    EACH NODE STORES THE SETS OF VALUES FOR VARIABLES AND ASPECTS THAT MAY │
│                  INFLUENCE ACCURACY OF THE VARIABLES                  │
│                                                                   15  │
└──────────────────────────────────────────────────────────────────────┘
                                   │
┌──────────────────────────────────────────────────────────────────────┐
│   EACH NODE TRANSMITS THE SETS OF VALUES FOR VARIABLES AND ASPECTS THAT │
│     MAY INFLUENCE ACCURACY OF THE VARIABLES TO OTHER NODES WITHIN     │
│                  COMMUNICATION RANGE AND POSITION                 16  │
└──────────────────────────────────────────────────────────────────────┘
                                   │
┌──────────────────────────────────────────────────────────────────────┐
│   EACH NODE RECEIVES THE SETS OF VALUES FOR VARIABLES AND ASPECTS THAT MAY │
│    INFLUENCE ACCURACY OF THE VARIABLES FOR ALL COMMUNICATION BETWEEN  │
│                     NODES PRESENT IN THE ARRAY                    17  │
└──────────────────────────────────────────────────────────────────────┘
                                   │
┌──────────────────────────────────────────────────────────────────────┐
│   USING A CONTROLLER, CALCULATE A POSITION OF A NODE X BASED UPON AN  │
│     AGGREGATE OF SETS OF VALUES FOR VARIABLES AND ASPECTS THAT MAY    │
│                        INFLUENCE VARIABLES                            │
│                                                                   18  │
└──────────────────────────────────────────────────────────────────────┘
                                   │
┌──────────────────────────────────────────────────────────────────────┐
│   GENERATE A LOCATION OF A PERCEIVED OBSTRUCTION BASED UPON THE SETS OF │
│       VALUES FOR VARIABLES AND ASPECTS THAT MAY INFLUENCE VARIABLES 19 │
└──────────────────────────────────────────────────────────────────────┘
                                   │
┌──────────────────────────────────────────────────────────────────────┐
│   GENERATE A VISUAL REPRESENTATION OF A LOCATION OF EACH NODE INCLUDED IN │
│             THE ARRAY AND A PERCEIVED OBSTRUCTION             20      │
└──────────────────────────────────────────────────────────────────────┘
```

FIG. 11

```
┌─────────────────────────────────────────────────────────────────────┐
│   INSTALLING WIRELESS ACCESS POINTS INTO A BUILDING STRUCTURE AS IT IS BUILT │
│                                                                1401 │
└─────────────────────────────────────────────────────────────────────┘
                                   │
┌─────────────────────────────────────────────────────────────────────┐
│      ESTABLISHING A MESH NETWORK BETWEEN THE WIRELESS ACCESS POINT  │
│                                                                1402 │
└─────────────────────────────────────────────────────────────────────┘
                                   │
┌─────────────────────────────────────────────────────────────────────┐
│   DETECTING AN ENTRY OF A WIRELESS TRANSMITTER INTO AN AREA COVERED BY THE │
│                         MESH NETWORK                           1403 │
└─────────────────────────────────────────────────────────────────────┘
                                   │
┌─────────────────────────────────────────────────────────────────────┐
│   OPTIONALLY INCORPORATING A MOBILE DEVICE WITH A WIRELESS ACCESS POINT │
│                         INCORPORATED                                │
│                                                                1404 │
└─────────────────────────────────────────────────────────────────────┘
                                   │
┌─────────────────────────────────────────────────────────────────────┐
│       OPTIONALLY MOVING THE MOBILE DEVICE WITH A WIRELESS ACCESS POINT │
│  INCORPORATED INTO A REGION OF THE SPACE ACCESSIBLE BY THE MESH NETWORK │
│                                                                1405 │
└─────────────────────────────────────────────────────────────────────┘
                                   │
┌─────────────────────────────────────────────────────────────────────┐
│  OPTIONALLY USING THE MOVED MOBILE DEVICE WITH A WIRELESS ACCESS POINT TO │
│    ESTABLISH A WIRELESS LINK WITH A DEVICE THAT IS OTHERWISE OUT OF THE │
│               ACCESSIBLE REGION OF THE MESH NETWORK            1406 │
└─────────────────────────────────────────────────────────────────────┘
```

FIG. 14

| | |
|---|---|
| 1601 | Associate unique Node ID with vehicle |
| 1602 | Fix Node to vehicle or store inside vehicle |
| 1603 | Locate Nodes at strategic points within parking area |
| 1604 | Designate one or more base Nodes |
| 1605 | Communicate with each Node |
| 1606 | Communicate in "generations" of tree of Nodes |
| 1607 | Designate Node to communicate with destination extraneous to Self Verifying Node Array (SVAN) |
| 1608 | Define SVAN by ability to communicate with Nodes via primary communication modality |
| 1609 | Exclude some Nodes based upon inclusion criteria |
| 1610 | Aggregate wireless communication variable values |
| 1611 | Generate a location for each unique ID based upon multiple sets of wireless communication variable values |
| 1612 | Use algorithm to define most accurate location of each unique ID |
| 1613 | Plot location of unique ID on 2D (or 3D) graphical representation |
| 1614 | Calculate position of Agent supported smart device (e.g. may communicate with Base Nodes and/or Array Nodes) |
| 1615 | Guide Agent to Node or rented vehicle |
| 1616 | In some embodiments; determine angle of smart device to ground plane |
| 1617 | Overlay vehicles in field of view with vehicle annotation (user interface is overlay of camera image) |
| 1618 | Overlay other features in FOV with annotation |
| 1619 | Generate user interface with Node information overlay |
| 1620 | If vehicle has left the home parking area then communicate on BLE51 basis on periodic basis |

FIG. 16

| | |
|---|---|
| 1701 | Associate unique Node ID with one or more of onsite Agent, material, equipment, structural aspect, reference point (e.g. pole placed onsite specifically to provide positional reference |
| 1702 | Fix Node to the Agent, material, equipment, structural aspect |
| 1703 | Locate reference point Nodes at strategic points within or proximate to the Construction site |
| 1704 | Designate one or more Base Node(s) |
| 1705 | Cascade Communication with some or all Nodes available via selected modality |
| 1706 | Communicate in "generations" of tree of Nodes |
| 1707 | Designate Node to communicate with destination extraneous to Self Verifying Node Array (SVAN) |
| 1708 | Define SVAN by ability to communicate with Nodes via primary communication modality |
| 1709 | Exclude some Nodes based upon inclusion criteria |
| 1710 | Aggregate wireless communication variable values |
| 1711 | Generate a location for each unique Node ID based upon multiple sets of wireless communication variable values |
| 1712 | Use algorithm to define most accurate location of each unique ID |
| 1713 | Plot location of unique ID on 2D (or 3D) graphical representation |
| 1714 | Calculate position of Agent supported smart device (e.g. may communicate with Base Nodes and/or Array Nodes) |
| 1715 | Guide Agent to Node of equipment, materials, staging area, drop off area, office, etc. |
| 1716 | In some embodiments: determine angle of smart device to ground plane |
| 1717 | Overlay equipment, materials, structural aspects or agents in field of view with annotation (user interface is overlay of camera image) |
| 1718 | Overlay other features in FOV with annotation |
| 1719 | Generate user interface with Node information overlay |
| 1720 | Integrate information descriptive of a Node and Sensors co-located with the Nodes into an Augmented Virtual Model |

FIG. 17

| | |
|---|---|
| 1801 | Associate unique ID with a Node |
| 1802 | Position Node within or proximate to multiple disparate defined occupancy spaces |
| 1803 | Place a Sensor assembly in logical communication with at least one Node within or proximate to each disparate defined space |
| 1804 | Designate one or more Base Node(s) |
| 1805 | Cascade Communication with some or all Nodes available via a selected modality |
| 1806 | Communicate in "generations" of tree of Nodes |
| 1807 | Designate Node to communicate with destination extraneous to Self Verifying Node Array (SVAN) |
| 1808 | Transmit data generated from the Sensor via a Node |
| 1809 | Exclude some Nodes based upon inclusion criteria |
| 1810 | Aggregate wireless communication variable values |
| 1811 | Generate a location for each unique Node ID based upon multiple sets of wireless communication variable values |
| 1812 | Use algorithm to define most accurate location of each unique Node ID |
| 1813 | Plot location of unique ID on 2D (or 3D) graphical representation |
| 1814 | Calculate position of Agent supported smart device relative to a Node (e.g. may communicate with Base Nodes and/or Array Nodes) |
| 1815 | Guide Agent to Node in logical communication with the Sensor assembly |
| 1816 | In some embodiments: determine angle of smart device to ground plane |
| 1817 | Overlay occupancy spaces in field of view with annotation (user interface is overlay of camera image) |
| 1818 | Overlay other features in FOV with annotation |
| 1819 | Generate user interface with Node information overlay |
| 1820 | Integrate Node and Sensor information into GUI |

FIG. 18

| | |
|---|---|
| 1901 | Associating a respective unique identifier for each of at least a first Node; a second Node and a third Node included in an array of Nodes, wherein each of the first Node; second Node and third Node comprises: a processor, a digital storage, a communication module and an antenna |
| 1902 | Designate a base position in relation to the first Node |
| 1903 | Communicate wirelessly between multiple Nodes comprising at least the first Node the second Node, the third Node and a fourth Node, wherein the fourth node comprises an agent supporting a smart device with a wireless communication capability who enters a structure space comprising at least the first Node, the second Node and the third Node, and wherein the fourth Node comprises an antenna array |
| 1904 | Generate values, for the first Node; the second Node and the third Node, for communication variables based upon the wirelessly communicating between the first Node, the second Node and the third Node, wherein the communication variables comprise: one or more of a start time of a respective wireless communication transmission (T1), a receipt time of the respective wireless communication(T2), or a calculated transmission time; and one or more of a phase difference of the respective wireless communication transmission between a respective first antenna and a respective second antenna, or a calculated angle of arrival based upon the phase difference; |
| 1905 | Calculate relative position coordinates for the first Node, the second Node and the third node based on the communication variables of step 1904. |
| 1906 | Generating values, for the fourth Node, for communication variables based upon the wirelessly communicating between the first Node, the second Node and the third Node, wherein the communication variables comprise: one or more of a start time of a respective wireless communication transmission (T1), a receipt time of the respective wireless communication(T2), or a calculated transmission time; and one or more of a phase difference of the respective wireless communication transmission between at least a respective first antenna and a respective second antenna within the antenna array of the smart device; |
| 1907 | Calculate a relative position and a relative orientation of the fourth node of the smart device based on the communication variables of step f), wherein the relative orientation determines a direction of interest of the user in the structure space; |
| 1908 | Communicate information stored within the self-verifying array of nodes to the smart device, wherein a selection of data to transmit as the information utilizes the relative orientation and relative position calculated for the fourth Node |

FIG. 19

METHOD OF WIRELESS GEOLOCATED INFORMATION COMMUNICATION IN SELF-VERIFYING ARRAYS

CROSS REFERENCE TO RELATED APPLICATIONS

The present application claims priority to the Non-Provisional patent application Ser. No. 16/915,155 filed Jun. 29, 2020 and entitled METHOD OF WIRELESS DETERMINATION OF A POSITION OF A NODE as a continuation, which in turn claims priority to the Non-Provisional patent application Ser. No. 16/775,223 filed Jan. 28, 2020 and entitled SPATIAL SELF-VERIFYING ARRAY OF NODES as a continuation, which in turn claims priority to the Non Provisional patent application Ser. No. 16/528,104, filed Jul. 31, 2019 and entitled SMART CONSTRUCTION WITH AUTOMATED DETECTION OF ADVERSE STRUCTURE CONDITIONS AND REMEDIATION as a continuation in part; and to the Non-Provisional U.S. patent application Ser. No. 16/504,919, filed Jul. 8, 2019 and entitled METHOD AND APPARATUS FOR POSITION BASED QUERY WITH AUGMENTED REALITY HEADGEAR as a continuation in part application, which in turn claims priority to Provisional Patent Application Ser. No. 62/793,714, filed Jan. 17, 2018 and entitled METHOD AND APPARATUS FOR ORIENTEERING WITH AUGMENTED REALITY HEADGEAR; and as a continuation in part application to the Non-Provisional U.S. patent application Ser. No. 16/657,660, filed Oct. 18, 2019 and entitled METHOD AND APPARATUS FOR CONSTRUCTION AND OPERATION OF CONNECTED INFRASTRUCTURE; and as a continuation in part application to the Non-Provisional U.S. patent application Ser. No. 16/688,775, filed Nov. 19, 2019 and entitled METHOD AND APPARATUS FOR WIRELESS DETERMINATION OF POSITION AND ORIENTATION OF A SMART DEVICE; and as a continuation in part application to the Non-Provisional U.S. patent application Ser. No. 16/721,906, filed Dec. 19, 2019 and entitled METHOD AND APPARATUS FOR WIRELESS DETERMINATION OF POSITION AND ORIENTATION OF A SMART DEVICE. The contents of each of the heretofore claimed matters are relied upon and incorporated herein by reference.

The present application also references the following related applications whose content are relied upon and incorporated herein by reference; the Non Provisional patent application Ser. No. 16/549,503, filed Aug. 23, 2019 and entitled METHOD AND APPARATUS FOR AUGMENTED VIRTUAL MODELS AND ORIENTEERING; and the Non Provisional patent application Ser. No. 15/703,310, filed Sep. 13, 2017 and entitled BUILDING MODEL WITH VIRTUAL CAPTURE OF AS BUILT FEATURES AND OBJECTIVE PERFORMANCE TRACKING; and the Non Provisional patent application Ser. No. 16/161,823, filed Oct. 16, 2018 and entitled BUILDING MODEL WITH CAPTURE OF AS BUILT FEATURES AND EXPERIENTIAL DATA; and the Non Provisional patent application Ser. No. 15/887,637, filed Feb. 2, 2018 and entitled BUILDING MODEL WITH CAPTURE OF AS BUILT FEATURES AND EXPERIENTIAL DATA; and the Non Provisional patent application Ser. No. 16/165,517, filed Oct. 19, 2018 and entitled BUILDING VITAL CONDITIONS MONITORING,

FIELD OF THE INVENTION

The present invention relates to methods and apparatus for a self-verifying array of Nodes, a spatial position of individual is Nodes is verified using values for communication variables generated by multiple communications involving multiple Nodes. More specifically, the present invention provides apparatus and methods for designating a position of a Node that includes a wireless transceiver relative to a base position or relative to another Node based upon wireless communications amongst multiple wireless transceivers included in an array.

BACKGROUND OF THE INVENTION

Wireless determination of a position has been known for many years. Each technique and corresponding wavelength has its strengths and drawbacks. One significant drawback has been the specialized equipment and training required to utilize wireless position determination equipment. For example, use of systems such as radar and lidar requires specialized equipment and training.

In contrast, most people have access to a smart device. The proliferation of global positioning system (GPS) capabilities by smart devices has alleviated the need for such specialized equipment and training by incorporating the specialized circuitry into the smart device, and proliferating apps that operate the GPS circuitry. Smart devices are used almost ubiquitously by people in first-world population centers. Smart phones and tablets are often within reach of people capable of operating them and are relied upon for almost any purpose for which an app may be written.

Some Smart Devices have been incorporated into devices normally operated by people in their daily lives. Such Smart Devices may be included in a larger "smart" ecosystem, a popular example of which is a smart home. The term "smart home" generally refers to use of appliances, security devices and climate control devices that are controlled by a processor of one sort or another. In general, these are consumer devices, made for the convenience of the user and efficiency of use of a related device.

However, known geolocation technologies (as may be deployed with modern Smart Devices) also have drawbacks. GPS is purposefully limited in its accuracy by the government. Other technologies and corresponding standards (which operate at different wavelength bands), such as Bluetooth and WiFi, are easily obstructed and have very limited range.

Many devices using the Internet of Things include communication elements deploying any one of numerous standards such as Bluetooth, WiFi, Cellular and other examples. It would be useful to improve communications, location tracking, and generalized tracking of devices carrying wireless communications especially in complex environments that are larger than the typical broadcast range of a particular wavelength or have aspects that inhibit wireless communication.

SUMMARY OF THE INVENTION

Accordingly, the present invention provides for a self-verifying array of Nodes (sometimes referred to herein as "SVAN") that verifies positions of respective Nodes included in the array. A position for each Node is generated based upon sets of values of variables derived from wireless communications (sometimes referred to herein as "position determination variables"). The position determination variables may include one or more of: a time of transmission of a data set during wireless communication between Nodes; a time of arrival of a data set during wireless communication between Nodes; a phase change between disparate antennas receiving a wireless communication; an angle of arrival of a data set; an angle of departure of a data set; a quality of a wireless transmission (e.g., based on a presence of noise in the received transmission); a strength of a wireless transmission (e.g., as measured by amplitude of a received transmission); or other factor influencing a wireless data transmission.

According to the present invention, an array self-verifies positions of respective Nodes included in the array by generating multiple sets of values for position determination variables for each of the Nodes in the array. Each set of values is based upon multiple disparate communications involving respective pairs of a transmitting Node and a receiving Node. In this manner, multiple sets of values for position determination variables are generated for each respective Node during a given timeframe. Each set of values for position determination variables may be used to verify a position of a designated Node by comparing a position determined via use of a first set of values for variables to positions determined via use of set(s) of variables other than the first set of variables. Each determined position for a given Node thereby verifies or challenges other determined positions.

In some embodiments, outlier sets of position determination variables may be excluded. In another aspect, in some embodiments, an algorithm may be used to generate a composite position for a given Node based upon multiple sets of position determination variables (for example, by generating a weighted average of expected positions based on the disparate sets of values of position determination variables).

In various embodiments, a determined position of Node may include a position for a first Node relative to a position of a second Node, or relative to a base position. Each position is generally represented as a set of coordinates. The coordinates may include, for example, Cartesian coordinates, cylindrical coordinates and/or Polar coordinates. The Nodes may include transceivers transmitting and receiving one designated bandwidth of communication wavelength; or transceivers operating according to disparate wireless protocols and across multiple bandwidths. In some embodiments, a wireless communications Node may receive a data set via a first wavelength (and first associated protocol) and transmit some or all of the data set via a second wavelength (and second associated protocol) or combine transceivers capable of communicating via multiple wavelengths and protocols.

The self-verifying arrays of Nodes of the present invention include collections of numerous wireless communication Nodes operative to cooperatively enhance communications, location tracking, and determination of other useful aspects of an array of Nodes, such as proximity of Nodes to each other and/or an item of interest, distance of Nodes to each other and/or an item of interest, direction of Nodes to each other and/or an item of interest, and whether or not two Nodes are capable of direct communication between themselves. Self-verifying arrays may be deployed to significantly optimize and improve accuracy of determining a location of a Sensor, tracking of items, tracking of Agents and/or persons in real-world scenarios, such as a construction environment, a parking area, a health care Structure, a hotel, a convention center, a recreation area, an amusement park, and a partially built or completed Structure, as non-limiting examples.

In some exemplary embodiments, a designated location may include stationary wireless Nodes that are fixed to stationary item in or proximate to a Structure such as a building part or a stanchion secured to a ground point. The site may also include mobile wireless Nodes which may be fixed to items, persons and/or Agents capable of attaining dynamic locations. Various assets and building materials may be fitted with wireless Nodes that are combined into a self-verifying array.

In some examples, wireless communications between wireless Nodes may be accomplished in adherence to a Bluetooth protocol, such as, by ways of non-limiting example, Bluetooth 5.1 or Bluetooth Low Energy (BLE 5.1). In other examples, RFID type tags may communicate information in response to a stimulus. In some examples, energy to power a Node may be provided by a wireless transmission to the Node to be powered.

In general, Nodes making up a self-verifying array communicate to other wireless Nodes. The wireless communications may include one or both of sensor data and location-identification data. Location-identification data may include one or more of: values for variables that are useful for determining a position, information useful for determine a polar coordinate (e.g., angle of arrival; angle of departure; and distance); or information useful for determining a Cartesian Coordinate (e.g., X,Y,Z coordinates). The location-identification data may be one or both of: relative to two Nodes or relative to a base position. By way of non-limiting example, of location-identification data may include one or more of: transmitting and receiving timing data; angle of arrival; angle of departure; a calculated distance; and a set of coordinates.

Location-identification data involving a particular Node may be generated by that Node. For example, a Node X may generate location-identification data relative to multiple other Nodes with which Node X is capable of communicating. Node X may also receive, via wireless communication, location data generated by other Nodes. Node X may aggregate both types of location-identification data and transmit the aggregated data out to any wireless transceiver within range that is capable of receiving the aggregated data.

A controller, such as a controller in a Smart Device or in a cloud server, may generate a map indicating locations of various Nodes at an instance in time. Each location of each Node may be based upon one or more sets of location-identification information since each Node may communicate with multiple other Nodes. Accuracy of a location of a particular Node may be enhanced by mathematically blending multiple sets of location-identification information for that particular Node, such as an average of reported data (including, in some embodiments, a weighted average). In some embodiments, a strength of a wireless communication may be determined and recorded and considered in the blending of multiple sets of location-identification data.

In some embodiments, a sensor may be co-located with a particular Node, In this manner, data generated by the Sensor during a particular time period may be associated with the position of a co-located Node. In some embodiments, data generated by a Sensor (Sensor Data) may be transmitted between Nodes on a periodic basis. Transmission of Sensor Data between Nodes may be in addition to location-identification information, or independent of other transmissions, including transmissions of location-identification information. Other embodiments include transmission of Sensor data in response to a command requesting the Sensor data.

Accordingly, some embodiments include transmission and receipt of Sensor Data for the purposes of aggregating and retransmitting the received data. The sensor data may quantify a condition at a location or proximate to a location of a Node in logical communication with the Sensor. In another aspect, disparate Nodes may transmit data to other Nodes, wherein the data has been provided by Sensors co-located with or proximate to respective Nodes. Each Node may aggregate data received via communications with other Nodes and/or received from Sensors (or assemblies of multiple Sensors) co-located with or proximate to respective Nodes.

Sensor data may thereby be aggregated from disparate Nodes at disparate locations across a large area occupied by Nodes that interconnect into a self-verifying array. This may be beneficial in embodiments in which the breadth of a physical area covered by a self-verifying array of Nodes exceeds the point-to-point communication range of one or more of the Nodes (e.g., based on the communication modality of the Node).

In addition, a self-verifying array may combine communications using disparate bandwidths and protocols to achieve superior performance in a variety of ways, such as improving communications distance, accuracy, and obstacle-penetration efficacy. A self-verifying array may also include hardwired segments to further achieve improved performance and connectivity to resources external to the self-verifying array.

By using the self-verifying array of Nodes to effectively expand the range of an individual Node, communication and data retrieval across a large space is improved. Specifically, establishment of a self-verifying array that allows for communication pathways to be established that are longer than a range of an individual wireless access Node and verifies a location of a communication commencement and destination, enables superior communications across large areas, such as a construction site, a large building, a parking area/garage, an amusement park, a public area, or other defined area.

For example, a large construction site may include stationary Nodes that form a self-verifying array of Nodes over a large spatial area included in the construction site (or even the entire construction site). During construction, a line-of-sight path between a particular wireless communication base Node and a deployed Node initially interacting with that wireless communication base Node may be cut off by various impediments to wireless transmission, such as equipment used to build the Structure, materials being stored to build the Structure, or the Structure itself. The self-verifying array may create paths that cooperatively allow the deployed Node to connect with multiple different wireless communication Nodes included in a self-verifying array to send a communication around the impediment to wireless communication and reach the base Node.

A mobile wireless Node included in the self-verifying array may provide dynamic location aspects to the self-verifying array. Devices and methodology allow for mobile Nodes to supplement stationary Nodes and improve communications aspects in numerous ways. The mobile Node may temporarily create a shorter path for communications, which may improve energy storage aspects of a device interacting with the Node, an improved signal-to-noise aspect, or other advantages.

A communication area covered by an aggregate of wireless Nodes may extend to a perimeter defined by communication coverage of an aggregate of the Nodes and may encompass communication obstructions within the communications area, wherein the obstructions are circumvented by strategically located Nodes that communicate around the obstruction.

In still further aspects, a self-verifying array of Nodes may allow an Augmented Virtual Model (AVM) of a Structure and/or a building site to be updated with the locations of an Agent or equipment that is co-located with a wireless Node. Similarly, building materials that are co-located with wireless Nodes may have their location determined and/or conditions experienced by the materials quantified via Sensor readings. This may occur as the materials reside in a storage location and/or as the materials are assembled into a Structure.

Locations of personnel tagged with a wireless Node may also be identified for logistics, safety, and other purposes. For example, in some embodiments, a Smart Device may serve as a dynamic Node. The Smart Device may be supported by an Agent. In such embodiments, location information and other Sensor data from the Smart Device may be transmitted across the self-verifying array. Accordingly, it may be possible to track the Agent's position, biometrics, and other safety quantities across the self-verifying array.

A mobile Agent equipped with Node with wireless communications capability may also transmit energy beacons into the regions that the Agent moves into. The energy beacons may energize ultralow-energy Bluetooth-equipped devices, RFID tags, and the like. Thus, Nodes that have little or no substantial battery capability may be energized, and may respond to the energization by transmitting and/or receiving data transmissions to/from one or both of the mobile Agent and other Nodes. Transmitted data may include an identification of respective Nodes, Sensor-related information, and the like. Other protocols such as stepped power levels in transmission may supplement a location with a relative distance between the tag and the mobile agent being determined. Since the mobile Agent can perform this measurement from numerous points, triangulation may be used to improve the accuracy of relative location determination of such tags.

DESCRIPTION OF THE DRAWINGS

The accompanying drawings, that are incorporated in and constitute a part of this specification, illustrate several embodiments of the invention and, together with the description, serve to explain the principles of the invention:

FIG. 11 illustrates a flow chart of method steps that may be executed in some implementations of the present invention.

FIG. 14 depicts methodology related to the present invention.

FIG. 16 illustrates methodology related to SVAN arrays deployed with nodes on, in or associated with vehicles.

FIG. 17 illustrates methodology related to SVAN arrays associated with Agents, materials, equipment, and structural aspects.

FIG. 18 illustrates method steps of some implementations of the present invention relating to occupancy of space.

FIG. 19 illustrates method steps of some implementations of the present invention relating to geolocated communication of information.

DETAILED DESCRIPTION

Figure 1A:
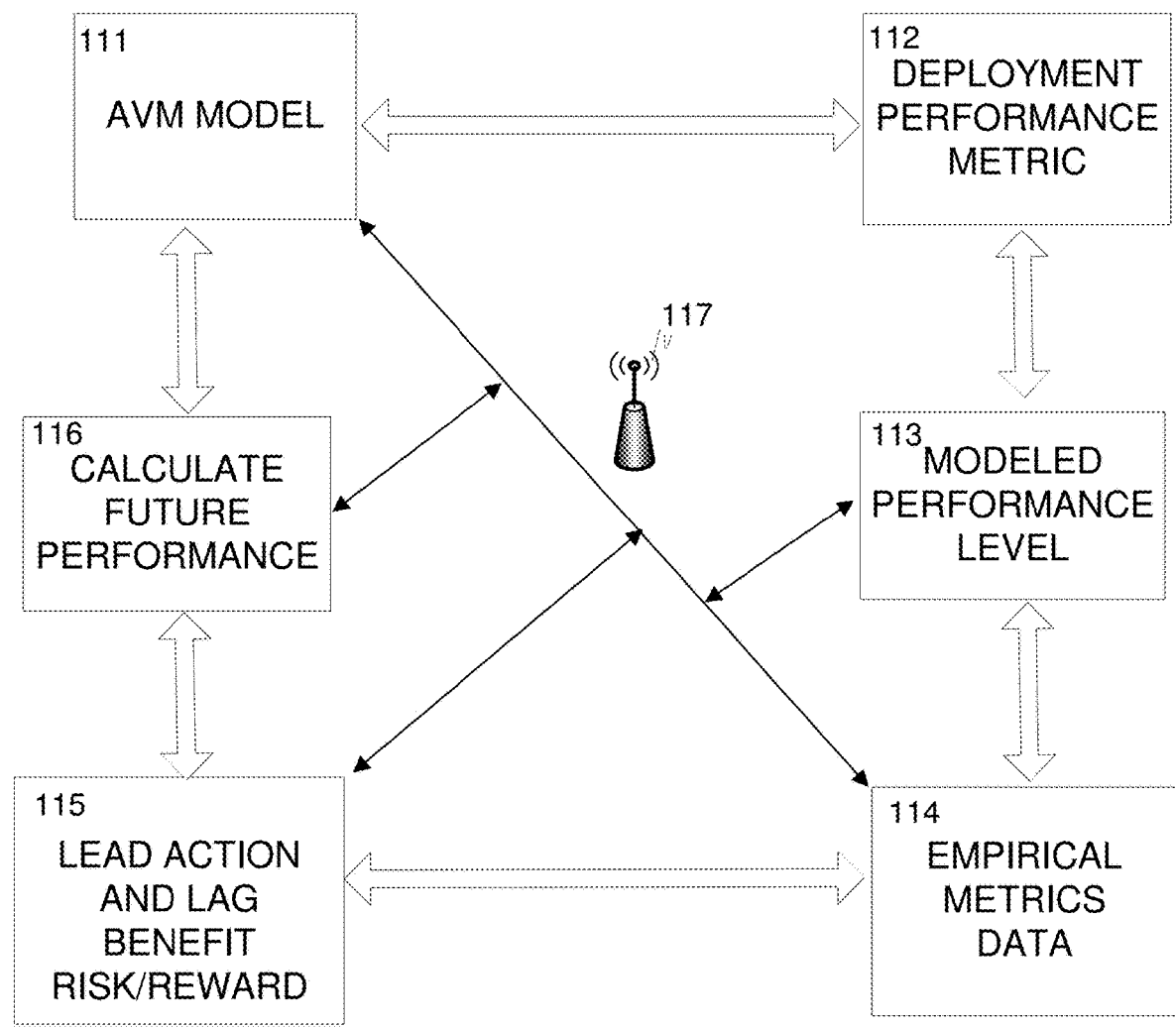
FIG. 1A illustrates a block diagram of inter-relating functions included in automated systems according to the present invention.

The present invention provides for a spatially self-verifying array of Nodes. Specifically, Nodes may include devices capable of wireless communication transmission in logical communication with a processor and a digital storage. A position for each Node may be generated based upon values for position determination variables. By comparing the values for position determination variables between a single Node and multiple disparate Nodes, a position of respective Nodes in the array may be determined and verified.

In some embodiments, Nodes are co-located with Sensors to quantify conditions within or proximate to Structures. Such Structures use Sensor groups periodically and/or continuously quantify and transmit a current condition of the Structure. Sensor readings may be associated with a time index.

Various embodiments include methods and apparatus for construction, Deployment and maintenance of a Structure with Intelligent Automation (device, system, machine or equipment item) engaged in logical processes and Structural Messaging to communicate conditions within or proximate to the Structure. Structural Messaging includes logical communications generated by the Intelligent Automation (such as a Sensor or machine) incorporated into, affixed to, or operated within or proximate to a Structure.

In some aspects, a Sensor cluster (or a Sensor gateway, which may be a Sensor cluster connected to a communications array) may be embedded into a wall or other surface, such as an architectural aspect (e.g., a baseboard). The Sensors may be capable of quantifying a condition by generating a digital value based upon an environment in which the Sensor is placed. For example, the Sensors may detect vibration patterns, chemicals, temperatures, water, light waves or other indicia of a condition present. A remedial action device may, based upon a reading from the Sensors, be actuated in response to a quantified condition.

In general, various embodiments of the present invention enable a Structure, such as a building or infrastructure, to be active as opposed to the former passive state. The active state enables the Structure to generate data descriptive of one or more of: a condition within a Structure; a condition proximate to the Structure; and an event experienced by the Structure; and in some embodiments an active state Structure is enabled to execute an action via automation based upon a Structural Message. The action based upon a Structural Message may be executed independent of a user intervention, or based upon approval of a user, such as via an app on a Smart Device.

The present invention references prior applications and issued patents owned by the applicant relating to automated apparatus and methods for generating improved Augmented Virtual Models (sometimes referred to herein as an "AVM") of a Structure.

The AVM of the Property may include a conceptual model and progress through one or more of: a) a design stage; b) a build stage; c) a Deployment stage; d) a service stage; e) a modification stage; and f) a dispensing stage. As discussed more fully herein, an AVM according to the present invention include original design data matched to As Built data captured via highly accurate geolocation, direction and elevation determination. As Built data is matched with a time and date of data acquisition and presented in two-dimensional (2D) and three-dimensional (3D) visual representations of the Property. The augmented models additionally include data relating to features specified in a Property design and data collected during building, Deployment, maintenance and modifications to the Property. In some embodiments, a fourth dimension of time may also be included.

An AVM includes a three- or four-dimensional model in a virtual environment that exists parallel to physical embodiments modeled in the Augmented Virtual Model. Details of one or more physical Structures and other features within a real estate parcel are generated and quantified and represented in the Augmented Virtual Model. The AVM exists in parallel to a physical Structure in that the AVM includes virtual representations of physical Structures and additionally receives and aggregates data relevant to the Structures over time. The aggregation of data may be one or more of: a) according to an episode (i.e., onsite inspection, repair, improvement etc.); b) periodic; and c) in real time (without built in delay).

The experience of the physical Structure is duplicated in the virtual Augmented Virtual Model. The AVM may commence via an electronic model generated via traditional CAD software or other design type software. In addition, the AVM may be based upon values for variables, including one or more of: usage of a Structure; usage of components within the Structure; environmental factors encountered during a build stage or Deployment stage; and metrics related to Performance of the Structure. The metrics may be determined, for example, via measurements performed by Sensors located in and proximate to Structures located on the Property.

In some embodiments, a technical library specific to a particular Property and location within the Property may be maintained for each Property and made accessible to an onsite technician and/or remote expert. The library may include, but is not limited to details descriptive of: a Structure design, utilities, architectural and structural history, equipment/machinery manuals; repair bulletins, and repair/maintenance. Appropriate how-to videos may also be made available based upon an AVM with As Built and Experiential Data.

In another aspect, a parts ordering function may be included in the Augmented Virtual Model. Augmented parts ordering may allow a technician to view an ordered part and view a virtual demonstration of the part in use and procedures for replacing the part.

Aspects of the AVM may be presented via a user interface that may display on a tablet or other flat screen, or in some embodiments be presented in a virtual reality environment, such as via a virtual reality headset.

Some exemplary embodiments may include updates to an AVM that include changes to: items or persons within the Structure, architectural or structural aspects; time and date notation of a change in location specific data; a location of an item or person updated according to coordinates such as X,Y,Z and distance data and/or an angle and distance data (or other information pertinent to a chosen coordinate system); X, Y data may include high level location designation within the street address via triangulation (e.g., a street address) and highly specific position designation (e.g., particular room and wall); combination of two types of position data; GPS, Differential GPS; references used during triangulation; aggregate data across multiple Structures for reference; designs that perform well; designs that fail; popularity of various aspects; access to and/or generation of, multiple Augmented Virtual Models.

In some preferred embodiments, the geographic location will be provided with accurately placed location reference points. The location reference points may be accessed during activities on a Property within or close to a Structure. (While accuracy may degrade outside the Property, the location reference points maintain accuracy within the Property.)

Preferred embodiments may also include reference points accurately placed within a Structure located on the Property. As further discussed below, the reference points may include, by way of non-limiting example, a wireless transmission data transmitter operative to transmit an identifier and location data; a visual identifier, such as a hash code, bar code, color code or the like; an infrared transmitter; a reflective surface, such as a mirror; or other means capable of providing a reference point to be utilized in a triangulation process that calculates a precise location within the Structure or other Structure.

Highly accurate location position may be determined via automated apparatus and multiple levels of increasingly accurate location determination. A first level may include use of a GPS device providing a reading to first identify a Property. A second level may use position transmitters located within, or proximate to, the Property to execute triangulation processes in view of on-site location references. A GPS location may additionally be associated with a high level general description of a Property, such as, one or more of: an address, a unit number, a lot number, a tax map number, a county designation, Platte number or other designator. On-site location references may include one or more of: near field radio communication beacons at known X-Y position reference points; line of sight with physical reference markers; coded via ID such as bar code, hash tag, and alphanumeric or other identifier. In some embodiments, triangulation may calculate a position within a boundary created by the reference points to within millimeter range. In some embodiments, Differential GPS may be used to accurately determine a location of a Smart Device with a sub centimeter accuracy.

In addition to a position determination, such as latitude and longitude, or other Cartesian Coordinate (which may sometimes be indicated as an "X" or "Y" coordinate), Polar Coordinate, or GPS coordinate, the present invention provides for a direction (sometimes referred to herein as a "Z" direction and elevation or "r") of a feature for which As Built data is captured and imported into the AVM.

According to the present invention, a direction dimension may be based upon a movement of a device. For example, a device with a controller and an accelerometer, such as mobile Smart Device, may include a user display that allows a direction to be indicated by movement of the device from a determined location acting as a base position towards an As Built feature in an extended position. In some implementations, the Smart Device may first determine a first position based upon triangulation with the reference points and a second position (extended position) also based upon triangulation with the reference points. The process of determination of a position based upon triangulation with the reference points may be accomplished, for example via executable software interacting with the controller in the Smart Device, such as, for example via running an app on the Smart Device.

In combination with, or in place of directional movement of a device utilized to quantify a direction of interest to a user, some embodiments may include an electronic and/or magnetic Directional Indicator that may be aligned by a user in a direction of interest. Alignment may include, for example, pointing a specified side of a device, or pointing an arrow or other symbol displayed upon a user interface on the device towards a direction of interest.

In a similar fashion, triangulation may be utilized to determine a relative elevation of the Smart Device as compared to a reference elevation of the reference points.

It should be noted that although a Smart Device is generally operated by a human user, some embodiments of the present invention include a controller, accelerometer, data storage medium, Image Capture Device, such as a Charge-Coupled Device ("CCD") capture device or an infrared capture device being available in a handheld or unmanned vehicle or other Agent.

An unmanned vehicle may include for example, an unmanned aerial vehicle ("UAV") or ground level unit, such as a unit with wheels or tracks for mobility and a radio control unit for communication.

In some embodiments, multiple unmanned vehicles may capture data in a synchronized fashion to add depth to the image capture and/or a three-dimensional and four-dimensional (over time) aspect to the captured data. In some implementations, UAV position will be contained within a perimeter and the perimeter will have multiple reference points to help each UAV (or other unmanned vehicle) determine a position in relation to static features of a building within which it is operating and also in relation to other unmanned vehicles. Still other aspects include unmanned vehicles that may not only capture data but also function to perform a task, such as paint a wall, drill a hole, cut along a defined path, or other function. As stated throughout this disclosure, the captured data may be incorporated into the virtual model of a Structure.

In another aspect, captured data may be compared to a library of stored data using image recognition software to ascertain and/or affirm a specific location, elevation and direction of an image capture location and proper alignment with the virtual model. Still other aspects may include the use of a compass incorporated into a Smart Device.

In still other implementations, a line of sight from a Smart Device, whether user operated or deployed in an unmanned vehicle, may be used to align the Smart Device with physical reference markers and thereby determine an X,Y position as well as a Z position. Electronic altitude measurement may also be used in place of, or to supplement, a known altitude of a nearby reference point. This may be particularly useful in the case of availability of only a single reference point.

Reference points may be coded via identifiers, such as a UUID (Universally Unique Identifier), or other identification vehicle. Visual identifiers may include a bar code, hash tag, Alphanumeric or other symbol. Three-dimensional markers may also be utilized.

By way of non-limiting example, on site data capture may include designation of an X,Y,Z reference position and one or more of: image capture; infrared capture; temperature; humidity; airflow; pressure/tension; electromagnetic reading; radiation reading; sound readings (e.g., level of noise, sound pattern to ascertain equipment running and/or state of disrepair), and other vibration or Sensor readings (such as an accelerometer or transducer).

In some embodiments, vibration data may be used to profile use of the Structure and/or equipment and machinery associated with the Structure. For example, vibration detection may be used to determine a presence of a person or vehicle, a type of activity taking place; machine operation, including automated determination between proper operation of a piece of equipment and/or machinery and faulty operation of the equipment and/or machinery.

Glossary

"Agent" as used herein refers to a person or automation capable of supporting a Smart Device at a geospatial location relative to a Ground Plane.

"Ambient Data" as used herein refers to data and data streams captured in an environment proximate to a Vantage Point and/or an equipment item that are not audio data or video data. Examples of Ambient Data include, but are not limited to, Sensor perception of: temperature, humidity, particulate, chemical presence, gas presence, light, electromagnetic radiation, electrical power, Moisture and mineral presence.

"Analog Sensor" and "Digital Sensor" as used herein include a Sensor operative to quantify a state in the physical world in an analog or digital representation, respectively.

"As Built" as used herein refers to details of a physical Structure associated with a specific location within the physical Structure or parcel and empirical data captured in relation to the specific location.

"As Built Features" as used herein refers to a feature in a virtual model or AVM that is based at least in part upon empirical data captured at or proximate to a correlating physical location of the feature. Examples of As Built Features include placement of structural components such as a wall, doorway, window, plumbing, electrical utility, machinery and/or improvements to a parcel, such as a well, septic, electric or water utility line, easement, berm, pond, wet land, retaining wall, driveway, right of way and the like.

"As Built Imagery" (Image Data) as used herein means image data generated based upon a physical aspect.

"Augmented Virtual Model" (sometimes referred to herein as "AVM") as used herein means a digital representation of a real Property parcel including one or more three-dimensional representations of physical Structures suitable for use and As Built data captured that is descriptive of the real Property parcel. An AVM includes As Built Features of the Structure and may include improvements and features contained within a Structure.

"Bluetooth" as used herein means the Wireless Personal Area Network (WPAN) standards managed and maintained by Bluetooth Special Interest Group (SIG). Unless otherwise specifically limited to a subset of all Bluetooth standards, the Bluetooth will encompass all Bluetooth standards (including, without limitation, Bluetooth 4.0; 5.0; 5.1 and BLE versions).

"Deployment" as used herein means the placement into operation of one or more of: a Structure machinery and an equipment item.

"Deployment Performance" as used herein means one or both of: objective and subjective quantification of how one or more of: Structure, machinery and an equipment item operated, which may be depicted in an AVM.

"Design Feature" as used herein, means a value for a variable descriptive of a specific portion of a Property. A Design Feature may include, for example, a size and shape of a structural element or other aspect, such as a doorway, window, or beam; a material to be used; an electrical service; a plumbing aspect; a data service; placement of electrical and data outlets; a distance, a length, a number of steps; an incline; or other discernable value for a variable associated with a Structure or Property feature.

"Digital Sensor" as used herein includes a Sensor operative to quantify a state in the physical world in a digital representation.

"Directional Indicator" as used herein means a quantification of a direction generated via one or both of: analog and digital indications.

"Experiential Data" as used herein means data captured on or proximate to a subject Structure, such data descriptive of a condition realized by the Structure. Experiential Data is generated by one or more of: Digital and/or Analog Sensors, transducers, Image Capture Devices, microphones, accelerometers, compasses and the like.

"Experiential Sensor Reading" as used herein means a value of a Sensor output generated within or proximate to a subject Structure, such output descriptive of a condition realized by the Structure. An Experiential Sensor Reading may be generated by one or more of: digital and/or Analog Sensors, transducers, Image Capture Devices, microphones, accelerometers, compasses and the like.

"Ground Plane" as used herein refers to a locally horizontal (or nearly horizontal) plane from which a direction of interest may be projected. An example of a Ground Plane is a floor of a Structure.

"Image Capture Device" or "Scanner" as used herein refers to apparatus for capturing digital or analog image data. An Image Capture Device may be one or both of: a two-dimensional camera or a three-dimensional camera. In some examples an Image Capture Device includes a charge-coupled device ("CCD") camera.

"Intelligent Automation" as used herein refers to a logical processing by a device, system, machine or equipment item (such as data gathering, analysis, artificial intelligence, and functional operation) and communication capabilities.

"Moisture" as used herein means a quantity of water, which may also mean a quantity of water relative to a larger volume (e.g., amount of water relative to air).

"Multi-modal" as used herein refers to the ability of a device to communicate using multiple protocols and/or bandwidths. Examples of multimodal may include being capable of communication using two to more of: Bluetooth; Bluetooth Low Energy; WiFi; WiFi RT; GPS; ultrasonic; infrared protocols and/or mediums.

"Node" as used herein means a device including at least a processor, a digital storage and a wireless transceiver.

"Performance" as used herein may include a metric of an action or quantity. Examples of Performance may include metrics of: number of processes completed, energy efficiency; length of service; cost of operation; quantity of goods processed or manufacture; quality of goods processed or manufacture; yield; and human resources required.

"Performance Level" as used herein means one or both of a quantity of actions executed and a quality of actions.

"Property" as used herein shall mean one or more real estate parcels suitable for a deployed Structure that may be modeled in an AVM.

"Ray" as used herein refers to a straight line including a starting point and extending indefinitely in a direction.

"Sensor" as used herein refers to one or more of a solid state, electro-mechanical, and mechanical device capable of transducing a physical condition or Property into an analogue or digital representation and/or metric.

"Smart Device" as used herein includes an electronic device including, or in logical communication with, a processor and digital storage and capable of executing logical commands.

"Structure" as used herein refers to a manmade assembly of parts connected in an ordered way. Examples of a Structure in this disclosure include a building; a sub-assembly of a building; a bridge, a roadway, a train track, a train trestle, an aqueduct; a tunnel a dam, and a retainer berm.

"Structural Message" as used herein refers to a logical communication generated by automation (such as a Sensor or machine) incorporated into, affixed to or operated within or proximate to a Structure.

"Structural Messaging" as used herein refers to an action that generates and/or transmits a Structural Message.

"Total Resources" as used herein shall mean an aggregate of one or more types of resources expended over a time period.

"Transceive" as used herein refers to an act of transmitting and receiving data.

"Transceiver" as used herein refers to an electronic device capable of one or both of transmitting and receiving data.

"Vantage Point" as used herein refers to a specified location which may be an actual location within a physical Structure or a virtual representation of the actual location within a physical Structure.

"Vector" as used herein refers to a magnitude and a direction as may be represented and/or modeled by a directed line segment with a length that represents the magnitude and an orientation in space that represents the direction.

"Virtual Structure" ("VS"): as used herein shall mean a digital representation of a physical Structure suitable for use. The VS may include Design Features and As Built Features. The VS may be included as part of an AVM.

According to the present invention, multiple Nodes are deployed in or proximate to a Structure to provide data quantifying positions of the Nodes relative to each other and/or aspects of a Structure. In addition, Sensors may be deployed with known positions relative to one or more Nodes, the Sensors are operative to quantify conditions in an environment available to the sensor. The data quantifying respective conditions registered by the Sensors may referenced to generate a status and/or condition of one or more of: a deployed Structure, a Structure in the process of being built; and/or a Structure in the process of being retrofitted with a position of quantified conditions determined based upon use of a self-verifying array of Nodes.

In some embodiments, a location of one or more Sensors may be generated according to the methods herein. The location may be in relation to one or more of: a home position; a position of an Agent; and a position of one or more Reference Position Transceivers. An Agent may be guided to a Sensor and/or an area of interest based upon a Sensor reading using orienteering methods and apparatus presented herein. For example, a controller may receive Sensor data quantifying temperature and humidity that exceed an optimal range of temperature and humidity (e.g., the data quantifying temperature and humidity may indicate an environment conducive to termites in the Structure, or simply inefficient insulation from an outside environment). Using Orienteering, an Agent may be guided to one or both of the Sensors that generated the data and an area of interest indicated by the measured data. A user interface may include human ascertainable indications of the conditions quantified and/or the location of the conditions quantified.

Additional examples may include guiding an Agent to a Sensor to replace a power source, such as a battery or battery pack. Other exemplary power sources include an antenna or array of antennas tuned to receive ambient energy and recharge an energy storage device (such as a battery).

Referring now to FIG. 1A a block diagram illustrates various aspects of the present invention and interactions between the respective aspects. The present invention includes an AVM 111 of a Structure that includes As Built Features as well as the generation and inclusion of As Built Features, based upon location and direction-specific data capture, is discussed more fully below. Data may be transmitted and received via one or both of digital and analog communications, such as via a wireless communication medium 117.

According to the present invention, one or more Deployment Performance Metrics 112 are entered into automated apparatus in logical communication with the AVM 111. The Deployment Performance Metric 112 may essentially include a purpose to be achieved during Deployment of a modeled Structure. By way of non-limiting example, a Deployment Performance Level may include one or more of: a production or quantity; quality; yield; scalability; a level of energy efficiency; a level of water consumption; mean time between failure for equipment included in the Structure; mean time between failure for machinery installed in the Structure; a threshold period of time between repairs on the Structure; a threshold period of time between upgrades of the Structure; a target market value for a Property; a target lease or rental value for a Property; a cost of financing for a Property; Total Cost of Ownership of a Property; Total Cost of Deployment of a Property or other quantifiable aspect.

In some embodiments, Deployment Performance Metrics may be related to a fungible item, such as a measurement of energy (e.g., kWh of electricity, gallon of fuel oil, cubic foot of gas, etc.); man-hours of work; trade medium (e.g., currency, bitcoin, stock, security, option etc.); parts of manufactured volume of material processed or other quantity. Relating multiple disparate Deployment Performance Metrics to a fungible item allows disparate Performance Metrics to be compared for relative value.

Modeled Performance Levels 113 may also be entered into the automated apparatus in logical communication with the AVM 111. The Modeled Performance Levels 113 may include an appropriate level of Performance of an aspect of the Structure in the AVM affected by the Deployment Performance Metric 112. For example, a Performance Level 113 for energy efficiency for a Structure modeled may include a threshold of kilowatt-hours of electricity consumed by the Structure on a monthly basis. Similarly, a target market value or lease value may be a threshold pecuniary amount. In some embodiments, a pecuniary amount may be according to a period of time, such as monthly, or a term of years.

Empirical Metrics Data 114 may be generated and entered into the automated apparatus on an ongoing basis. The Empirical Metrics Data 114 will relate to one or more of the Deployment Performance Metrics and may be used to determine compliance with a Deployment Performance Level and/or a Performance Levels. Empirical Metrics Data 114 may include, by way of non-limiting example, one or more of: a unit of energy; a unit of water; a number of service calls; a cost of maintenance; a cost of upgrades; equipment details, design details, machinery details, identification of human resources deployed; identification of organizations deployed; number of human resources; demographics of human resources (e.g., age, gender, occupations, employment status, economic status, requiring assistance with basic living necessities; and the like); percentage of time Structure is occupied; purpose of occupancy (e.g., primary residence, secondary residence, short-term rental, long-term lease, etc.); Sensor readings (as discussed more fully below); man-hours required for Structure repair, maintenance, or upgrades; and total currency (or other fungible pecuniary amount) expended on behalf of a Structure or Property.

In addition to Empirical Metrics Data 114, Lead Actions and expected Lag Benefits 115 that may cause an effect on one or both of a Deployment Performance Level 112 and a Performance Level 113, may be entered into the automated apparatus. A Lead Action may include an action expected to raise, maintain or lower an Empirical Metrics Data 114. For example, an action to install water efficient plumbing fixtures may be scheduled in order to improve water consumption metrics. Similar actions may relate to electrically efficient devices, or automatic electric switches being installed; preventive maintenance being performed; Structure automation devices being installed and the like. Other Lead Actions may include limiting a demographic of occupants of a Structure to a certain demographic, such as senior citizens. An expected benefit may be measured in Lag Benefit measurements, such as those described as Empirical Metrics Data 114, or less tangible benefits, such as occupant satisfaction.

The automated apparatus may also be operative to calculate Future Performance 116 based upon one or more of: AVM Model with As Built Data 111; Deployment Performance Metrics 112; Modeled Performance Levels 113 and Empirical Metrics Data 114. Future Performance may be calculated in terms of an appropriate unit of measure for the aspect for which Performance is calculated, such as, for example: an energy unit; man hours; mean time between failures and dollar or other currency amount.

Calculation of Future Performance 116 may be particularly useful to calculate Total Resources calculated to be required to support a particular Structure, group of Structures, properties and/or group of properties over a term of years ("Total Resources Calculated"). Total Resources Calculated may therefore be related to calculations of Future Performance 116 and include, for example, one or more of: energy units; water units; man hours; equipment; machinery and dollars (or other currency or fungible item). In some embodiments, calculations of Future Performance may include a Total Cost of Ownership for a term of years. For example, a Total Cost of Ownership for a Property may include a purchase amount and amounts required for maintenance, repair and upgrades from day one of Deployment through twenty years of Deployment (a shorter or longer term of years may also be calculated).

Accordingly, some embodiments may include a calculation of Total Resources required that includes a purchase price of a Property with a Structure that incorporates a total cost associated with the Property over a specified term of years. The total cost will be based upon the AVM with As Built Data 111; Deployment Performance Metrics 112; Modeled Performance Levels 113 and Empirical Metrics Data 114.

Moreover, Total Resources required may be aggregated across multiple properties and. Structures. Aggregation of Properties may be organized into Property pools to mitigate risk of anomalies in the Calculation of Future Performance. Of course, the benefits of Property ownership and/or management may also be pooled and compared to the Total Resources required. In various embodiments, different aspects of calculated Future Performance 116 may be aggregated and allocated to disparate parties. For example, first aggregation may relate to man hours of technician time for Structure repair and maintenance and the fulfillment of obligations related to the aggregation may be allocated to a first party. A second aggregation may relate to machinery Performance and obligations allocated to a second party. A third aggregation may relate to equipment Performance and obligations allocated to a third party. Other aggregations may similarly be allocated to various parties. In some embodiments, financial obligations incorporating one or both of acquisition cost and ongoing Deployment costs may be allocated and financed as a single loan. Other embodiments include a calculated Future Performance cost being incorporated into a purchase price.

An important aspect of the present invention includes definition and execution of Lead Actions based upon one or more of: the AVM Model with As Built Data 111; Deployment Performance Metrics 112; Modeled Performance Levels 113; Empirical Metrics Data 114 and Calculations of Future Performance 116.

Figure 1B:
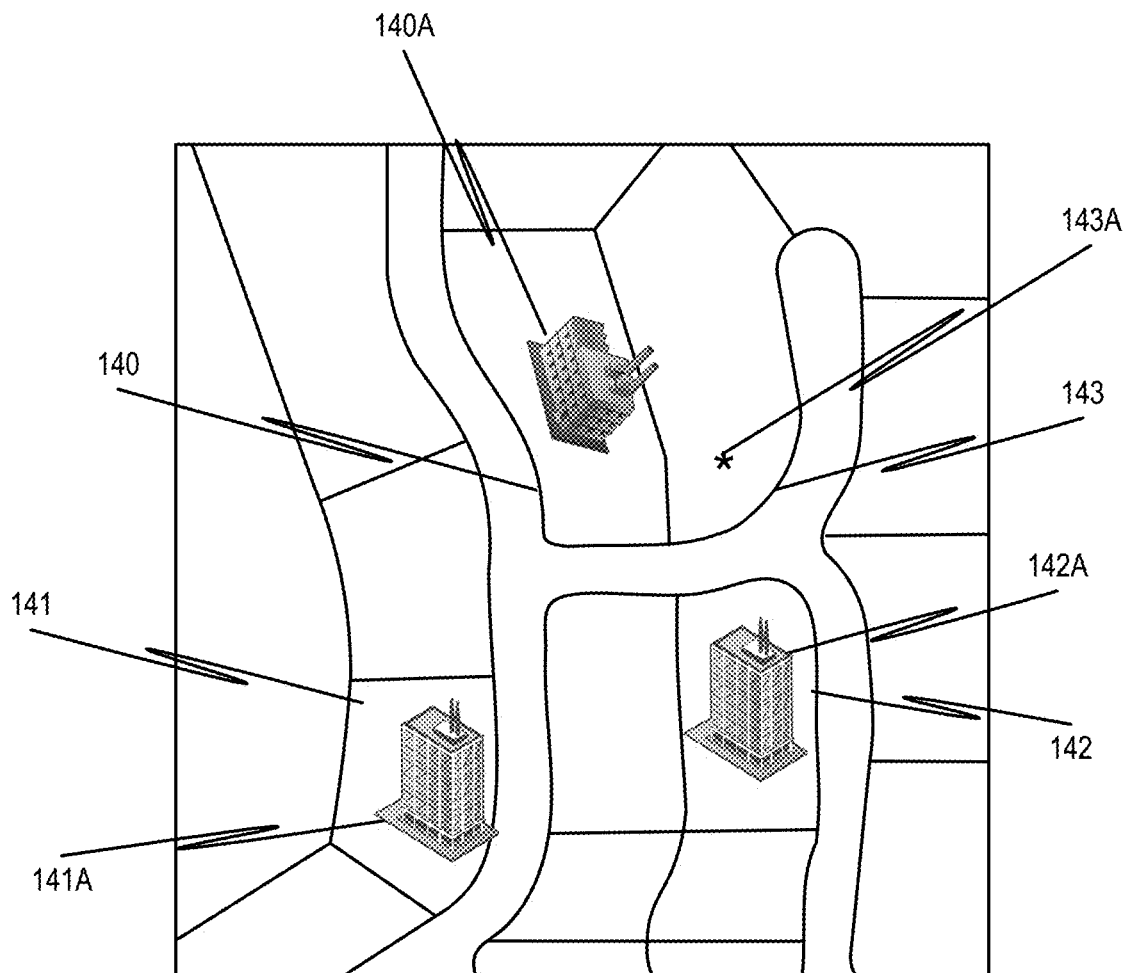
FIG. 1B illustrates geolocation aspects that may be used to identify a Property and corresponding wireless modalities that may be used.

Referring now to FIG. 1B, an AVM is generally associated with a Property that includes real estate parcels 140-143. In some embodiments, one or more of the following are performed on the Property: monitoring; service call; an improvement, a repair, maintenance and an upgrade. The Property is identified according to an automated determination of a location and a particular position, elevation and direction are further determined automatically within the Property. Smart Devices may be used to access data records stored in an AVM according to a unique identifier of a physical location of the real estate parcels 140-143.

As illustrated, a map of real estate parcels 140-143 is shown with icons 140A-142A indicating parcels 140-142 that have virtual Structures 140A-142A included in a virtual model associated with the parcels. Other parcels 143 have an indicator 143A indicating that a virtual model is in process of completion.

In some methods utilized by the present invention, data in an AVM may be accessed via increasingly more accurate determinations. A first level of geospatial location determinations may be based upon the real estate parcels 140-143 themselves and a second geospatial determination may be made according to Reference Position Transceivers (discussed more fully below) included within the boundaries of the real estate parcels 140-143. Still more accurate location position may be calculated according to one or both of a direction determination and an accelerometer or other location determination technology. Accordingly, it is within the scope of the present invention to access a record of a design model for a specific wall portion within a Structure based upon identification of a particular parcel of real estate parcels 140-143 and a location within a Structure situated within the real estate parcels 140-143 and height and direction. Likewise, the present invention provides for accessing As Built data and the ability to submit As Built data for a specific portion of a Structure based upon an accurate position and direction determination.

For example, in some embodiments, a first level of location identification may include a real estate parcel 140-143 identified based upon a first wireless communication modality, such as a GPS communication or a sub-GHz wavelength communication. A second level of location identification may include a Structure 141A-143A identified via one or more of GPS; UWB; Wi-Fi; sonic communications; a sub-GHz wavelength communication and Bluetooth communications. A third level of location identification may include an Agent position within a Structure (or Property) based upon logical communications via one or more of: UWB; Wi-Fi; sonic communications; and Bluetooth communications. A fourth level of location identification may include a determination of a distance from an item to a Smart Device borne by an Agent, the distance determination may be based upon transceiving in a SVAN operating in a Bluetooth wavelength, a WiFi wavelength or a sub-GHz wavelength.

In some implementations of the present invention, a Property-unique identifier may be assigned by the AVM and adhere to a standard for universally unique identifiers (UUID), other unique identifiers may be adopted from, or be based upon, an acknowledged standard or value. For example, in some embodiments, a unique identifier may be based upon Cartesian Coordinates, such as global positioning system (GPS) coordinates. Other embodiments may identify a Property according to one or both of: a street address and a tax map number assigned by a county government or other authority.

In some embodiments, an AVM may also be associated with a larger group of Properties, such as a manufacturing plant, research and development, assembly, a complex, or other defined arrangement.

As illustrated, in some preferred embodiments, an electronic record correlating with a specific Property may be identified and then accessed based upon coordinates generated by a GPS device, or other electronic location device. The GPS device may determine a location and correlate the determined location with an AVM record listing model data, As Built data, improvement data, Performance data, maintenance data, cost-of-operation data, return-on-investment data and the like.

In another aspect, data generated by Sensors deployed in a Structure may be aggregated and analyzed according to a Property location and/or Structure location associated with the Sensor/Sensor Cluster/Sensor Gateway. In this manner, an event may be tracked in a larger geographic area with numerous data points. For example, an event such as the launch of a rocket may cause data to be generated by multiple Sensor/Sensor Cluster/Sensor Gateways and tracked across a geographic area. Similarly, a natural event, such as an earthquake, hurricane, wildfire and the like may be tracked with highly accurate Sensor data across tens, hundreds or many thousands of data points. Still other events may include, for example, power usage, power generation, water flow in a hydroelectric system, water management in a reservoir system, flooding, release of toxic components into the environment, etc.

Figure 1C:
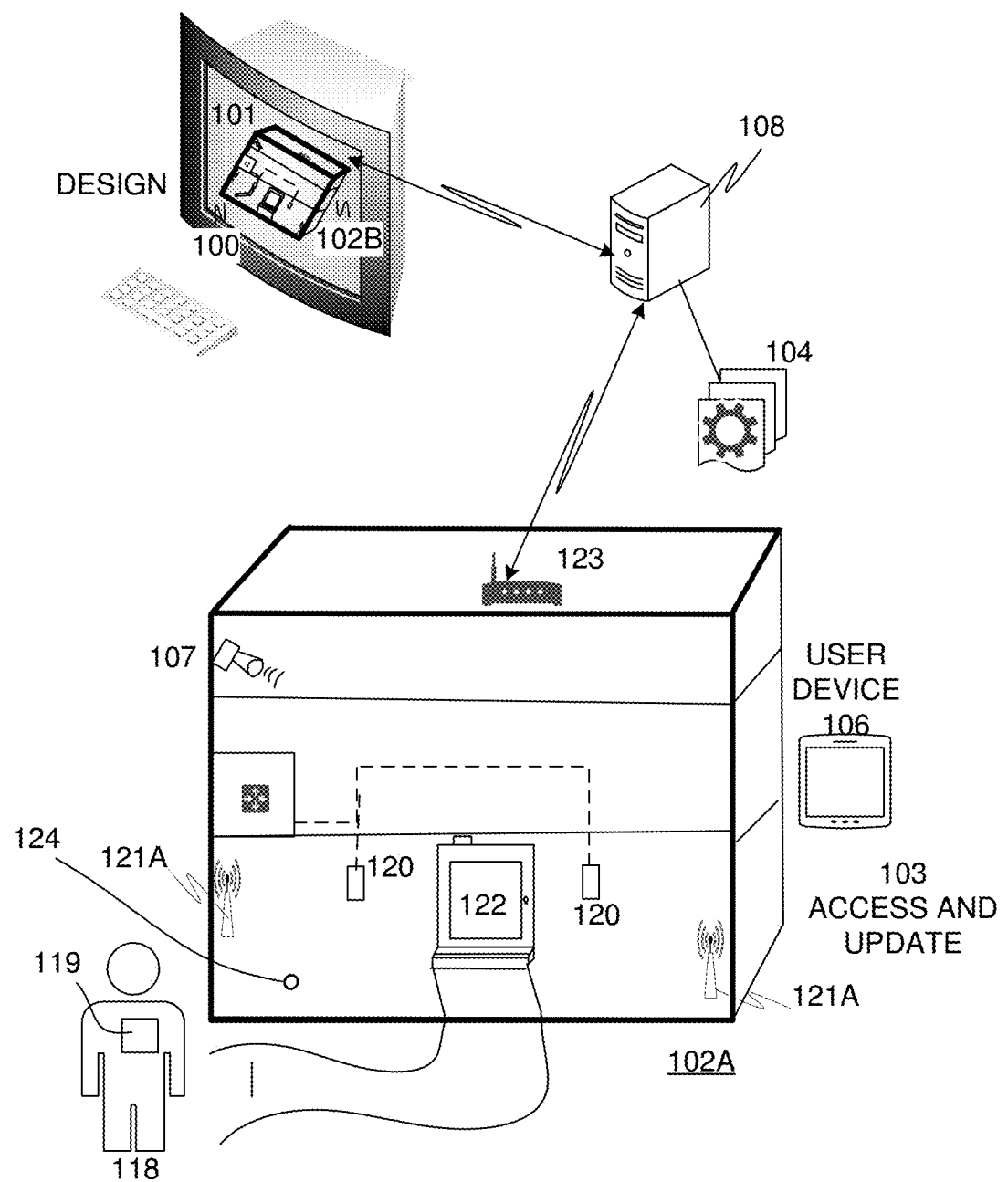
FIG. 1C illustrates a block diagram of ongoing data capture via Smart Devices and Sensors and support for predictive modeling based upon the smart data capture.

Referring now to FIG. 1C, a relational view of an AVM 100 with a VS 102B is illustrated, as well as a physical Structure 102A. The AVM 100 includes a virtual model stored in digital form with a design aspect that allows for a physical Structure 102A suitable for use to be designed and modeled in a virtual environment. The design aspect may reference Performance data of features to be included in a VS 102B and also reference variables quantifying an intended use of the VS 102B. The Virtual Structure 102B and the AVM 100 may reside in a virtual setting via appropriate automated apparatus 108. The automated apparatus 108 will typically include one or more computer servers and automated processors as described more fully below and may be accessible via known networking protocols.

The Physical Structure 102A may include Transceivers 120 or other type of Node which may incorporate or be co-located with a Sensor or transmitter(s) or receiver(s) that monitor or otherwise quantify one or more conditions in a specified area, which may include, for example an area of ingress and egress 122, such as a doorway, elevator and/or loading dock. Reference point Transceivers 121A may be used as wireless references of a geospatial position. A wireless Node 123 may also link logical infrastructure within the Structure 102A with a digital communications network.

In correlation with the design aspect, the present invention includes an As Built Model 101 that generates a Virtual Structure 102A in the context of the AVM 100. The As Built Model 101 includes virtual details based upon As Built data captured on or proximate to a physical site of a related physical Structure 102A. The As Built data may be captured, for example, during construction or modification of a physical Structure 102A.

The As Built Model 101 may include detailed data including image captures via one or more Image Capture Devices 107 and physical measurements of features included in the physical Structure 102A. The physical measurements may be during a build phase of the physical Structure; or subsequent to the build phase of the physical Structure. In some embodiments, original As Built measurements may be supplemented with additional data Structure data associated with repairs or improvements are made to the physical Structure. Details of recordable build aspects are placed as digital data on a recordable medium 104 included in the automated apparatus 108.

The digital data included on a recordable medium 104 may therefore include, for example, one or more of: physical measurements capturing Experiential Data; image data (e.g., digital photos captured with a CCD device); laser scans; infrared scans and other measurement mediums. One or more records on the recordable medium 104 of an As Built Structure may be incorporated into the AVM 100 thereby maintaining the parallel nature of the AVM 100 with the physical Structure 102A.

In some embodiments, As Built data on a recordable medium 104 may be generated and/or captured via an Image Capture Device 107.

As the physical Structure is deployed for use, subsequent measurements that generate and/or capture Experiential Data may be made and incorporated into the AVM 100. In addition, a user may access and update 103 the AVM 100 to ascertain features of the physical Structure 102A that have been virtually incorporated into the AVM 100. In some examples, a tablet, handheld network access device (such as, for example a mobile phone) or other device with automated location service may be used to determine a general location of a physical Structure 102A. For example, a smart phone with global positioning system (GPS) capabilities may be used to determine a physical address of a physical Structure, such as 123 Main Street. Stored records containing data relating to 123 Main Street may be accessed via the Internet or other distributed network.

In addition to the use of GPS to determine a location of a User Device, the present invention provides for a real estate parcel with a physical Structure 102A that includes more radio frequency (or other mechanism) location identifiers 121A. Location identifiers 121A may include, for example, radio transmitters at a defined location that may be used to accurately identify via triangulation, a position of a user device 106, such as a: tablet, smart phone, or virtual reality device. The position may be determined via triangulation, single strength, time delay determination or other process. In some embodiments, triangulation may determine a location of a user device within millimeters of accuracy.

Other location identifiers may include, by way of non-limiting example, RFID chips, a visual markings (e.g., a hash tags or barcode), pins, or other accurately placed indicators. Placement of the location identifiers may be included in the AVM and referenced as the location of the physical user device is determined. As described above, specific location identifiers may be referenced in the context of GPS coordinates or other more general location identifiers.

Based upon the calculated location of the user device 106, details of the physical Structure 102A may be incorporated into the Virtual Structure 102B and presented to a user via a graphical user interface (GUI) on the user device 106.

For example, a user may approach a physical Structure and activate an app on a mobile user device 106. The app may cause the user device 106 to activate a GPS circuit included in the user device and determine a general location of the user device 106, such as a street address designation. The general location will allow a correct AVM 100 to be accessed via a distributed network, such as the Internet. Once accessed, the app may additionally search for one or more location identifiers 121A of a type and in a location recorded in the AVM. An AVM may indicate that one or more RFID chips are accessible in a kitchen, a living room and each bedroom of a Structure. The user may activate appropriate Sensors to read the RFID chips and determine their location. In another aspect, an AVM 100 may indicate that location identifiers 121A are placed at two or more corners (or other placement) of a physical Structure 102A and each of the location identifiers 121A may include a transmitter with a defined location and at a defined height. The user device 106, or other type of controller, may then triangulate with the location identifiers 121A to calculate a precise location and height within the physical Structure.

Similarly, a direction may be calculated via a prescribed movement of the user device 106 during execution of code that will record a change in position relative to the location identifiers 121A. For example, a user Smart Device, such as a smart phone or user device 106 may be directed towards a wall or other Structure portion and upon execution of executable code, the Smart Device may be moved in a generally tangential direction towards the wall. The change in direction of the user device 106 relative to the location identifiers 121A may be used to calculate a direction. Based upon a recorded position within the Structure 102A and the calculated direction, a data record may be accessed in the AVM 100 and a specific portion of the AVM 100 and/or the Virtual Structure 102B may be presented on the user device 106. In other embodiments, a direction may be chosen, or verified via a mechanism internal to the Smart Device, such as a compass or accelerometer.

In still another aspect of the present invention, in some embodiments, transmissions from one or more location identifiers 121A may be controlled via one or more of: encryption; encoding; password protection; private/public key synchronization; or other signal access restriction. Control of access to location identifiers 121A may be useful in multiple respects, for example, a location identifier may additionally function to provide access to data, a distributed network and/or the Internet.

The Virtual Structure 102B may include one or both of: historical data and most current data relating to aspects viewable or proximate to the user device 106 while the user device is at the calculated location in the physical Structure 102A. In this way, the parallel virtual world of the AVM 100 and the Virtual Structure 102B may present data from the virtual world that emulates aspects in the physical world, and may be useful to the user accessing the user device 106, while the user device is at a particular physical location. As discussed within this document, data presented via the AVM 100 may include one or more of: design data, As Built data, Experiential Data, Performance data relating to machinery and/or features of the AVM 100 or physical Structure; maintenance data, and annotations.

Annotations may include, for example, a user's or designer's note recorded at a previous time, a service bulletin, maintenance log, operation instructions or a personal note to a subsequent user, such as a virtual "John Smith was here" guest log indicating who had frequented the location. Annotations may include one or both of text and image data. For example, an annotation may include an image of the location captured at a given time and date. The image may be of a personal nature, e.g., the living room while the Smith's owned the Structure, or a professional nature, e.g., the living room after being painted by XYZ Contractor on a recorded date. In some embodiments, annotations may be used to indicate completion of a work order. Recordation of completion of a work order may in turn trigger a payment mechanism for paying an entity contracted to complete the work order. In another aspect, annotations may relate to an AVM or a Virtual Structure as a whole, or to a particular aspect that is proximate to a location of the user device within the Virtual Structure.

In some embodiments, details of a proposed use of a Structure and parcel may be input into a design module and used to specify or recommend features to be included in an AVM 100.

According to the present invention, features of a Structure and parcel are generated within a digital design model and then tracked as the features are implemented in a build process and further tracked in Performance of the Structure as it is placed into use. To the extent available, Performance is tracked in the context of variables relating to use. Variables may include, for example: a use of the Structure, such as manufacturing and/or processing; a number of resources accessing in a Structure; demographics of the human resources; number of months per year the Structure is deployed for use; which months of the year a Structure is deployed for use; which hours of the day the Structure is occupied; and other relevant information.

As Experiential Sensor Readings are generated, they may be memorialized to generate Experiential Data associated with a physical Structure 102A. The Experiential Data is collected and analyzed via structured queries and may also be analyzed with artificial intelligence processes such as unstructured queries to derive value. In some embodiments, Experiential Data may also be associated with a human and/or an animal interacting with the Structure 102A. This may be particularly useful for Structures that are processing plants. Whereas former processing plants were generally designed and built to mitigate against variability in a human 118 and between disparate humans 118, the present invention allows for human variability to be monitored via Sensors within device 119. Moreover, the Structure may be modified to optimally interrelate with the values for variables attributable to a human 118 that will inhabit or otherwise interact with the Structure 102A. Human (and/or animal) may be quantified with Sensors within device 119 installed on or proximate to the Human 118. Alternatively, Sensors 124 located in, or proximate to, a Structure 102A may be used to monitor human variability. Biosensors may be used to provide empirical data of humans 118 interacting with a Structure may be analyzed using structured or unstructured queries to device relationships between Structure Performance and human biometrics. Accordingly, Sensors may be used to quantify interaction between a human 118 and an As Built Structure 102A according to physiological and behavioral data, social interactions, and environmental factors within the Structure, actions undertaken, movements, and almost any quantifiable aspect.

As Built Features and biometrics may be further utilized to control various Structure automation devices. Structure automation devices may include, by way of non-limiting example one or more of: automated locks or other security devices; thermostats, lighting, heating, chemical processing, cutting, molding, laser shaping, 3D printing, assembly, cleaning, packaging, and the like. Accordingly, a Structure with recorded As Built Design Features and vibration Sensors may track activities in a Structure and determine that a first occupant associated with a first vibration pattern of walking is in the Structure. Recorded vibration patterns may indicate that person one is walking down a hallway and automatically turn on appropriated lighting and adjust one or more of: temperature, sound, and security. Security may include locking doors for which person one is not programmed to access. For example, a first pattern of vibration may be used to automatically ascertain that a person is traversing an area of a Structure for which a high level of security is required or an area that is designated for limited access due to safety concerns. As Built data has been collected. Other Structure automation may be similarly deployed according to As Built data, occupant profiles, biometric data, time of day, or other combination of available Sensor readings.

Figure 1D:
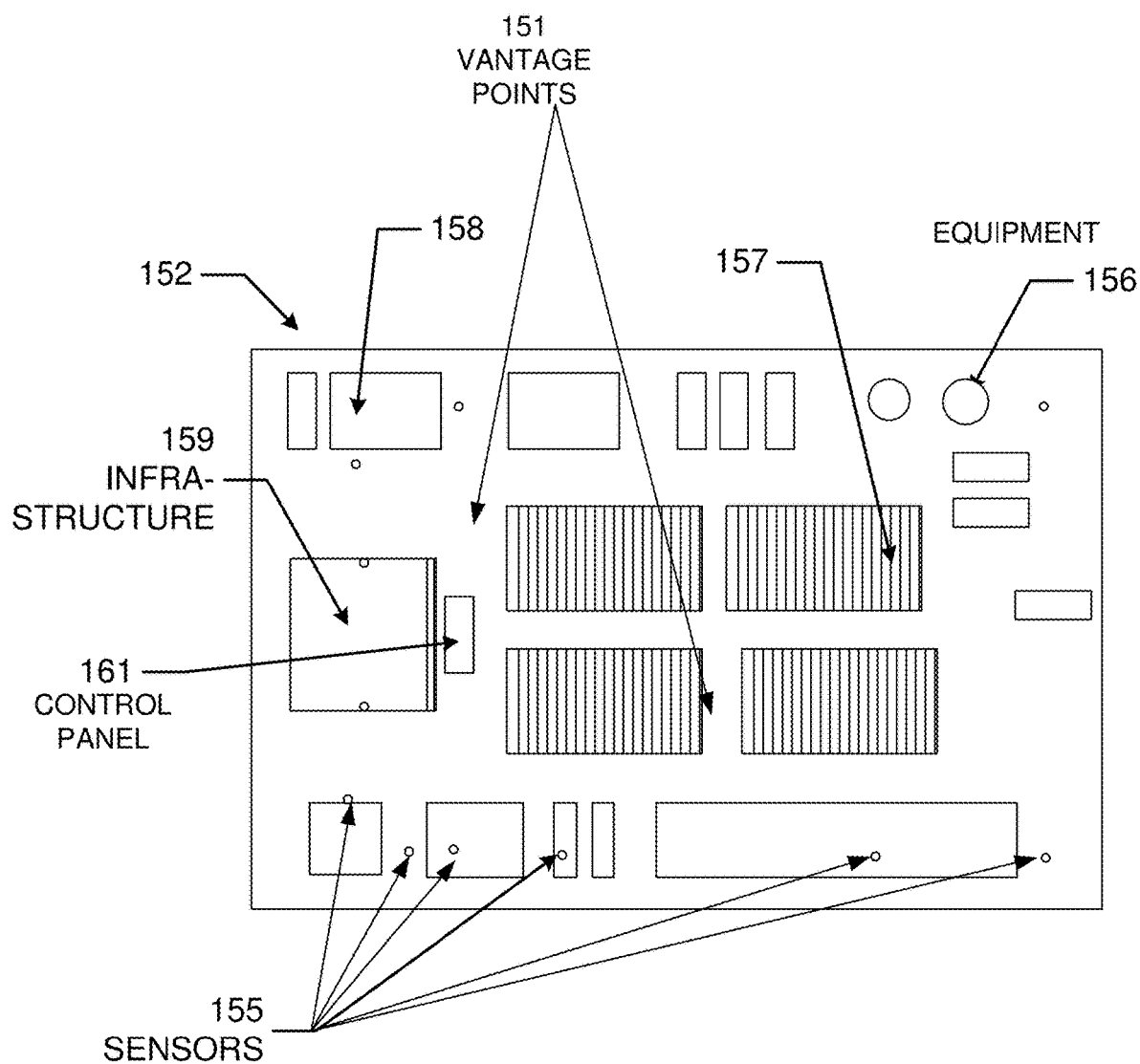
FIG. 1D illustrates an exemplary Structure layout with various items delineated in a top-down representation, according to some embodiments of the present invention.

Referring now to FIG. 1D, according to the present invention a virtual model 100 is generated that correlates with a physical Structure 102A and includes virtual representations of As Built features and Experiential Data. As discussed more fully herein, the virtual model may include an AVM with As Built data, such as image data and measurements, included within the model. In addition, Sensor data may be collected over time and incorporated into the AVM. The AVM may include virtual representations of one or more of: Sensors 155; equipment 156-158; controls 161; infrastructure 159, such as HVAC, utilities, such as electric and water, gas lines, data lines, etc. and Vantage Points 151.

In some implementations, a virtual reality headset may be worn by a user to provide an immersive experience from a Vantage Point 151 such that the user will experience a virtual representation of what it would be like to be located at the Vantage Point 151 within the Structure 152 at a specified point in time. The virtual representation may include a combination of Design Features, As Built data and Experiential data. A virtual representation may therefore include a virtual representation of image data via the visual light spectrum, image data via infrared light spectrum, noise and vibration reenactment. Although some specific types of exemplary Sensor data have been described, the descriptions are not meant to be limiting unless specifically claimed as a limitation and it is within the scope of this invention to include a virtual representation based upon other types of captured Sensor data may also be included in the AVM virtual reality representation.

Figure 1E:
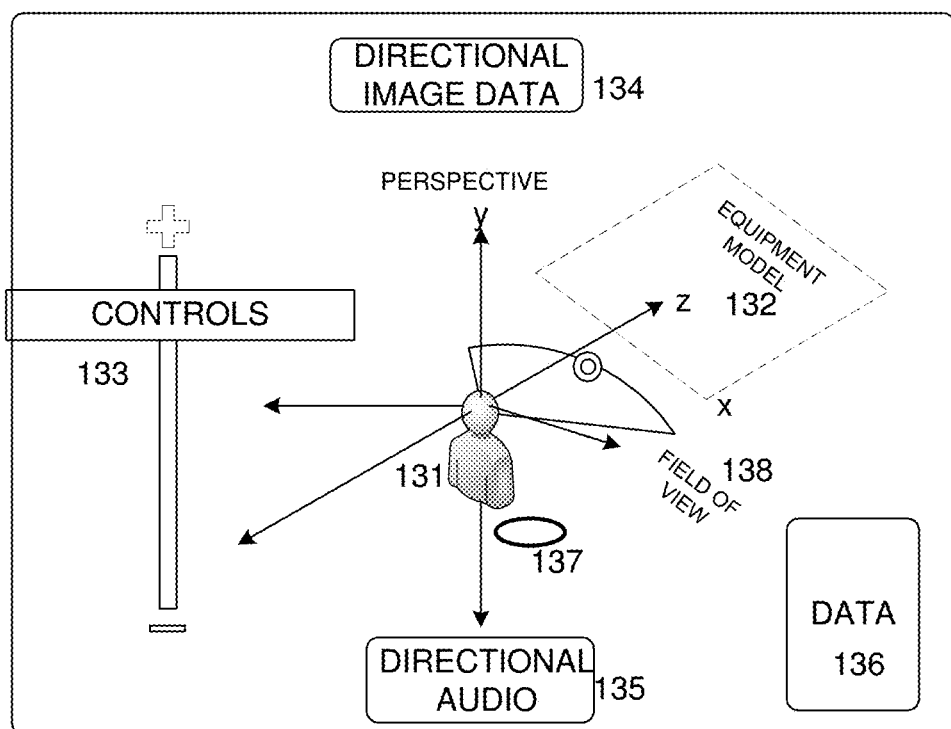
FIG. 1E illustrates a diagram of an Agent and Directional Image Data.

Referring now to FIG. 1E, a user 131 is illustrated situated within an AVM 111. The user 131 will be virtually located at a Vantage Point 137 and may receive data 136, including, but not limited to one or more of: image data 134, audio data 135 and Ambient Data 136. The user 131 may also be provided with controls 133. Controls 133 may include, for example, zoom, volume, scroll of data fields and selection of data fields. Controls may be operated based upon an item of Equipment 132 within a Field of View 138 of the User 131 located at a Vantage Point 137 and viewing a selected direction (Z axis). The user is presented with Image Data from within the AVM 111 that includes As Built data and virtual design data.

Additional examples may include Sensor arrays, audio capture arrays and camera arrays with multiple data collection angles that may be complete 360 degree camera arrays or directional arrays, for example, in some examples, a Sensor array (including image capture Sensors) may include at least 120 degrees of data capture, additional examples include a Sensor array with at least 180 degrees of image capture; and still other examples include a Sensor array with at least 270 degrees of image capture. In various examples, data capture may include Sensors arranged to capture image data in directions that are planar, oblique, or perpendicular in relation to one another.

Figure 2:
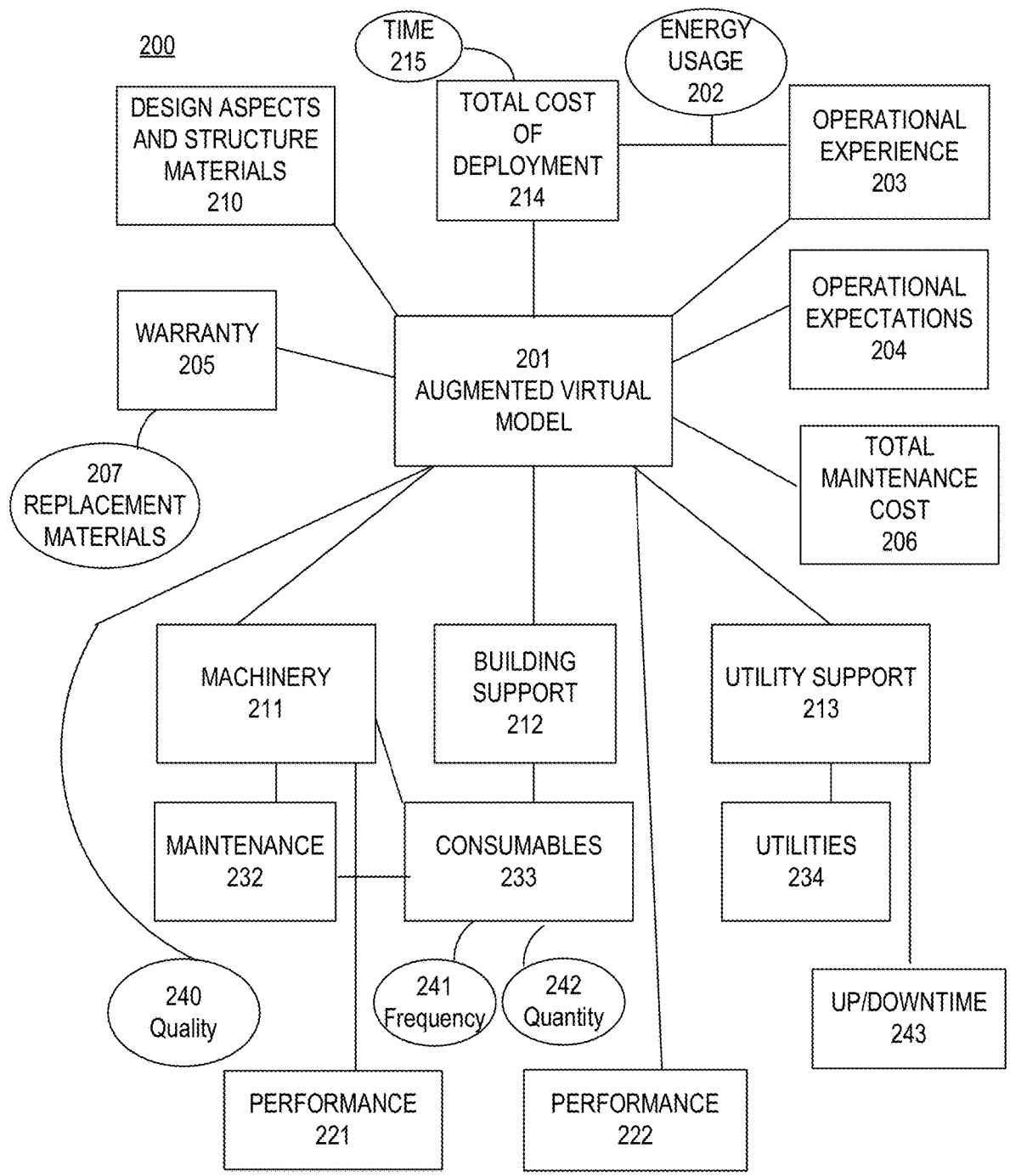
FIG. 2 illustrates a block diagram of an Augmented Virtual Modeling system.

Referring now to FIG. 2, a functional block illustrates various components of some implementations of the present invention. According to the present invention, automated apparatus included in the AVM 201 are used to generate a model of a Virtual Structure and may also incorporate a model and associated real estate parcel. One or more pieces of equipment that will be deployed in the Property may be included into the AVM 201. This equipment may include, for example: machinery 211; building support items 212, and utilities support 213. The AVM 201 may model operational levels 204 during deployment of a Structure and associated machinery and equipment included in the AVM 201. Machinery 211 may include, for example, manufacturing tools, robots or other automation, transport tools, chemical processing machine, physical processing machine, assembly machine, heat processing machine, cooling machine, deposition device, etching device, welding apparatus, cutting apparatus, forming tool, drilling tool, shaping tool, transport machine, Structure automation, air purification or filter systems, noise containment device and the like. Utility support equipment may include cabling, dish antennas, Wi-Fi, water softener, water filter, power, chemical supply, gas supply, compressed air supply and the like, as well as uptime and downtime associated with a Structure utility and uptime and down time 243 of one or more aspects of the Structure.

The AVM 201 calculates a predicted Performance of the AVM and generates Operational Levels 204 based upon the Performance 222, wherein "Performance" may include one or more of: total cost of Deployment 214; operational experience 203 which may include one or both of: objective empirical measurements and satisfaction of operator's use an As Built physical model based upon the AVM; operational expectations 204, total maintenance cost 206, and residual value of an As Built Structure following a term-of-years of occupation and use of an As Built Structure based upon the AVM. Performance 221 may also be associated with a specific item of machinery 211.

In another aspect, actual Operational Experience 203 may be monitored, quantified and recorded by the AVM 201. Data quantifying the Operational Experience 203 may be collected, by way of non-limiting example, from one or more of: Sensors incorporated into an As Built Structure; maintenance records; utility records indicating an amount of energy 202 (electricity, gas, heating oil) consumed; water usage; periodic measurements of an As Built Structure, such as an infrared scan of climate containment, air flow through air handlers, water flow, water quality and the like; user surveys and maintenance and replacement records.

In still another aspect, a warranty 205 covering one or both of parts and labor associated with an As Built Structure may be tracked, including replacement materials 207. The warranty 205 may apply to an actual Structure, or one or more of machinery 211; building support 212 item; and utility support item 213.

The AVM 201 may consider a proposed usage of a Deployment of a Structure based upon values for Deployment variables and specify aspects of one or more of: machines 211; building support 212; and utility support 213 based upon one or both of a proposed usage and values for Deployment variables. Proposed usage may include, for example, how many human resources will occupy a Structure, demographics of the resources that will occupy the Structure; percentage of time that the Structure will be occupied; whether the Structure is a primary residence; whether the Structure is a leased Property and typical duration of leases entered into; and environmental conditions experienced by the Structure, such as exposure to ocean salt, winter conditions, desert conditions, high winds, heavy rain, high humidity, or other weather conditions.

In another aspect, Deployment may relate to biometrics or other data associated with specific occupants of a Structure. Accordingly, in some embodiments, Sensors may monitor biologically related variables of occupants and/or proposed occupants. The biometric measurements may be used to determine one or both of Lead Actions and Lag Metrics. Lead Actions may include one or more of: use of specific building materials, selection of design aspects; Deployment of Structure equipment; Deployment of machinery; terms of a lease; length of a lease; terms of a maintenance contract; and Structure automation controls.

According to the present invention, design aspects and Structure materials 210 may also be based upon the proposed usage and values for Deployment variables. For example, a thicker exterior wall with higher insulation value may be based upon a Structure's location in an adverse environment. Accordingly, various demographic considerations and proposed usage of a Structure may be used as input in specifying almost any aspect of a Structure.

In still another consideration, a monetary value for one or more of: a Total Cost of Deployment ("TCD"). Total Maintenance Cost ("TMC") and a desired return on investment ("ROI") for a Property may be used as input for one or more design aspects included in an AVM System 200. Total Cost of Ownership, TCD, TMC, and ROI may be used to determine optimal values of variables 202-205, 210-213 specified in an AVM System 200 and incorporated into an As Built Structure, and other improvements to a real estate parcel.

A Total Cost of Deployment 214 may change based upon a time period 215 used to assess the Total Cost of Deployment 214. A ROI may include one or more of: a rental value that may produce a revenue stream, a resale value, a cost of operation, real estate taxes based upon Structure specifications and almost any other factor that relates to one or both of a cost and value.

Desirable efficiency and Performance may be calculated according to one or more of: established metrics, measurement protocols, and past experience. The AVM 201 and associated technology and software may be used to support a determination of a TCD. In another aspect, a TCD may be based upon an assembly of multiple individual metrics, procedures to assess metrics, procedures to adjust and optimize metrics and procedures to apply best results from benchmark operations. In the course of managing Total Cost of Ownership, in some examples, initial steps may include design aspects that model an optimal design based upon Total Cost of Ownership metrics.

In the following examples, various aspects of Total Cost of Deployment 214, Total Maintenance Costs, and associated metrics, are considered in the context of calculating a target Total Cost of Deployment 214. Accordingly, the AVM may be used to attempt to optimize TCD based on one or more measured variables.

A designed Structure is ultimately built at a site on a real estate parcel. A build process may be specified, which may provide metrics that may be used in a process designed by an AVM 201 and also used as a physical build proceeds. In some examples, time factors associated with a physical build may be important, and in some examples time factors associated with a physical build may be estimated, measured, and acted upon as they are generated in a physical build process. Examples of time factors may include one or more of: a time to develop and approve site plans; a time to prepare the site and locate community provided utilities or site provided utilities; a time to lay foundations; a time to build Structure; a time to finish Structure; a time to install internal utilities and facilities related aspects; a time to install, debug, qualify and release equipment; and times to start production runs and to certify compliance of production are all examples of times that can be measured by various techniques and sensing equipment on a Structure's site. Various time factors for a build are valuable and may become increasingly valuable as a physical build proceeds since the monetary investment in the project builds before revenue flows and monetary investments have clearly defined cost of capital aspects that scale with the time value of money.

Various build steps may include material flows of various types. Material flow aspects may be tracked and controlled for cost and efficiency. Various materials may lower a build materials cost but raise time factors to complete the build. Logical variations may be calculated and assessed in an AVM 201 and optimal build steps may be generated and/or selected based upon a significance placed upon various benefits and consequences of a given variable value. Physical build measurements or Sensor data on physical build projects may also be used as input in an assessment of economic trade-offs.

The equipment deployed may incur a majority of a build cost depending upon user-defined target values. The AVM may model and present alternatives including one or more of: cost versus efficiency, quality 240, time to build, life expectancy, market valuation over time. A cost to build may be correlated with cost to deploy and eventual resale. An overall model of a Total Cost of Deployment 214 may include any or all such aspects and may also include external. In some examples, the nature of equipment trade-offs may be static, and estimations may be made from previous results. In some other examples, changes in technology, strategic changes in sourcing, times of acquisition, and the like may play into models of Total Cost of Deployment 214.

In some examples, an initial efficiency of design that incurs large costs at early stages of a project may have a dominant impact on Total Cost of Deployment 214 when time factors are weighted to real costs. In other examples, the ability of a Structure to be flexible in its deployment or build order over time and to be changed in such flexible manners, where such changes are efficiently designed may dominate even if the initial cost aspects may be less efficient due to the need to design—in flexibility. As a Structure is built, and as it is operated the nature of changing customer needs may create dynamic aspects to estimations of Total Cost of Deployment 214. Therefore, in some examples, estimates on the expected dynamic nature of demands on a Structure may be modeled against the cost aspects of flexibility to model expectations of Total Cost of Deployment 214 given a level of change.

In some examples, factors that may be less dependent on extrinsic factors, such as product demand and the like may still be important metrics in Total Cost of Deployment 214. Included in the As Built factors may be calculations such as HVAC temperature load, in which personnel and seasonal weather implications may be important. AVM models may include a user interface to receive value useful in the AVM models. In addition, electronic monitoring, via Sensors that may determine energy consumption, includes for example monitoring any of: electricity, fuel oil, natural gas, propane and the like.

Temperatures may be monitored by thermocouples, semiconductor-junction-based devices or other such direct-measurement techniques. In other examples, temperature and heat flows may be estimated derived from photon-based measurement, such as surveying the Structure with infrared imaging or the like.

Utility load may be monitored on a Structure-wide basis and/or at point-of-use monitoring equipment located at hubs or individual pieces of equipment themselves. Flow meters may be inline, or external to, features such as pipes, wires, or conduits. Gas and liquid flows may be measured with physical flow measurements or sound-based measurement. In other examples, electricity may be monitored as direct current measurements or inferred-inductive current measurement.

In some examples, the nature and design of standard usage patterns of a Structure and an associated environment may have relevance to Total Cost of Ownership. For example, usage that includes a larger number of ingress and egress will expose an HVAC system to increased load and usage that includes a significant number of waking hours with inhabitants in the building may incur increased usage of one or more of: machinery 211; building support devices 212; and utilities 234.

The nature and measurement aspects of vibration in the Structure may also be modeled and designed as the Structure is built. There may be numerous means to measure vibrations from capacitive- and resistive-based measurements to optical-based measurements that measure a subtle change in distance scale as a means of detecting vibration. Vibration may result from a Structure being located proximate to a roadway, train, subway, airport, tidal flow, or other significant source of relatively consistent vibration. Vibration may also be more periodic, such as earthquake activity. In still another aspect, vibration may result from human traffic within the Property. The use of vibration-monitoring Sensors may indicate various activities that take place within the Structure and facilitate more accurate modeling of a life expectancy of various aspects of the Structure as well as machines located within the Structure.

Noise levels are another type of vibrational measurement which is focused on transmission through the atmosphere of the Structure. In some cases, noise may emanate from one location after moving through solid Structure from its true source at another location. Thus, measurement of ambient sound with directional microphones or other microphonic sensing types may be used to elucidate the nature and location of noise emanations. In some cases, other study of the noise emanations may lead to establishment of vibrational measurement of different sources of noise. Floors, ceilings, doorways, countertops, windows, and other aspects of a Structure may be monitored in order to quantify and extrapolate noise levels. Noise and vibrational measurement devices may be global and monitor a region of a Structure, or they may be inherently incorporated into or upon individual equipment of the Structure.

In some examples, models of a Structure (including original models and As Built models) may include routings of pipes, wires, conduits and other features of a Structure and the installed equipment that have Structure. Together with models of the building Structure and the equipment placed in the building the various routed Structures may be married in a detailed AVM 201.

In another aspect, an AVM 201 may include conflicts between the physical Structures may be detected and avoided in the design stage at far improved cost aspects. In some examples, a designer may virtually ascertain a nature of the conflict and alter a design in virtual space to optimize operational aspects. Additionally, in some embodiments, an As Built model may be generated during and after a Structure is built for various purposes. In some examples, a technician may inspect a Structure for conformance of the build to the designed model. In other examples, as an As Built Structure is altered to deal with needed changes, changes will be captured and included in the As Built AVM 201.

In another aspect of the present invention, the AVM 201 may be used to generate a virtual reality model of a Property, including one or more Structures that may be displayed via user interface that includes an immersion of the user into a virtual setting. Immersion may be accomplished, for example, via use of a virtual reality headset with visual input other than a display screen is limited. In some embodiments, a virtual setting may be generated based upon a location of the user. For example, GPS coordinates may indicate a Property and a user may wear a headset that immerses the user in a virtual reality setting. The virtual reality setting may display one or more virtual models of Structures that may be potentially constructed on the Property.

Embodiments may include models generated using, for example, standard modeling software such as BIM 360™ field which may support the display of a Structure design in a very complete level of detail. Modeling of a Structure in its location or proposed location, or in multiple proposed locations, may be useful from a Total Cost of Ownership perspective, especially from an evaluation of the nature of a site layout including real estate Property parcel options and the like.

In some examples, a virtual display observed in the field at the site of an As Built or proposed build may allow for design changes and design evaluations to be viewed in a space before build is completed. For example, a Structure may be completed to the extent that walls, floors, and ceilings are in place. A user may utilize a virtual display to understand the layout difference for different designs. Designs may be iterated from designs with the least flexibility to more flexible (yet more complex) designs.

In some examples, the design systems may include various types of features such as building Structure, walls, ducts, utilities, pipes, lighting, and electrical equipment. The design systems are augmented with As Built Data and Experiential Data.

The design and modeling systems may be utilized to simulate and project cost spending profiles and budgeting aspects. The modeling systems may therefore be useful during the course of an audit, particularly when comparing actual versus projected spending profiles. The comparison of various spend sequencing may be used to optimize financing costs, maintenance, refurbishing and sequencing. The AVM 201 may be useful to provide early estimates and for cost tracking against projections. Such tracking may be visualized as displays across a virtual display of the building, facilities and equipment.

As described above, facing a Node (e.g., a Smart Device) towards an area in a Structure and moving the mobile device in a particular pattern may be used to ascertain a specific area of the Structure for which AVM 201 data should be accessed. A combination of one or more of: image, location, orientation, and other Sensors may also be used to identify to the mobile device specifically which wall segment, building aspect, machinery, or equipment the device is pointed towards. A location of mobile device, a height, and an angle of view may also be utilized to determine aspects of the Structure for which a virtual model is being requested.

In some embodiments, a user may be presented with various layers of data, including, for example, one or more of: structural aspects of the Structure, plumbing, electrical, data runs, material specifications, or other documentation, including, but not limited to: basic identifying information, installation information, service records, safety manuals, process records, and expected service schedule, among many other possibilities.

An additional non-limiting example, data aggregation may include Sensors generating data that is associated with an IoT (Internet of Things)-based identification. Various IoT devices (or Sensors) may include a digital storage, processor, and transmitter for storing and conveying identifying information. Upon request, an IoT device may relay identifying information of itself to a human via a communications device, or to the IoT device's neighbors. It may also possibly convey information received from and/or sent to other internet connected devices as well.

As per the above listing, functionality may therefore include modeled and tracked Performance of a Structure and equipment contained within the Structure, including consumables 233 used and timing of receipt and processing of consumables; modeled and actual maintenance 232, including quality of maintenance performed; equipment Performance including yields; Consumables 233 tracking may include a frequency of replacement and quantity of replaced consumables; Utilities 234 tracking may include projected and actually units of energy consumed.

In one aspect of the present invention, data related to the position and identity of substantial elements of a Structure first as designed and then recorded in their actual placement and installation. This may include locations of building features, such as beams, walls, electrical junctions, plumbing and etc. as the Structure is designed and constructed. As part of the Structure model, laser scanning may be performed on site at various disparate times during construction. An initial scan may provide general information relating to the location of the Structure in relationship to elements on the Property such as roadways, utilizes such as electricity, water, gas, and sewer to identify non-limiting examples.

Additional events for scanning may occur during the construction process to capture accurate, three-dimensional As Built point-cloud information. Point cloud may include an array of points determined from image capture and/or laser scanning or other data collection technique of As Built features. In some examples, captured data may be converted into a 3D model, and saved within a cloud-based data platform.

In some examples other methods of capturing spatially accurate information may include the use of drones and optical scanning techniques which may include high-resolution imagery obtained from multiple viewpoints. Scanning may be performed with light-based methods such as a CCD camera. Other methods may include infrared, ultraviolet, acoustic, and magnetic and electric-field mapping techniques may be utilized.

Structure-related information may include physical features generally associated with an exterior of a Structure such as geolocation, elevation, surrounding trees and large landscaping features, underground utility locations (such as power, water, sewer, sprinkler system, and many other possible underground utility features), paving, and pool or patio areas. Structure-related information may also include features generally related to a Structure such as underground plumbing locations, stud locations, electrical conduit and wiring, vertical plumbing piping, and HVAC systems or other duct work. The acquisition of the data may allow the model system to accurately locate these interior and exterior features. Acquisition of As Built data during different points of the construction completion allows measurements to be taken prior to aspects involved in a measurement process being concealed by concrete, drywall or other various building materials.

Data is acquired that is descriptive of actual physical features as the features are built and converted into a 3D model which may be referred to as the "As Built" model. The As Built model will include key components of the Structure and be provided with a level of artificial intelligence that fully describes the key component. In some embodiments, the As Built model may be compared to a design model. In some implementations, intelligent parameters are associated with key components within the 3D model. For example, key components and associated information may further be associated with intelligent parameters. Intelligent parameters for the key components may include the manufacturer, model number, features, options, operational parameters, whether or not an option is installed (and if so, its features and dimensions), any hardware associated with the key component (and its manufacturer and serial number), an owner's manual, and service contract information, as non-limiting examples. Intelligent parameters associated with a functional key component, such as HVAC Equipment, may include the manufacturer name, model number, capacity, efficiency rating, serial number, warranty start date, motor size, SEER rating, an owner's manual associated with the equipment, and service contract information.

In another aspect, the AVM system can autonomously and/or interactively obtain, store, and process data that is provided to it by Sensors located in, on or proximate to components of the Structure, as the Structure is built, or when additions are made to the Structure. The generation, modeling, capture, use, and retention of data relating to Performances in specific equipment or in some cases, aspects relating to the design of a Structure, may be monitored by the system.

A Structure may be represented by a three-dimensional model, which may be integrated with information related to the key components and laser-scanned location information. This information may be made available to the Structure owner/Structure builder through a computer, an iPad or tablet, or Smart Device. The resulting system may be useful to support virtual maintenance support.

The three-dimensional model may support enhancement to the two-dimensional views that are typical of paper-based drawings. Although three-dimensional renderings are within the scope of information delivered in paper format, a three-dimensional electronic model may render dynamic views from a three-dimensional perspective. In some examples, the viewing may be performed with viewing apparatus that allows for a virtual reality viewing.

In some examples, a viewing apparatus, such as a tablet or a virtual reality headset, may include orienting features that allow a user such as a Structure owner, Structure builder, inspector, engineer, designer or the like to view aspects of a model based upon a location, a direction, a height and an angle of view. A current view may be supplemented with various other information relating to features presented in the view. In some examples, the interface may be accessible through a virtual reality headset, computer, or mobile device (such as an iPad, tablet, or phone), as non-limiting examples. Utilizing a device equipped with an accelerometer, such as a virtual reality headset or mobile device, as non-limiting examples, a viewable section of the model may be displayed through the viewing medium (whether on a screen, or through a viewing lens), where the viewer's perspective changes as the accelerometer equipped device moves, allowing them to change their view of the model. The viewer's Vantage Point may also be adjusted, through a certain user input method, or by physical movement of the user, as non-limiting examples.

The presented view may be supplemented with "hidden information", which may include for example, depictions of features that were scanned before walls were installed. This hidden information may include information about pipes, conduits, ductwork and the like. Locations of beams, headers, studs and building Structure may be depicted. In some examples, depiction in a view may include a superposition of an engineering drawing with a designed location, in other examples images of an actual Structure may be superimposed upon the image based upon As Built scans or other recordations.

In a dynamic sense, display may be used to support viewing of hypothetical conditions such as rerouted utilities, and rebuild walls and other such Structure. In some examples, graphical- or text-based data may be superimposed over an image and be used to indicate specifications, Performance aspects, or other information not related to location, shape and size of features in the image.

As presented above, an image may allow for a user to "see through walls" as the augmented reality viewing device simulates a section of a model associated with a space displayed via the virtual reality viewing device. The viewer's perspective may change as an accelerometer in the virtual reality viewing device moves. A user may also change a view of the AVM to include different layers of data available in the AVM. The viewer's Vantage Point may also be adjusted by moving about a physical space that is represented by the model. To achieve this, it may be possible to incorporate positioning hardware directly into a building represented by the virtual model. The positioning hardware may interface with an augmented reality device for positioning data to accurately determine the viewing device's orientation and location with millimeter precision. The positioning hardware may include, for example, a radio transmitter associated with a reference position and height. Altitude is differentiated from height unless specifically referenced since the relative height is typically more important.

Accordingly, a user may access the AVM on site and hold up a Smart Device, such as an iPad or other tablet, and use the Smart Device to generate a view inside a wall in front of which the Smart Device is positioned, based upon the AVM and the location, height and direction of the Smart Device position.

In some examples, through the use of an augmented reality device, it may also be possible to view data, such as user manuals, etc. of associated devices in the view of a user, simply by looking at them in the viewing interface. In other examples, there may be interactive means to select what information is presented on the view.

Various electronic-based devices implementing of the present invention may also be viewed in a virtual reality environment without accelerometer such as a laptop or personal computer. A viewable section of a model may be displayed on a Graphical User Interface (GUI) and the viewer's Vantage Point may be adjusted, through a user input device.

The ability to track machinery and other components of a system and store the components associated information—such as, for example, user manuals, product specifications, and part numbers—may allow for much more efficient use and maintenance of the components included within a Structure. Additionally, the system model may also maintain Structure owner manuals and warranties and eliminate the need for storage and tracking of hard copy manuals.

In a non-limiting example, a user may access information related to a machinery a Smart Device acting as a Node within it in proximity to the machinery and accessing the parallel model in the Virtual Structure. This access may occur such as by clicking on the machinery in the Virtual Structure model or by scanning the Code label attached to machinery. In some examples, an IoT-accessible machine may have the ability to pair with a user's viewing screen and allow the system model to look up and display various information. Thus, the user may have access to various intelligent parameters associated with that machinery such as service records, a manual, service contract information, warranty information, consumables recommended for use such as detergents, installation-related information, power supply information, and the like.

In some examples, an AVM system may include interfaces of various kinds to components of the system. Sensors and other operational parameter-detection apparatus may provide a routine feedback of information to the model system. Therefore, by processing the data-stream with various algorithms autonomous characterization of operating condition may be made. Therefore, the AVM system may provide a user with alerts when anomalies in system Performance are recognized. In some examples, standard Structure maintenance requirements may be sensed or tracked based on usage and/or time and either notification or in some cases scheduling of a service call may be made. In some examples, the alert may be sent via text, email, or both. The Structure user may, accordingly, log back into the Virtual Structure to indicate completion of a maintenance task. Additionally, if appropriate, a vendor of such service or maintenance may indicate a nature and completion of work performed.

By detecting operational status, a Virtual Structure may take additional autonomous steps to support optimal operation of a system. A Virtual Structure may take steps to order and facilitate shipping of anticipated parts needed for a scheduled maintenance ahead of a scheduled date for a maintenance event (for example, shipping a filter ahead of time so the filter arrives prior to the date it is scheduled to be changed). In another example, a Virtual Structure may recall notes from an Original Equipment Manufacturer (OEM) that could be communicated to a user through the Virtual Structure. In still further examples, a Virtual Structure may support a user involved in a real estate transaction by quantifying service records and Performance of a real Property.

In still another aspect, the AVM may establish a standard maintenance and warranty program based on manufacturers' published data and the system's ability to advise Structure owners of upcoming needs and/or requirements. In other examples, the model system may facilitate allowing for Structure builders, rental companies, or maintenance companies to consolidate information for volume discounts on parts or maintenance items. The model system may also facilitate minimizing unnecessary time expenditure for Structure builders hoping to minimize needless service calls for warranty issues. This may also allow Structure builders and rental companies attempting to sell a Structure or a rental to demonstrate that care has been taken to maintain a Structure.

Benefits derived from monitoring and tracking maintenance with a Virtual Structure may include positively reassuring and educating lenders and/or lien holders that their investment is being properly cared for. In addition, insurance companies may use access to a Virtual Structure to provide factual support that their risk is properly managed. In some examples, a data record in a Virtual Structure model system and how an owner has cared for their Structure may be used by insurance companies or lenders to ensure that good care is being taken. Maintenance records demonstrating defined criteria may allow insurance companies to offer a Structure owner policy discount. Such criteria may include, for example, installation of an alarm system. Additionally, access to a Virtual Structure may allow municipalities and utilities to use the information for accurate metering of utility usage without having to manually check a meter. In the aggregate across multiple Structures, peaks in utility demand may then be more accurately anticipated.

In some examples, a Virtual Structure may also be used to assist with Structure improvement projects of various types. In some examples, the Structure improvement projects may include support for building larger additions and modifications, implementing landscaping projects. Smaller projects may also be assisted, including in a non-limiting example such a project as hanging a picture, which may be made safer and easier with the 3D "as-built" point cloud information. Hidden water piping, electrical conduits, wiring, and the like may be located, or virtually "uncovered", based on the model database.

During construction of a Structure corresponding to a Virtual Structure, discrete features of the As Built Structure may be identified via an identification device such as an IoT device or a QR code label. The ID device may be integrated to the feature or added during the build scope. Performance monitors may also be simultaneously installed to allow monitoring of Key Performance Indicators (KPIs) for selected features. In an example, an HVAC system may be added to a Structure during construction and a simultaneously a Performance monitor may be added to the HVAC system. The Performance monitor may be used to monitor various KPIs for an HVAC system. These KPIs may include outdoor air temperature, discharge air temperature, discharge air volume, electrical current, and the like. Similar monitoring capabilities may be installed to all machinery and utilities systems in a Structure. The combination of these numerous system monitors may allow for a fuller picture of the efficiency of operations of various systems.

Use of the Virtual Structure, which may include data values contributed from communication of data from the various monitoring systems, may allow owners to receive periodic reports, such as in a non-limiting sense monthly emails which may show their current total energy consumption as well as a breakdown of what key components are contributing to the current total energy consumption.

The systems presented herein may be used by owners and Structure managers to make decisions that may improve the cost effectiveness of the system. An additional service for Owners may allow the Structure owner to tap into energy-saving options as their Structure ages. As an example, if a more efficient HVAC system comes on the market, which may include perhaps a new technology Node, the user may receive a "Savings Alert". Such an alert may provide an estimated energy savings of the recommended modification along with an estimate of the cost of the new system. These estimates may be used to generate a report to the owner of an estimated associated return-on-investment or estimated payback period should the Structure owner elect to replace their HVAC system.

In some examples, an AVM of a Virtual Structure may set a threshold value for the required ROI above which they may be interested in receiving such an alert with that ROI is achieved. This information will be based on data derived from actual operating conditions and actual historical usage as well as current industry information. Predictive maintenance and energy savings to key systems via Smart Structure Total Cost of Ownership ("TCO") branded Sensors.

With the ability to collect and utilize relevant Structure information with the model system, the aggregation of data and efficiency experience from numerous systems may allow for analysis of optimization schemes for various devices, machinery and other Structure components that includes real installed location experience. Analysis from the aggregated data may be used to provide feedback to equipment manufacturers, building materials fabricators and such suppliers.

Figure 3A:
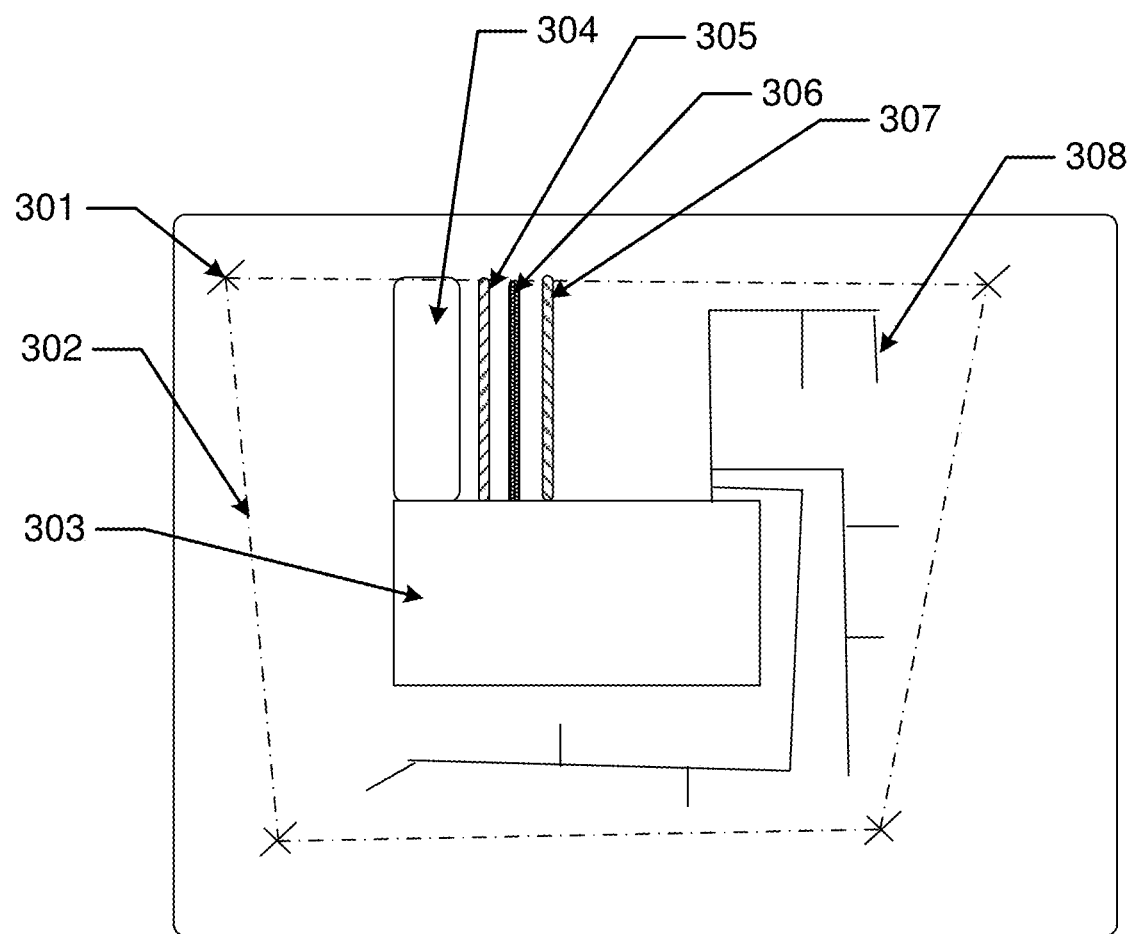
FIGS. 3A-3D illustrate exemplary aspects of collecting and displaying data generated within a Structure.

Referring to FIGS. 3A-3D, an illustration of the collection of data by scanning a Structure during its construction is provided. In FIG. 3A, a depiction of a site for building a Structure is illustrated. The depiction may represent an image that may be seen from above the site. Indications of Property boundaries such as corners 301 and Property borders 302 are represented and may be determined based on site scanning with Property markings from site surveys or may be entered based on global coordinates for the Property lines. An excavated location 303 may be marked out. Roadways, parking and/or loading areas 304 may be located. Buried utilities such as buried telephone 305, buried electric 306, buried water and sewer 307 are located in the model as illustrated. In some examples, such other site service as a buried sprinkler system 308 may also be located.

Figure 3B:
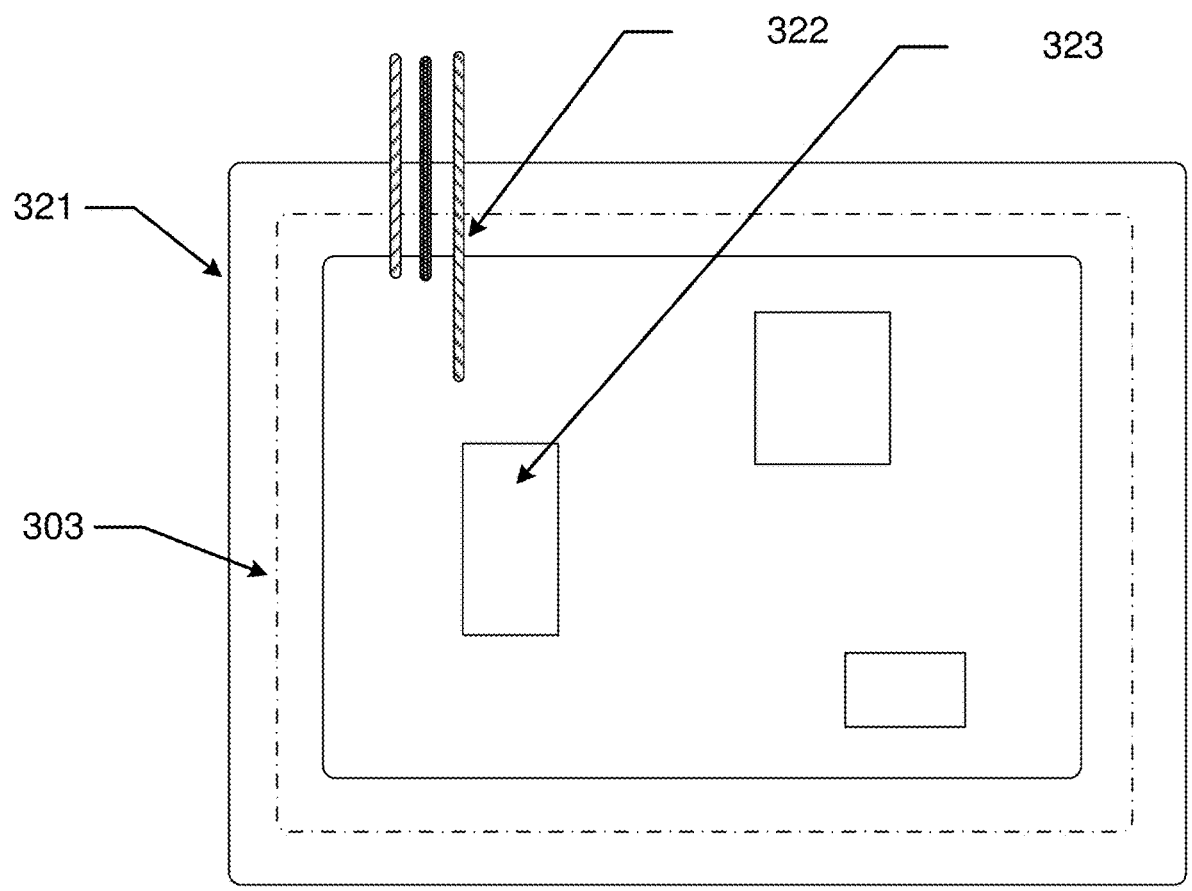

Referring to FIG. 3B, the excavated location 303 may be scanned or imaged to determine the location of foundation elements. In some non-limiting examples, a foundational footing 321 along with buried utilities 322 is illustrated. The buried utilities may include utilities such as electric lines, water supply (whether from a utility or a well on-location), sewer or septic system lines, and telecommunications lines such as telephone, cable and internet. Other footing elements 323 may be located at structural requiring locations as they are built. In some examples, a scanning system may provide the locational orientation relative to site-orientation markings. In other examples, aerial imagery such as may be obtained with a drone may be used to convert features to accurate location imagery.

Figure 3C:
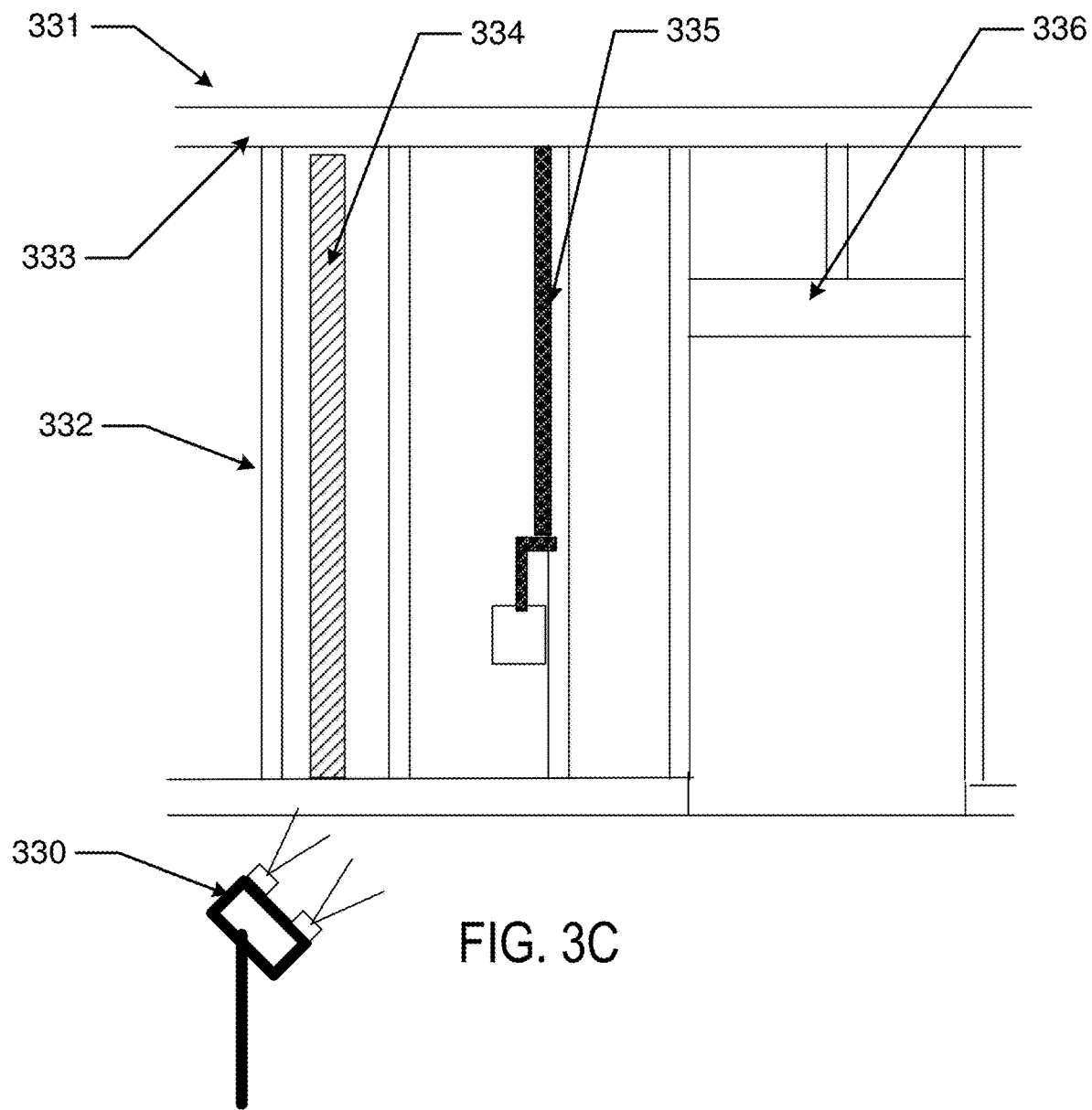

Referring to FIG. 3C, a wall 331 of the Structure in the process of build is illustrated. The Structure may be scanned by a scanning element 330. In some examples, a laser three dimensional Scanner may be used. The wall may have supporting features like top plates 333, headers 336, studs 332, as well as internal items such as pipes 334, electrical conduits, and wires 335. There may be numerous other types of features within walls that may be scanned as they occur such as air ducts, data cables, video cables, telephone cables, and the like.

Figure 3D:
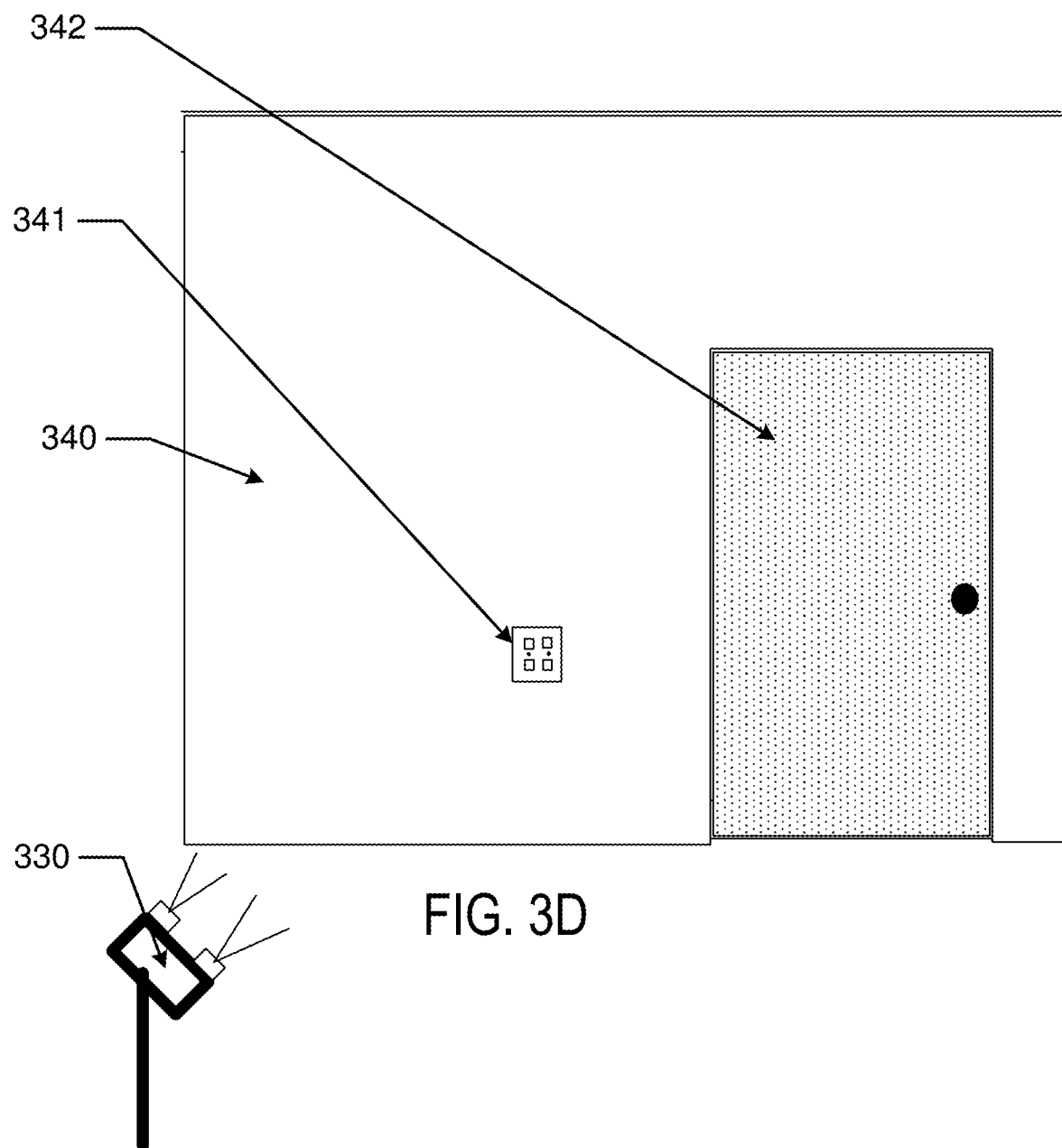

Referring to FIG. 3D, the wall may be completed with Structure components behind wall facing 340 may no longer be visible. Electrical outlets 341 and door Structures 342 may be scanned by a scanning element 330.

Figure 3E:
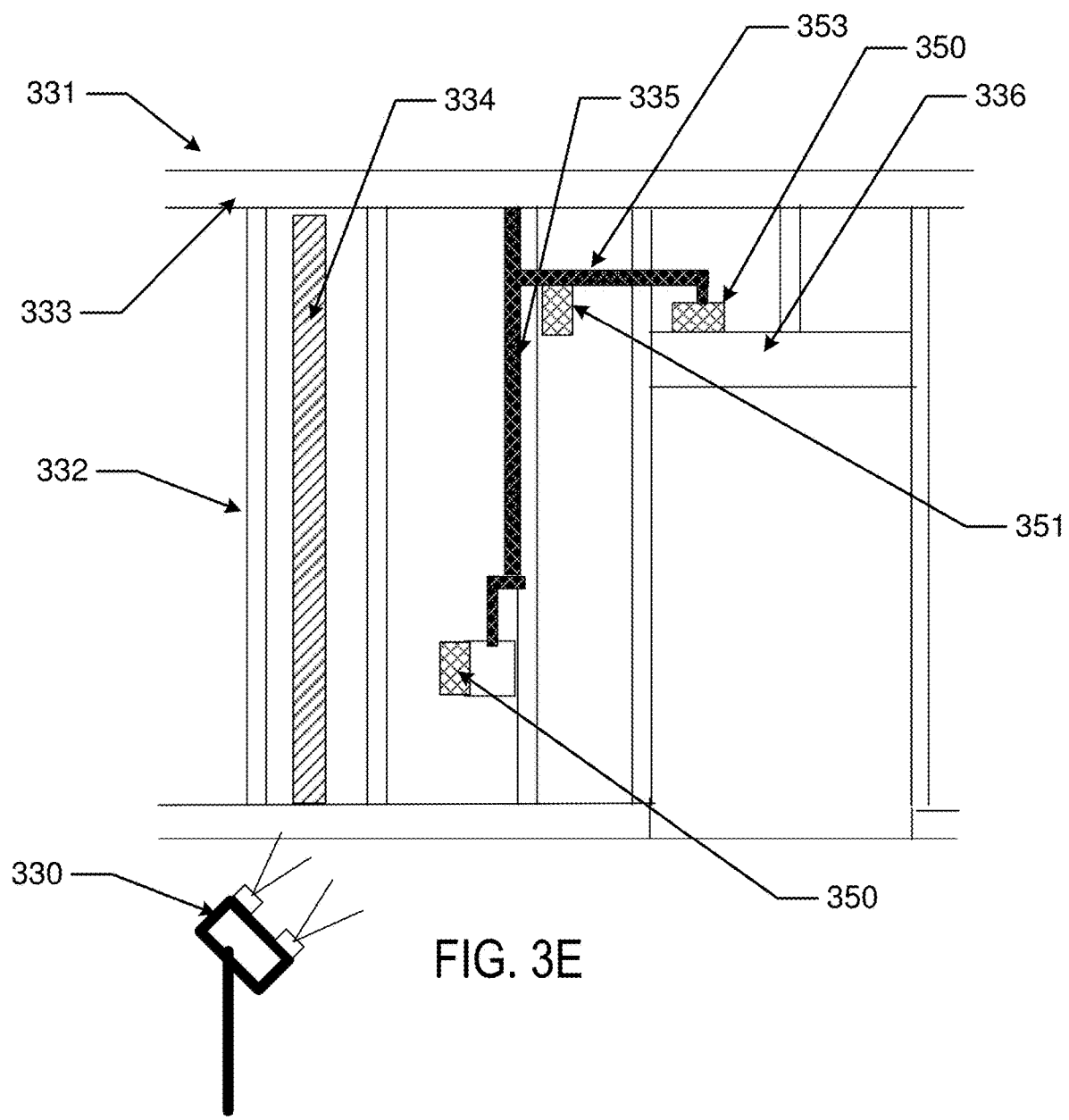
FIG. 3E illustrates the installation of wireless Nodes in a Structure.

Referring to FIG. 3E, a wireless Node may be fixedly attached to a position in or proximate to a Structure. In some embodiments, attachment may be accomplished during construction and/or retrofitting of a structure, in which case the functionality described herein may be made operational to track Agents, materials, equipment, and the like during a construction phase, and also track a location of materials and equipment included in the structure. Nodes may be installed as Reference Point Transceivers or be attached to items that dynamically change positions, such as, by way of non-limiting example one or more of: Agents, building materials, structural components, electrical components, plumbing components, equipment, machines and architectural aspects (e.g., a corner, an arch, an extremity, and the like).

In some non-limiting examples of a wireless Node, a Bluetooth communications hub compatible with a standard such as, for example BLE5.1 (Bluetooth Low Energy 5.1) or Wi-Fi RTT may be fixedly attached to a structural component, such as a door header 366 as Node 350 acting as a Reference Point Transceiver. In another example, a Node 351 may act as a Reference Point Transceiver and be attached to a wall stud, preferentially one that has electrical conduit 335 running along it. In some embodiments, the electrical conduit 335 may supply power to the Node 351. Alternatively, a Node 352 may be configured as part of a receptacle box. In some examples, one or more Nodes 350-351 may be battery powered. One or more Nodes 350-351 may be powered via electrical supply wiring 353 from a nearby power conduit 335 so that the Node 350-351 may be tied into a centrally powered electrical system. Moreover, the Nodes may be adapted to de-power and de-couple from a network based on a power supply status or a power drain change.

Figure 3F:
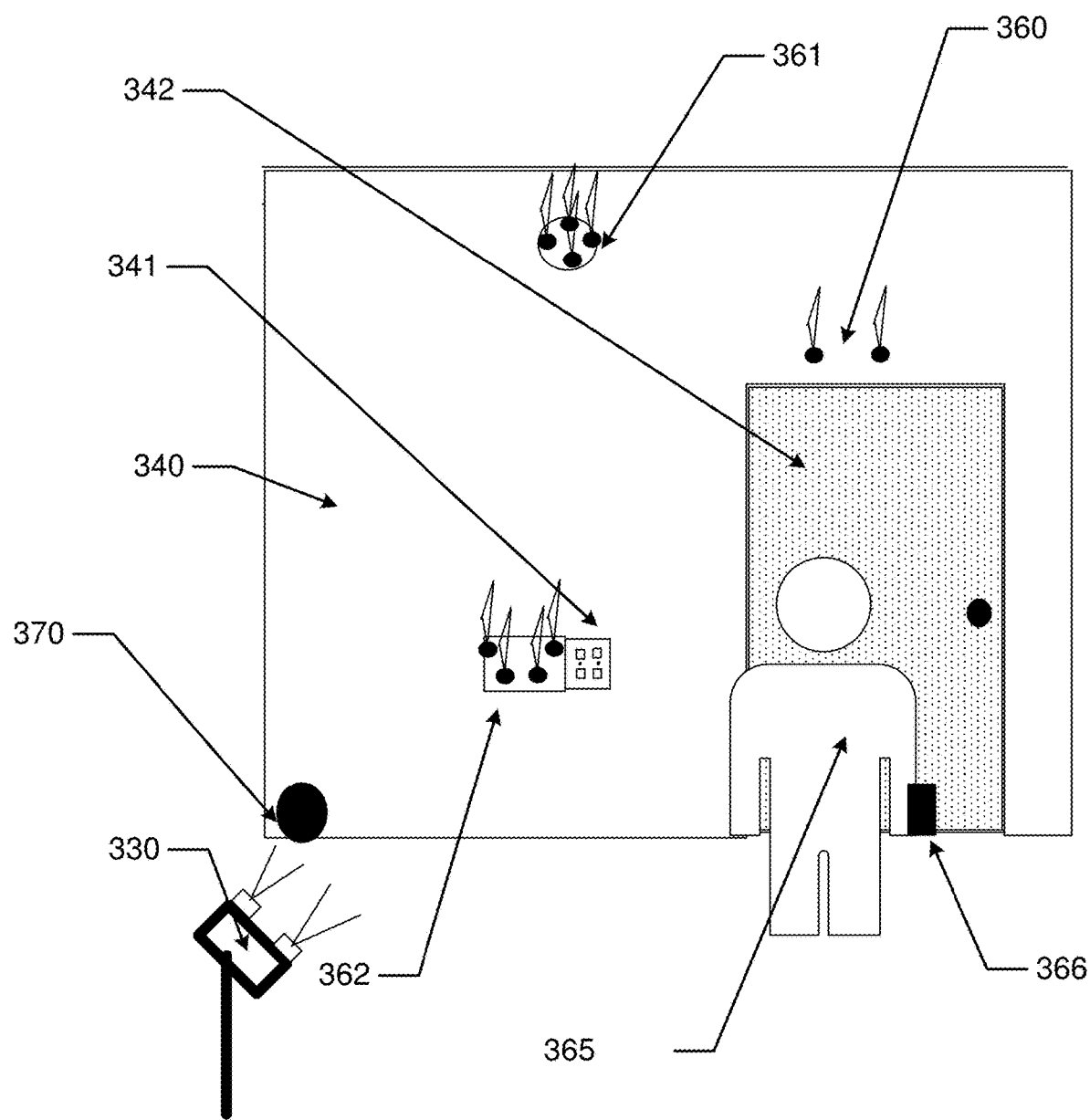
FIG. 3F illustrates an example of deployed wireless Nodes interacting with an Agent in proximity to a door.

FIG. 3F illustrates an exemplary Agent 365 supporting a Smart Device 366 with wireless communications components enabling RF communications such as, one or more of: Cellular, Wi-Fi, Bluetooth, Zigbee, and other wireless capabilities. The Smart Device 366 may also include devices capable of receiving and/or transmitting with infrared capabilities. The Smart Device 366 may also include, or be in logical communication with, transducers capable of emitting sound, and in some examples, infrasound and/or ultrasonic sound, as well as microphones capable of detecting ultrasonic sound and/or infrasound. An Agent 365 may become positioned proximate to a door Structure 342 such that the Agent 365 supported Smart Device 366 may wirelessly communicate with a Node 362 fixedly attached to the Structure 342. The Node 362 may be in electrical communication with one or more of: a set of protruding antennas 360, an antenna array device 361 (which may include a multitude of antennas separated at distances efficient for communication and/or location determination). A wireless Node with antennas 362 may be located proximate to a typical wall outlet Structure. Any of these Nodes 360-362 may communicate with the Smart device for location protocols such as RSSI, Time of Flight, and Angle of Arrival as non-limiting examples. The Nodes 360-362 may have a carefully measured distance characterization for each of the antennas that they employ and one of the antennas involved in wireless communication may be further characterized as being a local or global origin point (0,0,0 in Cartesian notation). In other examples, none of the antenna locations may be located at a local or global origin point, but rather a known offset from a specified origin point 370 may be characterized for each of the hub antenna locations.

The Agent 365 may proceed through a threshold of the door Structure 342 and be located on the other side. Nodes 360-362 may each protrude from both sides of a wall and/or may have a second set of antennas located on a distal side of the wall. In other examples, materials used in wall construction may be configured to provide minimal interference with wireless signals travelling through the wall materials. For configurations with a second set of antennas, as the user passes through the door, a communication between the Smart Device 366 and the Node 360-362 may transfer from antennas protruding on a proximate wall side to antennas protruding on a distal wall side.

A geographic position of a Structure may be calculated via wireless communications, such as those using sub-GHz wavelengths, GPS, or other longer range wavelength a Smart Device from within the Structure. The geographic position may be used to indicate a Structure identification. A position within the Structure may be determined based upon one or more of: an angle of arrival and angle of departure of a wireless signal and one or more timing signals used to determine a distance of the Smart Device from: a) a Node acting as Reference Point Transceiver; or b) a dynamic position Node.

In some embodiments, an angle of departure or an angle of arrival are not necessary and a position may be determined by measuring a distance to three or more positioning reference devices. However, in some embodiments, it may still be useful to compute an angle between the positioning reference devices and/or the Node.

Additional aspects that may be referenced to determine a location of a Node or Smart Device accurately may include one or more of: relative signal strength received from wireless transmissions emanating from another Nodes; time of arrival of radio signals of wireless transmissions emanating from another Node; generating a distance to another Node based upon a time difference of arrival of radio signals of wireless transmissions emanating from another Node; or an angle of arrival and/or angle of departure of a wireless transmission from another Node.

The above steps may be repeated for multiple Nodes of various types, including both reference point transceiver Nodes and dynamic position Nodes.

As mentioned above, in some embodiments, wireless communications may include a quantification of a condition within or proximate to a Structure. The condition may include, for example, one or more of: a vibration measured with an accelerometer; a temperature of at least a portion of the Structure; an electrical current measurement to equipment installed in the Structure, a number of cycles of operation of equipment installed in the Structure; a number of cycles of operation of an machinery installed in the Structure; an electrical current measurement to an electrical device located within the Structure; a vibration or other sensor measurement associated with movement of an Agent or person within the Structure; or presence of water and/or humidity within the Structure.

A vibration pattern may be associated with a specific occupant, and tracking the movement of the specific occupant through the Structure may be based upon measured vibration patterns. Similarly, a vibration pattern may be associated with a particular activity of a specific occupant and the activity of the specific occupant may be tracked within the Structure based upon measured vibration patterns.

Figure 4:
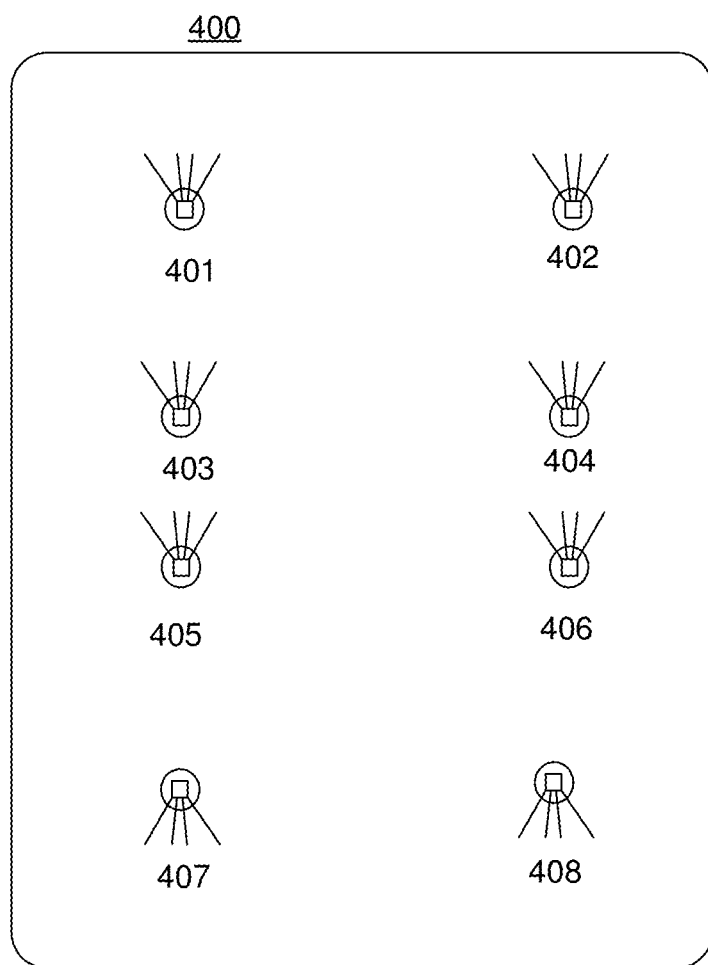
FIG. 4 illustrates a Node with wireless Transceivers useful for location determination and data transceiving.

Referring now to FIG. 4, according to the present invention, an Agent 400 may support a Node with one or more Transceivers. The Transceivers may include one or more of: a Multi-modality Transceiver 401; Transceivers having a same modality 402; Transceivers of different modalities 403; transmitters of a single modality 404; transmitters of multiple modalities 405; receivers of a single modality 406; and receivers of multiple modalities 407. Similarly, a Node deployed as a Reference Point Transceiver may include multiple Transceivers, transmitters, and receivers 401-408. The multiple Transceivers, transmitters, and receivers 401-408 may include one or both of: transmitters and receivers of a same modality; and transmitters and receivers of different modalities.

A modality, as used in conjunction with a Transceiver, transmitter, and/or receiver refers to one or both of a bandwidth of wireless communication and a protocol associated with a bandwidth. By way of non-limiting example, a modality, as used in relation to a Transceiver, transmitter, and/or receiver may include: Wi-Fi; Wi-Fi RTT; Bluetooth; UWB; Ultrasonic; sonic; infrared; or other logical communication medium.

Figure 5:
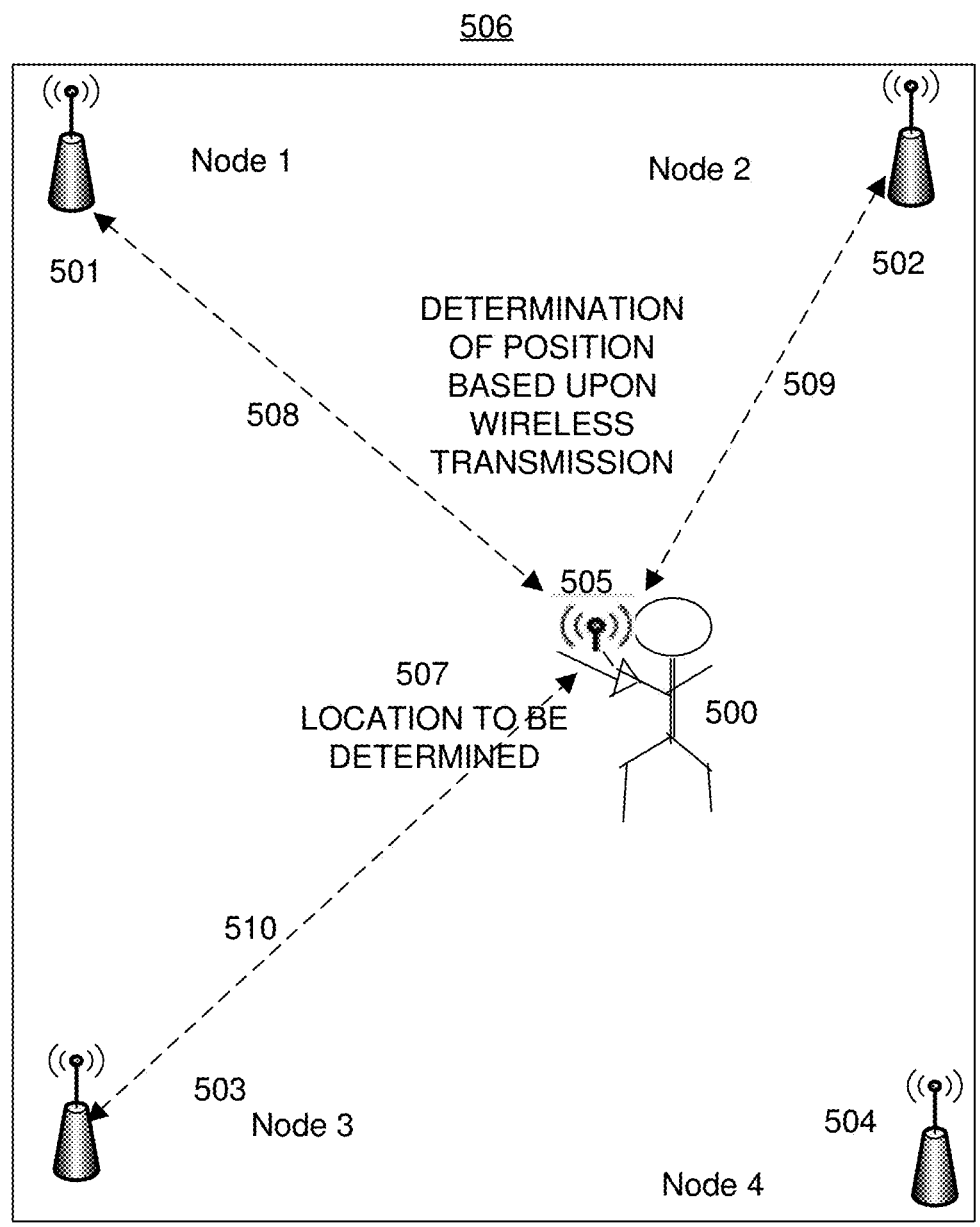
FIG. 5 illustrates Reference Point Transceivers useful for location determination and data transceiving.

FIG. 5 illustrates Nodes with Reference Point Transceivers 501-504 that may be deployed in a defined area 506, such as a Structure to determine a location 507 of an Agent 500 supporting a Node 505. Nodes with Reference Point Transceivers 501-504 may be fixed in a location and wirelessly communicate in a manner suitable for determination a position of the Node Transceiver 505 supported by the Agent 500. Transceiving may be via wireless transmission using one or more bandwidths and communication protocols by a Node Transceiver 505 supported by the Agent 500.

By way of non-limiting example, Node Transceivers 505 supported by the Agent 500 may be included in, or be in logical communication with, a Smart Device, such as a smart phone, tablet or other Agent-supportable device, such as a headgear, ring, watch, wand, pointer with Node Transceivers 505 able to Transceive with the Reference Point Transceivers 501-504. The Reference Point Transceivers 501-504 may include devices, such as, for example, a radio transmitter, radio receiver, a light generator, or an image recognizable device. A radio transmitter may include a router or other Wi-Fi, Bluetooth or other communication device for entering into logical communication with a controller. In some embodiments, Reference Point Transceivers 501-504 may include a Wi-Fi router that additionally provides access to a distributed network, such as the Internet. Cartesian Coordinates, Polar Coordinates, Vector values, a GPS position, or other data that may be utilized for one or more of: locating one or both of an Agent 500; indicating a direction of interest; and identifying a Structure or defined area 506.

A precise location may be determined based upon wireless transmissions between Nodes. Timing determinations—as well as angle of arrival, angle of departure, transmission strength, transmission noise, and transmission interruptions—may be considered in generating relative positions of Nodes. Additional considerations may include AI and unstructured queries of transmissions between Nodes and triangulation logic based upon a measured distance from three or more Reference Point Nodes 501-504. For example, a radio transmission or light emission may be measured and timing associated with the radio transmission or light to determine a distance between Nodes. Distances from three reference position identifiers 501-503 may be used to generate a position of a Node in consideration. Other methodologies include determination of a distance from one or more Nodes and a respective angle of arrival and/or angle of departure of a radio or light transmission between the Node in consideration and another Node (Reference Point Node or dynamic position Node).

Other embodiments may include a device recognizable via image analysis and a camera or other Image Capture Device, such as a CCD device, may capture an image of three or more Reference Point Nodes 501-504. Image analysis may recognize the identification of each of three or more of the Reference Point Transceivers 501-504 and a size ratio of the respective image captured Reference Point Transceivers 501-504 may be utilized to calculate a precise position. Similarly, a height designation may be made via triangulation using the position identifiers as reference to a known height or a reference height.

Triangulation essentially includes determining an intersection of three distances 508-510, each distance 508-510 calculated from a reference point 501-504 to an Agent-supported device 505. The present invention allows for a first distance 508 to be determined based upon a wireless communication in a first modality; and a second distance 509 and a third distance 510 determined based upon a wireless communication in a same or different modality as the first modality. For example, a first distance 508 may be determined based upon a wireless communication using Wi-Fi; a second distance 509 may be determined based upon a wireless communication using Bluetooth; and a third communication may be determined based upon a wireless communication using ultrasonic communication (other combinations of same and/or different communication modalities are also within the scope of the present invention).

Figure 6:
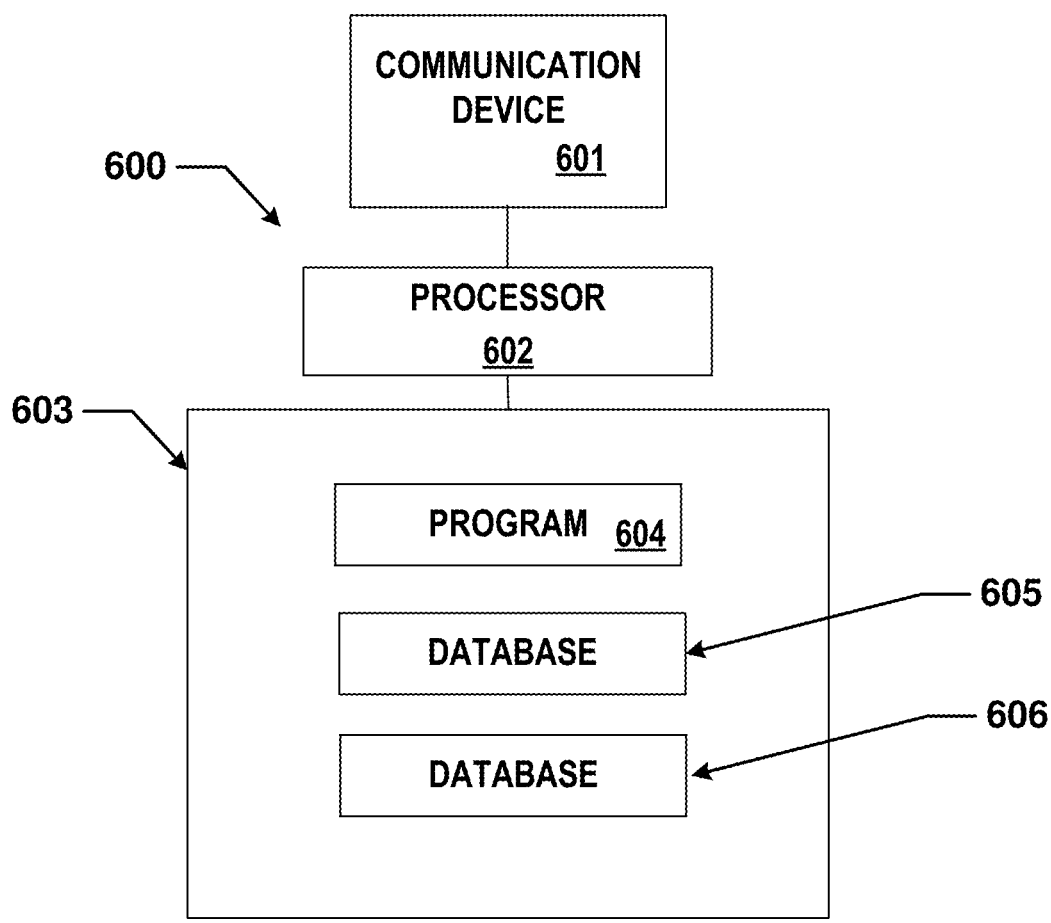
FIG. 6 illustrates apparatus that may be used to implement aspects of the present invention including executable software.

Referring now to FIG. 6, an automated controller is illustrated that may be used to implement various aspects of the present invention in various embodiments, and for various aspects of the present invention. Controller 600 may be included in one or more of: a wireless tablet or handheld smart device, a server, an integrated circuit incorporated into a Node, appliance, equipment item, machinery or other automation. The controller 600 includes a processor unit 602, such as one or more semiconductor based processors, coupled to a communication device 601 configured to communicate via a communication network (not shown in FIG. 6). The communication device 601 may be used to communicate, for example, with one or more online devices, such as a smart device, a Node, personal computer, laptop, or a handheld device.

The processor 602 is also in communication with a storage device 603. The storage device 603 may comprise any appropriate information storage device, including combinations of digital storage devices (e.g., an SSD), optical storage devices, and/or semiconductor memory devices such as Random Access Memory (RAM) devices and Read Only Memory (ROM) devices.

The storage device 603 can store a software program 604 with executable logic for controlling the processor 602. The processor 602 performs instructions of the software program 604, and thereby operates in accordance with the present invention. The processor 602 may also cause the communication device 601 to transmit information, including, in some instances, timing transmissions, digital data and control commands to operate apparatus to implement the processes described above. The storage device 603 can additionally store related data in a database 605 and database 606, as needed.

Figure 6A:
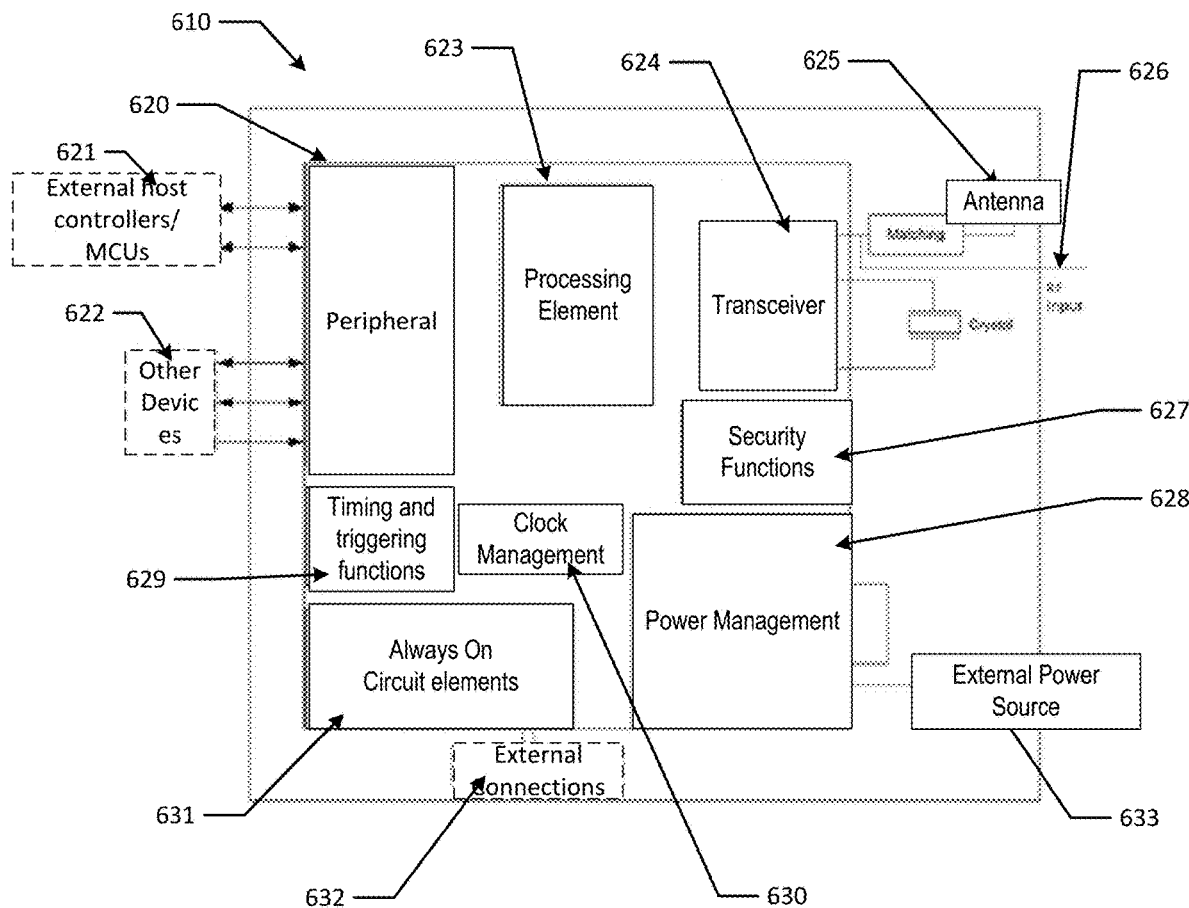
FIG. 6A illustrates an exemplary block diagram of a controller with angle of arrival and angle of departure functionality.

Referring now to FIG. 6A, an illustration of an exemplary wireless Node 610 configured with a transceiver 624 to wirelessly communicate via one or more wireless communication Modalities, including a bandwidth and protocol, such as the Bluetooth 5.1; BLE5.1; Wi-Fi RT and/or GPS standard is illustrated. As discussed, many different Modalities of wireless technology may be utilized with the content presented herein, but a BLE5.1 "radio" module is an interesting example since its standards provide for angle of arrival (AoA) capability as well as angle of departure (AoD) and a distance determination based upon a timing signal. With AoA/AoD a designed antenna array 625 can be used by an RF Transceiver 624 to measure a phase shift amongst multiple antenna elements to estimate distance differences between the antennas and to extract an angle from the antenna array to the source of radiation. A BLE5.1-consistent multichip transceiver 624 may include circuitry and software code to perform the acquisition of data and determine the angle of arrival in some examples. In other examples, a BLE5.1-consistent multichip transceiver 624 may control the acquisition of data from an antenna array while streaming the data to off module processing capabilities. The BLE5.1-consistent Node 610 may contain functional blocks of circuitry for peripheral 620 control. The peripherals may include a connection to external host controllers/MCUs 621. The peripheral 620 control may also interact with peripheral and IoT Sensors and other devices 622.

The BLE5.1-consistent Node 610 may include a processing element 623 which may have its own memory of different types as well as capabilities for encryption of data. The BLE5.1 consistent Node 610 may also have Transceiver 624. This circuitry may include Baseband and RF functions as well as control the AoA functions and the self-verifying array functions. The Bluetooth communications 624 may receive signals through an on-module antenna 625 or an external antenna or array of antennas may provide external RF input 626. The BLE5.1-consistent Node 610 may include functional circuitry blocks for control of Security functions, cryptogenerations, random number generation and the like. The BLE5.1-consistent Node 610 may include functional blocks for power management 628.

The BLE5.1-consistent Node 610 may be operative for quantification of temperature aspects of the Node 610, battery-control functions and power-conversion functions. An external power source 633 may be included to provide electrical energy to a power management unit 628 which, in some examples. may be from a battery unit, or a grid connected power supply source in other examples. The BLE5.1-consistent Node 610 may include functions for control of timing and triggering 629. In a related sense, the BLE5.1-consistent Node 610 may include functions for clock management 630 within the module. The BLE5.1-consistent Node 610 may also include circuit elements that are always-on 631 to allow external connections 632 to interact with the device and perhaps awake it from a dormant state. There may also be other customized and/or generic functions that are included in a BLE5.1-consistent Node 610 and/or multichip module.

Figure 6B:
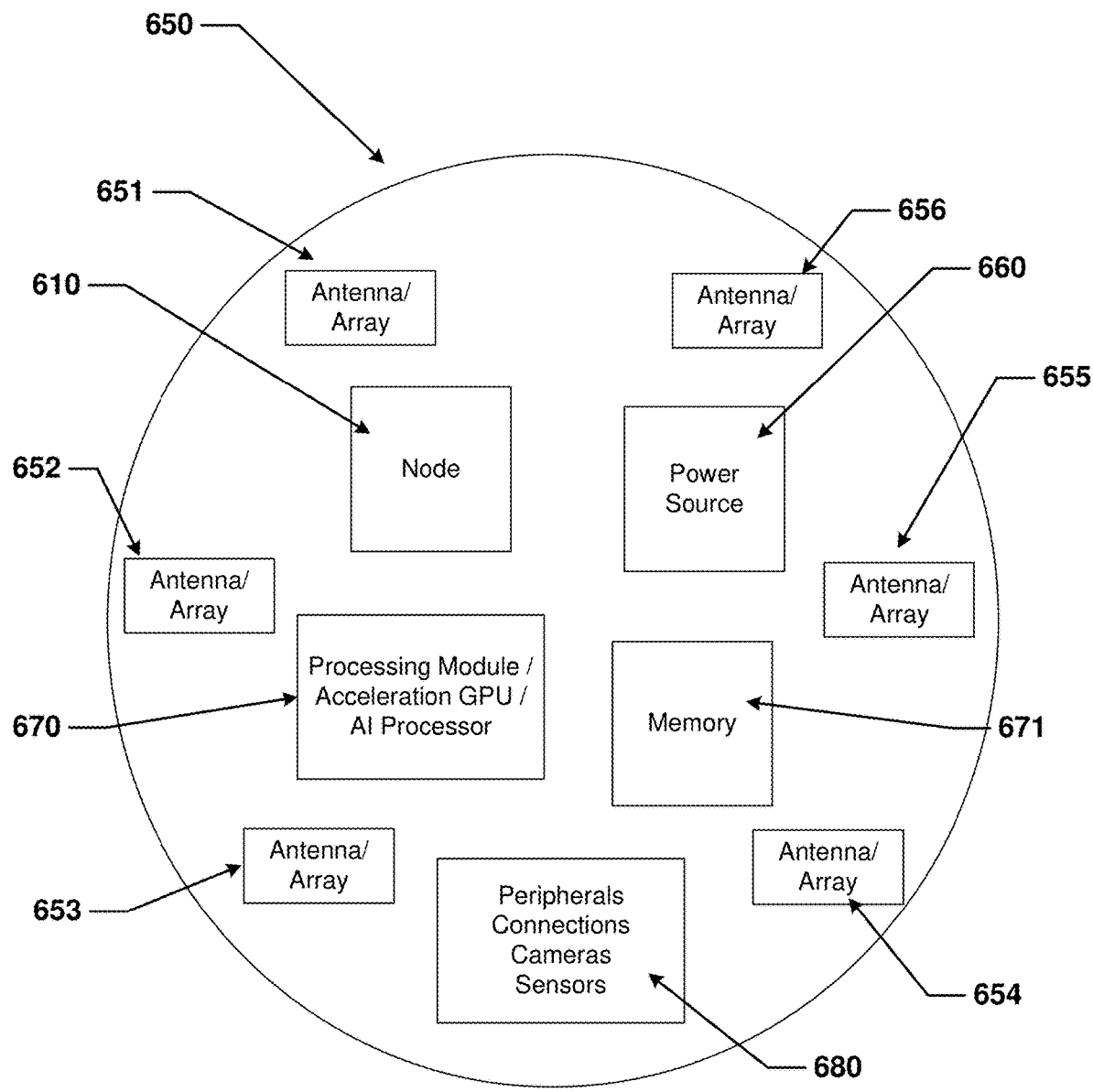
FIG. 6B illustrates exemplary block diagram of an assembly with multiple antenna arrays such as a "puck"

Referring now to FIG. 6B, a Node 610 included in a higher order deployment assembly is illustrated. A deployment Node 650 may be in logical communication with one or more of: sensors, customized control commands, antenna array designs and the like.

A Node 650 may include multiple antennas or antenna arrays 651-656. As described previously, the Node 650 may include a transceiver module 610, and in some examples, the transceiver module may include Bluetooth-adherent aspects. Communications received via an antenna 651-656 may be directly ported into the transceiver module 610. Embodiments may also include routing particular antenna/antenna array outputs to the transceiver module 610 in a controlled and timed sequence. A processing Module 670 may coordinate a connection of the Node 650 to external peripherals.

In some examples, circuitry 680 to logically communicate with one or more of: a Peripheral, a data Connection, Cameras and Sensors controllers, and components to perform data and image acquisition of various kinds, or it may interface external components with the Node 650.

The Node 650 may also include its own power management unit 660 which may take connected power or battery power or both and use it to prove the various power needs of the components of the assembly. The Node 650 may have its own processing modules 670 or collections of different types of processing functions which may have dedicated memory components 671. In some examples, specialized processing chips of various kinds such as Graphical Processing Units and fast mathematics function calculators as well as dedicated artificial intelligence processing chips may be included to allow the Node 650 to perform various computational functions including location determination of wirelessly connected devices amongst other functions. There may be numerous other functions to include in a Node 650 and alternatives types of devices to perform the functions presented herein.

Figure 6C:
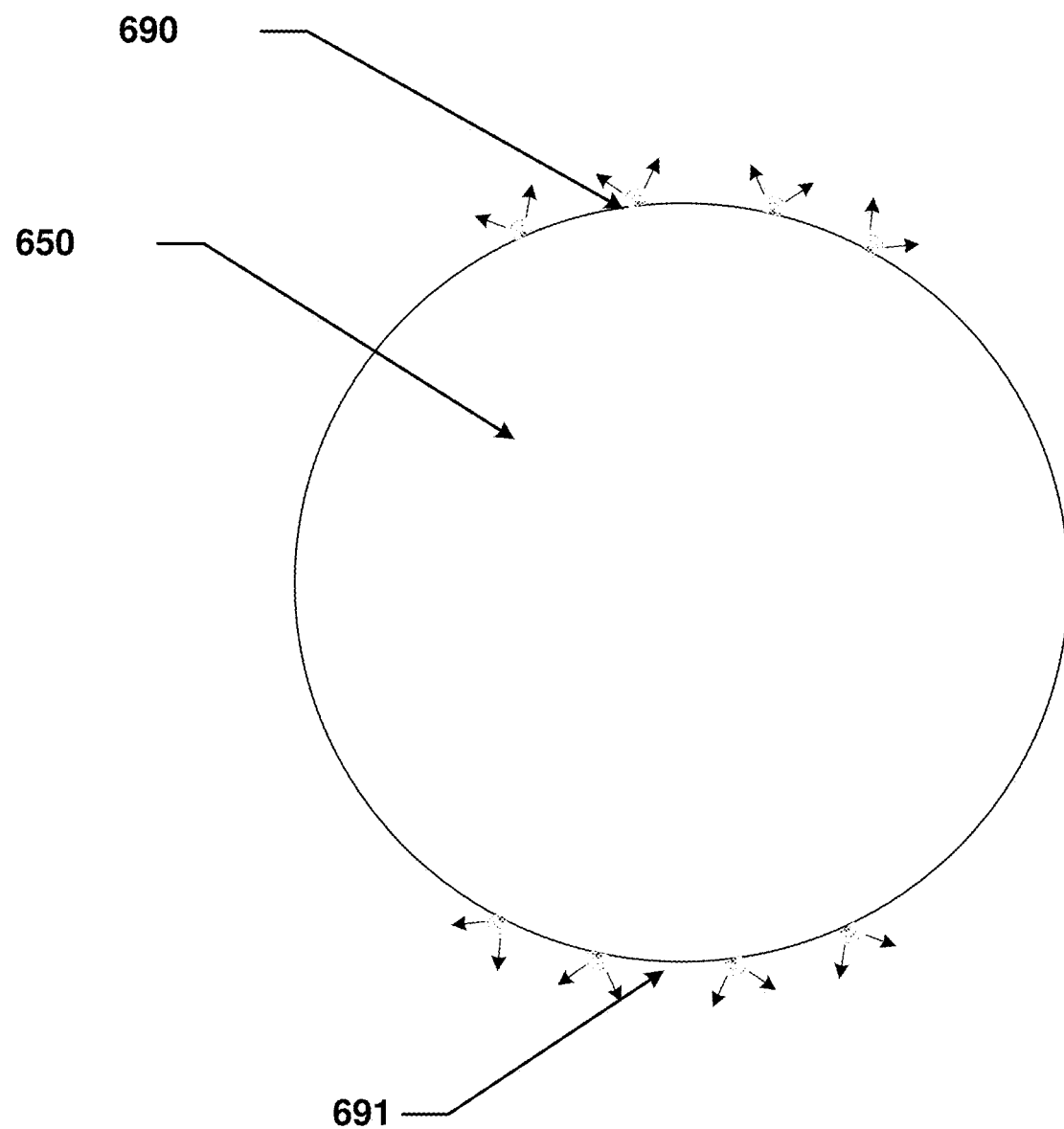
FIG. 6C illustrates another view of a puck with directional antenna arrays.

In some examples as illustrated in FIG. 6C antenna arrays 690, 691 may be assembled into a "Puck" shown as Node 650 wherein the antenna arrays are configured with antenna designs which have directional aspects to them. Directional aspects may mean that the antennas may be sensitive to incident radiation coming from a certain direction but not sensitive to radiation coming from a different direction. Antenna arrays 690, 691 may include antennas that may have maximized signals for a particular incident waveform, the identification of which antenna may provide or supplement angle of incidence calculations.

A directional antenna may include, for example, an antenna with RF shielding over some portion of an antenna's circumference. For example, 270° (or some other subset of a 360° circumference of an antenna), or an antenna array may have RF shielding to block and/or reflect back an RF signal towards the antenna-receiving portion. Other directional antennas may include a shield blocking less than 360° of RF transmissions that rotates around a receiving portion of an antenna and only receives RF communications from a direction of an opening in the shield. Shielded antennas may provide improved determination of a direction from which a wireless transmission is being received from, since RF noise is blocked from a significant portion of a reception sphere.

Figure 7:
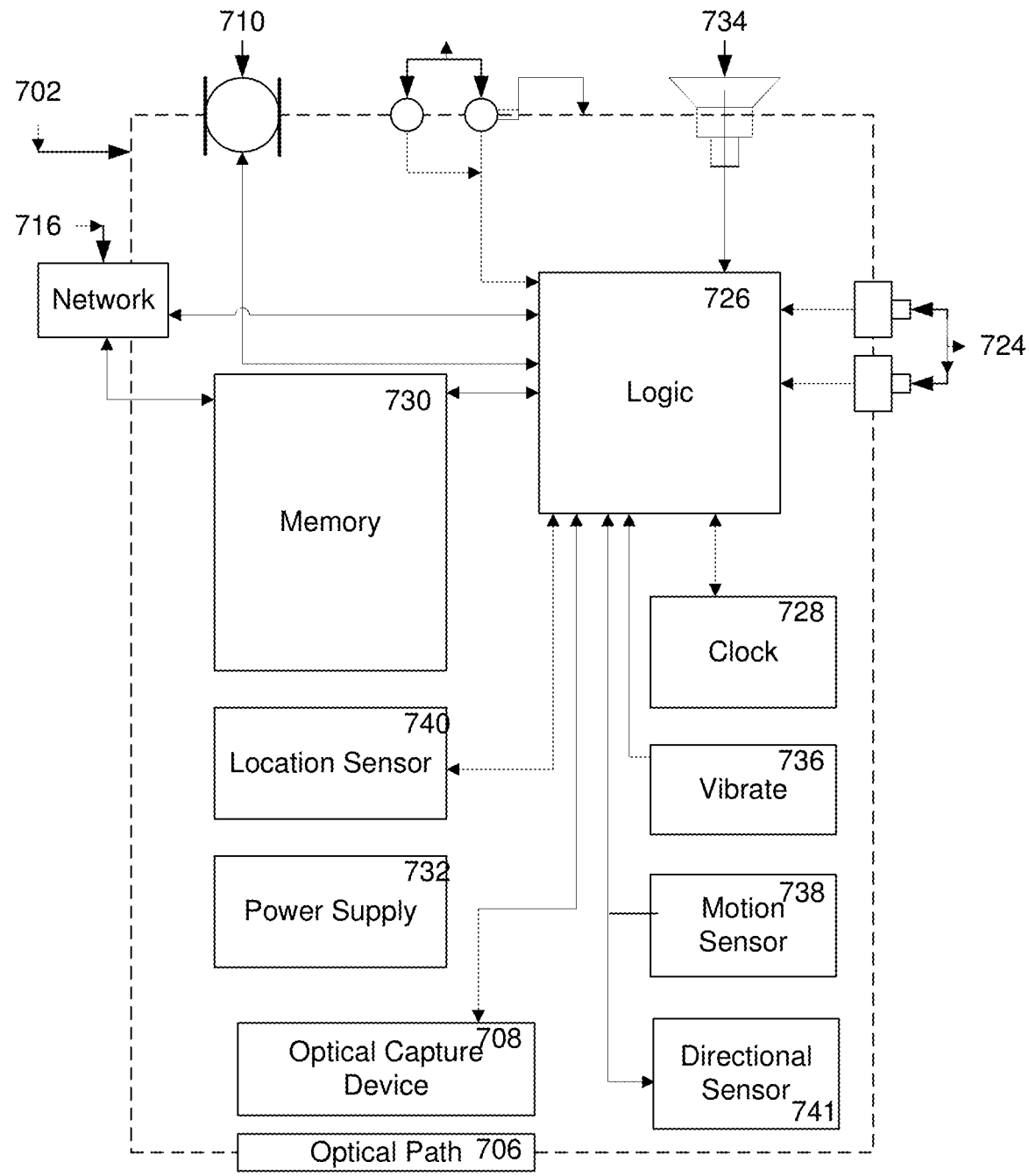
FIG. 7 illustrates an exemplary mobile Smart Device that may be used to implement aspects of the present invention including executable software.

Referring now to FIG. 7, a block diagram of an exemplary mobile device 702 is illustrated. The mobile device 702 comprises an optical capture device 708 to capture an image and convert it to machine-compatible data, and an optical path 706, typically a lens, an aperture or an image conduit to convey the image from the rendered document to the optical capture device 708. The optical capture device 708 may incorporate a CCD, a Complementary Metal Oxide Semiconductor (CMOS) imaging device, or an optical Sensor 724 of another type.

A microphone 710 and associated circuitry may convert the sound of the environment, including spoken words, into machine-compatible signals. Input facilities may exist in the form of buttons, scroll wheels, or other tactile Sensors such as touch-pads. In some embodiments, input facilities may include a touchscreen display.

Visual feedback to the user is possible through a visual display, touchscreen display, or indicator lights. Audible feedback 734 may come from a loudspeaker or other audio transducer. Tactile feedback may come from a vibrate module 736.

A motion Sensor 738 and associated circuitry convert the motion of the mobile device 702 into machine-compatible signals. The motion Sensor 738 may comprise an accelerometer that may be used to sense measurable physical acceleration, orientation, vibration, and other movements. In some embodiments, motion Sensor 738 may include a gyroscope or other device to sense different motions.

A location Sensor 740 and associated circuitry may be used to determine the location of the device. The location Sensor 740 may detect Global Position System (GPS) radio signals from satellites or may also use assisted GPS where the mobile device may use a cellular network to decrease the time necessary to determine location. In some embodiments, the location Sensor 740 may use radio waves to determine the distance from known radio sources such as cellular towers to determine the location of the mobile device 702. In some embodiments these radio signals may be used in addition to GPS.

The mobile device 702 comprises logic 726 to interact with the various other components, possibly processing the received signals into different formats and/or interpretations. Logic 726 may be operable to read and write data and program instructions stored in associated storage or memory 730 such as RAM, ROM, flash, or other suitable memory. It may read a time signal from the clock unit 728. In some embodiments, the mobile device 702 may have an on-board power supply 732. In other embodiments, the mobile device 702 may be powered from a tethered connection to another device, such as a Universal Serial Bus (USB) connection.

The mobile device 702 also includes a network interface 716 to communicate data to a network and/or an associated computing device. Network interface 716 may provide two-way data communication. For example, network interface 716 may operate according to the internet protocol. As another example, network interface 716 may be a local area network (LAN) card allowing a data communication connection to a compatible LAN. As another example, network interface 716 may be a cellular antenna and associated circuitry which may allow the mobile device to communicate over standard wireless data communication networks. In some implementations, network interface 716 may include a Universal Serial Bus (USB) to supply power or transmit data. In some embodiments other wireless links may also be implemented.

As an example of one use of mobile device 702, a reader may scan some coded information from a location marker in a Structure with the mobile device 702. The coded information may be included on apparatus such as a hash code, bar code, RFID or other data storage device. In some embodiments, the scan may include a bit-mapped image via the optical capture device 708. Logic 726 causes the bit-mapped image to be stored in memory 730 with an associated time-stamp read from the clock unit 728. Logic 726 may also perform optical character recognition (OCR) or other post-scan processing on the bit-mapped image to convert it to text. Logic 726 may optionally extract a signature from the image, for example by performing a convolution-like process to locate repeating occurrences of characters, symbols or objects, and determine the distance or number of other characters, symbols, or objects between these repeated elements. The reader may then upload the bit-mapped image (or text or other signature, if post-scan processing has been performed by logic 726) to an associated computer via network interface 716.

As an example of another use of mobile device 702, a reader may capture some text from an article as an audio file by using microphone 710 as an acoustic capture port. Logic 726 causes audio file to be stored in memory 730. Logic 726 may also perform voice recognition or other post-scan processing on the audio file to convert it to text. As above, the reader may then upload the audio file (or text produced by post-scan processing performed by logic 726) to an associated computer via network interface 716.

A directional Sensor 741 may also be incorporated into the mobile device 702. The directional Sensor may be a compass and produce data based upon a magnetic reading or based upon network settings.

Figure 8:
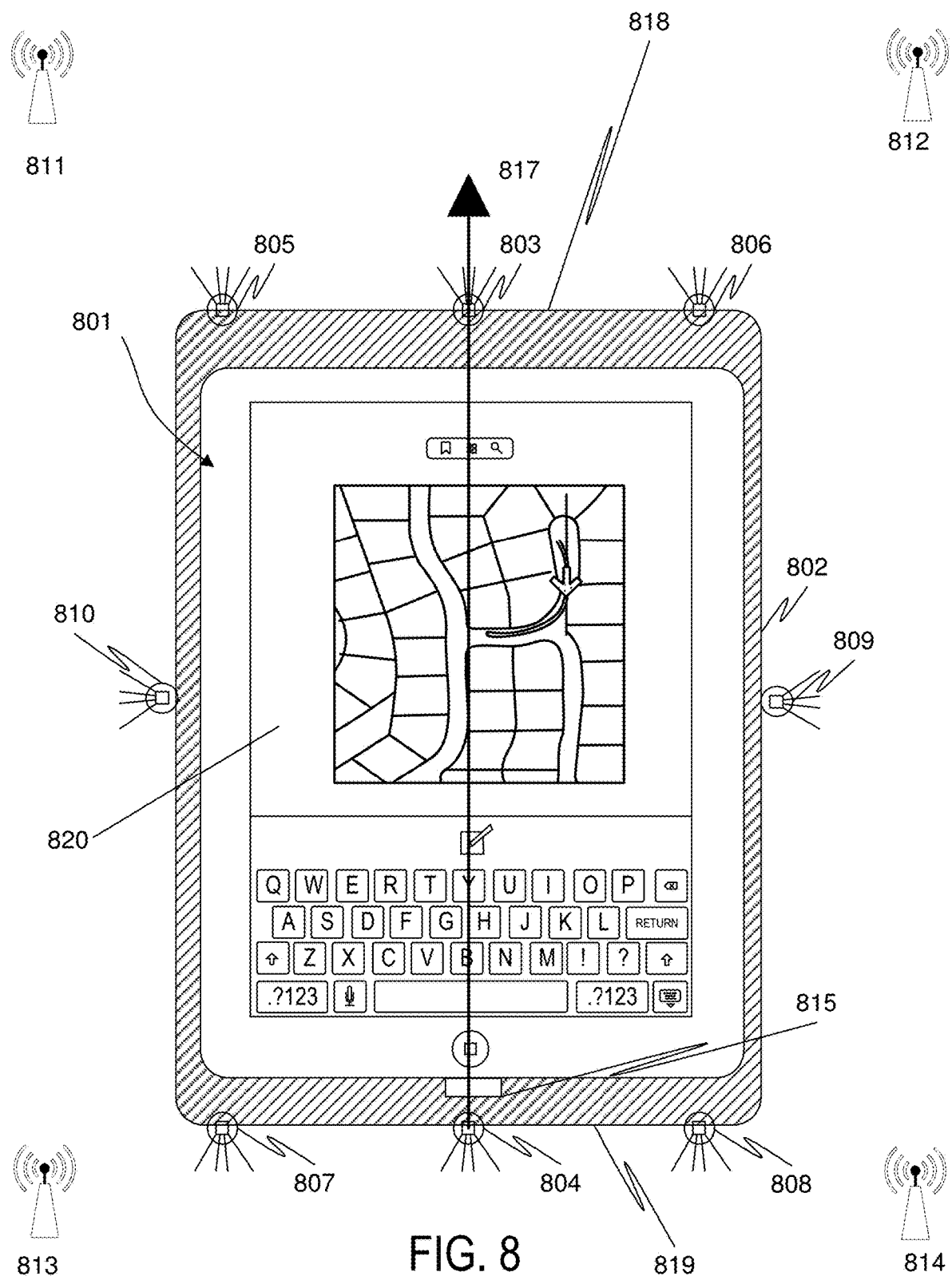
FIGS. 8, 8A-8D illustrate a device and Vectors according to various embodiments of the present invention.

Referring now to FIG. 8, additional apparatus and methods for determining a geospatial location and determination of a direction of interest may include one or both of an enhanced Smart Device and a Smart Device in logical communication with wireless position devices 803-810. The importance of geospatial location and determination of a direction of interest is discussed in considerable detail above. As illustrated, a Smart Device 801 may be in logical communication with one or more wireless position devices 803-810 strategically located in relation to the physical dimensions of the Smart Device. For example, the Smart Device 801 may include a smart phone or tablet device with a user interface surface 820 that is generally planar. The user interface surface 820 will include a forward edge 818 and a trailing edge 819.

In some preferred embodiments, the Smart Device will be fixedly attached to a smart receptacle 802. The smart receptacle 802 may include an appearance of a passive case, such as the type typically used to protect the Smart Device 801 from a damaging impact. However, according to the present invention, the smart receptacle 802 will include digital and/or analog logical components, such as wireless position devices 803-810. The wireless position devices 803-810 include circuitry capable of receiving wireless transmissions from multiple wireless positional reference Transceivers 811-814. The wireless transmissions will include one or both of analog and digital data suitable for calculating a distance from each respective reference point 811-814.

In some embodiments, the smart receptacle 802 will include a connector 815 for creating an electrical path for carrying one or both of electrical power and logic signals between the Smart Device 801 and the smart receptacle 802. For example, the connector 815 may include a mini-USB connector or a lightening connector. Additional embodiments may include an inductive coil arrangement for transferring power.

Embodiments may also include wireless transmitters and receivers to provide logical communication between the wireless position devices 803-810 and the Smart Device 801. Logical communication may be accomplished, for example, via one or more of: Bluetooth, ANT, and infrared media.

Reference Transceivers 811-814 provide wireless transmissions of data that may be received by wireless position devices 803-810. The wireless transmissions are utilized to generate a position of the respective wireless position devices 803-810 in relation to the reference Transceivers 811-814 providing the wireless transmissions to the wireless position devices 803-810. The wireless position devices 803-810 are associated with one or more of: a position in a virtual model; a geographic position; a geospatial position in a defined area, such as Structure; and a geospatial position within a defined area (such as, for example a Property).

According to the present invention, a Smart Device may be placed into a case, such as a smart receptacle 802 that includes two or more wireless position devices 803-810. The wireless position devices 803-810 may include, for example, one or both of: a receiver and a transmitter, in logical communication with an antenna configured to communicate with reference Transceivers 811-814. Communications relevant to location determination may include, for example, one or more of: timing signals; SIM information; received signal strength; GPS data; raw radio measurements; Cell-ID; round trip time of a signal; phase; and angle of received/transmitted signal; time of arrival of a signal; a time difference of arrival; and other data useful in determining a location.

The Nodes 803-810 may be located strategically in the case 802 to provide intuitive direction to a user holding the case 802, and also to provide a most accurate determination of direction. Accordingly, a forward Node 803 may be placed at a top of a Smart Device case and a rearward Node 804 may be placed at a bottom of a Smart Device case 802. Some embodiments each of four corners of a case may include a Node 805, 806, 807, 808. Still other embodiments may include a Node 809 and 810 on each lateral side.

The present invention provides for determination of a location of two or more wireless positioning devices 803-810 and generation of one or more directional Vectors 817 and/or Rays based upon the relative position of the wireless positioning devices 803-810. For the sake of convenience in this specification, discussion of a Vector that does not include specific limitations as to a length of the Vector and is primarily concerned with a direction, a Ray of unlimited length may also be utilized. In some embodiments, multiple directional Vectors 817 are generated and a direction of one or more edges, such as a forward edge, is determined based upon the multiple directional Vectors 817.

According to the present invention, a geospatial location relative to one or more known reference points is generated. The geospatial location in space may be referred to as having an X,Y position indicating a planar designation (e.g., a position on a flat floor), and a Z position (e.g., a level within a Structure, such as a second floor) may be generated based upon indicators of distance from reference points. Indicators of distance may include a comparison of timing signals received from wireless references. A geospatial location may be generated relative to the reference points. In some embodiments, a geospatial location with reference to a larger geographic area is associated with the reference points, however, in many embodiments, the controller will generate a geospatial location relative to the reference point(s) and it is not relevant where the position is located in relation to a greater geospatial area.

In some embodiments, a position of a Smart Device may be ascertained via one or more of: triangulation; trilateration; and multilateration (MLT) techniques.

A geospatial location based upon triangulation may be generated based upon a controller receiving a measurement of angles between the position and known points at either end of a fixed baseline. A point of a geospatial location may be determined based upon generation of a triangle with one known side and two known angles.

A geospatial location based upon trilateration may be generated based upon a controller receiving wireless indicators of distance and geometry of geometric shapes, such as circles, spheres, triangles and the like.

A geospatial location based upon multilateration may be generated based on a controller receiving a measurement of a difference in distance to two reference positions, each reference position being associated with a known location. Wireless signals may be available at one or more of: periodically, within determined timespans, and continually. The determination of the difference in distance between two reference positions provides multiple potential locations at the determined distance. A controller may be used to generate a plot of potential locations. In some embodiments, the potential determinations generally form a curve. Specific embodiments will generate a hyperbolic curve.

The controller may be programmed to execute code to locate an exact position along a generated curve, which is used to generate a geospatial location. The multilateration thereby receives as input multiple measurements of distance to reference points, wherein a second measurement taken to a second set of stations (which may include one station of a first set of stations) is used to generate a second curve. A point of intersection of the first curve and the second curve is used to indicate a specific location.

In combination with, or in place of directional movement of a Smart Device 801 in order to quantify a direction of interest to a user, some embodiments may include an electronic and/or magnetic Directional Indicator that may be aligned by a user in a direction of interest. Alignment may include, for example, pointing a specified side of a device, or pointing an arrow or other symbol displayed upon a user interface on the device towards a direction of interest.

In a similar fashion, triangulation may be utilized to determine a relative elevation of the Smart Device as compared to a reference elevation of the reference points.

It should be noted that although a Smart Device is generally operated by a human user, some embodiments of the present invention include a controller, accelerometer, and data storage medium, Image Capture Device, such as a Charge Coupled Device ("CCD") capture device and/or an infrared capture device being available in a handheld or unmanned vehicle or other Agent.

An unmanned vehicle may include for example, an unmanned aerial vehicle ("UAV") or an unmanned ground vehicle ("UGV"), such as a unit with wheels or tracks for mobility. A radio control unit may be used to transmit control signals to a UAV and/or a UGV. A radio control unit may also receive wireless communications from the unmanned vehicle.

In some embodiments, multiple unmanned vehicles may capture data in a synchronized fashion to add depth to the image capture and/or a three dimensional and 4 dimensional (over time) aspect to the captured data. In some implementations, a UAV position will be contained within a perimeter and the perimeter will have multiple reference points to help each UAV (or other unmanned vehicle) determine a position in relation to static features of a building within which it is operating and also in relation to other unmanned vehicles. Still other aspects include unmanned vehicles that may not only capture data but also function to perform a task, such as paint a wall, drill a hole, cut along a defined path, or other function. As stated throughout this disclosure, the captured data may be incorporated into an AVM.

In still other embodiments, captured data may be compared to a library of stored data using recognition software to ascertain and/or affirm a specific location, elevation, and direction of an image capture location and proper alignment with the virtual model. Still other aspects may include the use of a compass incorporated into a Smart Device.

By way of non-limiting example, functions of the methods and apparatus presented herein may include one or more of the following factors that may be modeled and/or tracked over a defined period of time, such as, for example, an expected life of a build (such as 10 years or 20 years).

Figure 8A:
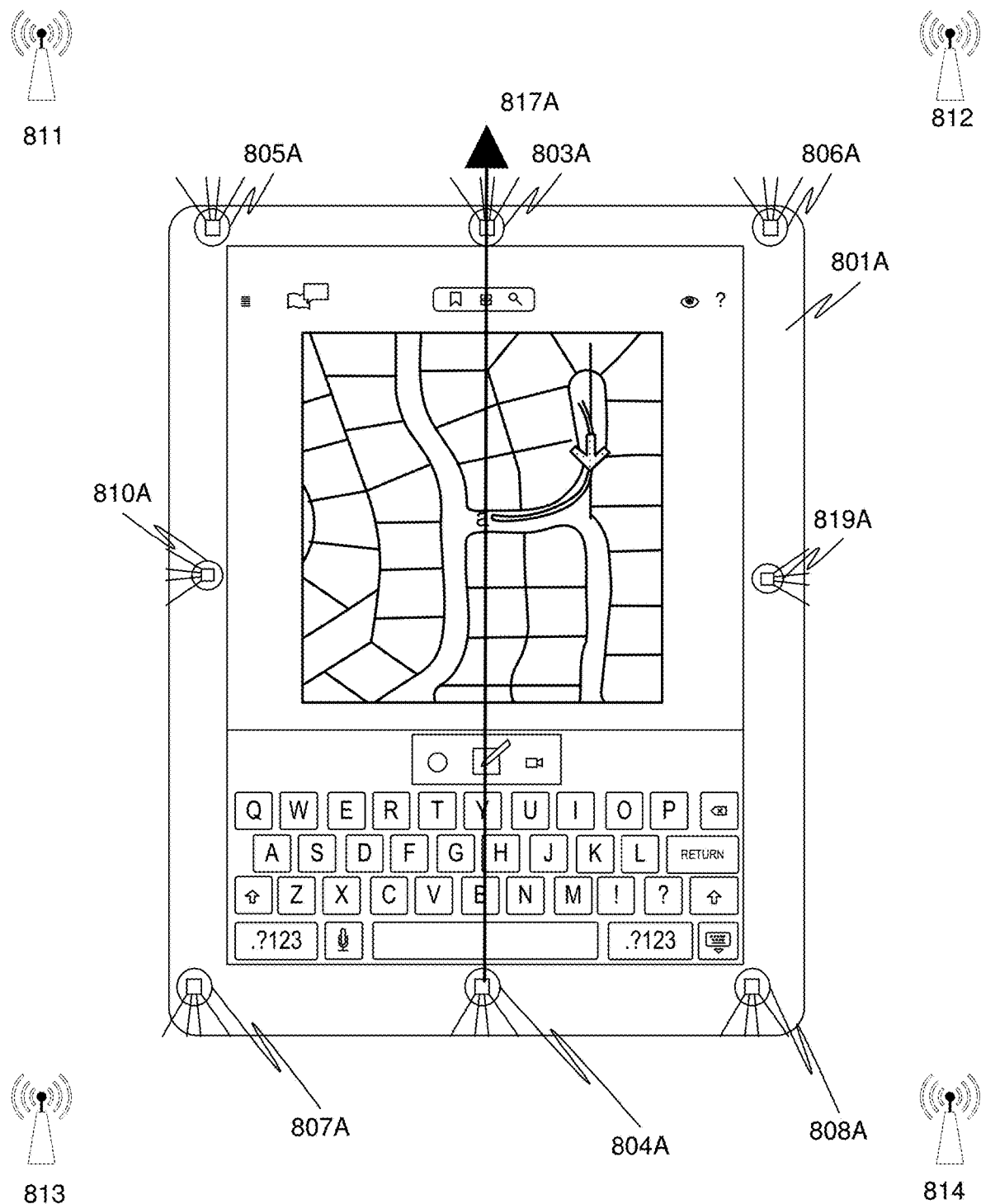

Referring now to FIG. 8A, in some embodiments, Nodes 803A-810A may be incorporated into a Smart Device 801A and not require a smart receptacle to house Nodes 803-810. Nodes 803A-810A that are incorporated into a Smart Device, such as a smart phone or smart tablet, will include internal power and logic connections and therefore not require wireless communication between the controller in the Smart Device 801A and the Nodes 803A-810A.

A Smart Device 801A with integrated Nodes 803-810 and a Smart Device 801 with Nodes 803-810 in a smart receptacle 802 may provide a directional indication, such as a directional Vector 817 817A, without needing to move the Smart Device from a first position to a second position since a directional Vector may be determined from a relative position of a first Nodes 803-810 and a second wireless positional device Nodes 803-810.

In exemplary embodiments, as described herein, the distances may be triangulated based on measurements of Wi-Fi strength at two points. Wi-Fi signal propagates outward as a wave, ideally according to an inverse square law. Ultimately, a crucial feature of the present invention relies on measuring relative distances at two points. In light of the speed of Wi-Fi waves and the real-time computations involved in orienteering; these computations need to be as computationally simple as possible. Thus, depending upon a specific application and mechanism for quantifying a condition, such as a measurement, various coordinate systems may be desirable. In particular, if the Smart Device moves only in a planar direction while the elevation is constant, or only at an angle relative to the ground, the computation is more simple.

One exemplary coordinate system includes a polar coordinate system. One example of a three-dimensional polar coordinate system is a spherical coordinate system. A spherical coordinate system typically comprises three coordinates: a radial coordinate, a polar angle, and an azimuthal angle (r, $\theta$, and $\varphi$, respectively, though $\theta$ and $\varphi$ are occasionally swapped conventionally).

By way of non-limiting example, suppose Point 1 is considered the origin for a spherical coordinate system (i.e., the point (0, 0, 0)). Each Wi-Fi emitter e1, e2, e3 can be described as points (r1, $\theta$1, $\varphi$1), (r2, $\theta$2, $\varphi$2), and (r3, $\theta$3, $\varphi$3), respectively. Each of the re's ($1 \leq i \leq 3$) represent the distance between the Wi-Fi emitter and the Wi-Fi receiver on the Smart Device.

It is understood that in some embodiments, an azimuth may include an angle, such as a horizontal angle determined in an arcuate manner from a reference plane or other base direction line, such as an angle formed between a reference point or reference direction; and line (Ray or Vector) such as a Ray or Vector generated from or continuing to; a Smart Device, or a positional Sensor in logical communication with a Smart Device or other controller. In preferred embodiments the Ray or Vector may be generally directed from a reference point Transceiver towards, and/or intersect one or more of: an item of interest; a point of interest; an architectural aspect (such as a wall, beam, header, corner, arch, doorway, window, etc.); an installed component that may act as a reference in an AVM (such as for example, an electrical outlet, a light fixture, a plumbing fixture, an architectural aspect; an item of equipment; an appliance; a multimedia device, etc.); another reference point Transceiver or other identifiable destination. Embodiments include a position of the Transceiver being determined via use of a polar coordinate system. The polar coordinate system may include a spherical coordinate system or a cylindrical coordinate system.

Accordingly, in some embodiments, spherical coordinate system may include reference point Transceiver that is capable of determining an angle of departure of a location signal and a Transceiver that is capable of determining an angle of arrival of the location signal; one or both of which may be used to facilitate determination of an applicable azimuth.

According to various embodiments of the present invention, one or both of an angle of departure and an angle of arrival may therefore be registered by a Transceiver that is transmitting and/or receiving wireless signals (e.g., radio frequency, Bluetooth 5.1, sonic frequency, or light frequency).

In some embodiments, orienteering occurs in a Structure, in which Transceivers, (including, for example, one or more of: Wi-Fi Transceivers, UWB Transceivers, Bluetooth Transceivers, infrared Transceivers and ultrasonic Transceivers) may be located above and/or below an Agent. In these embodiments, a cylindrical coordinate system may be more appropriate. A cylindrical coordinate system typically comprises three coordinates: a radial coordinate, an angular coordinate, and an elevation (r, θ, and z, respectively). A cylindrical coordinate system may be desirable where, for example, all Wi-Fi emitters have the same elevation.

Figure 8B:
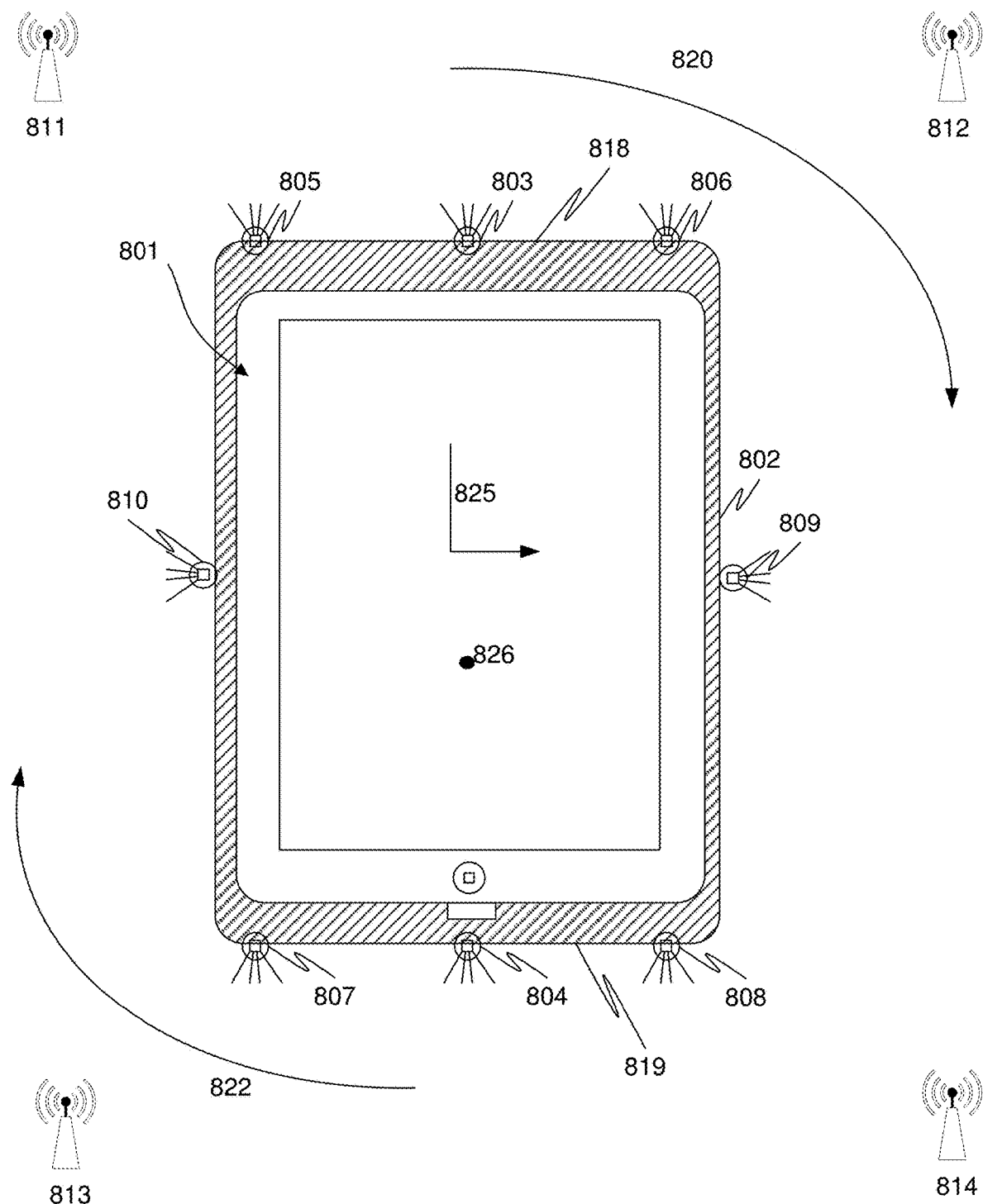

Referring now to FIG. 8B, in some embodiments, one or both of a Smart Device 801 and a smart receptacle 802 may be rotated in a manner (such as, for example in a clockwise or counterclockwise movement 820, 822 relative to a display screen) that repositions one or more Nodes 803-810 from a first position to a second position. A Vector 826 may be generated at an angle that is perpendicular 825 or some other designated angle in relation to the Smart Device 801. In some embodiments, an angle in relation to the Smart Device is perpendicular 825 and thereby viewable via a forward looking camera on the Smart Device.

A user may position the Smart Device 801 such that an object in a direction of interest is within in the camera view. The Smart Device may then be moved to reposition one or more of the Nodes 803-810 from a first position to a second position and thereby capture the direction of interest via a generation of a Vector in the direction of interest.

Figure 8C:
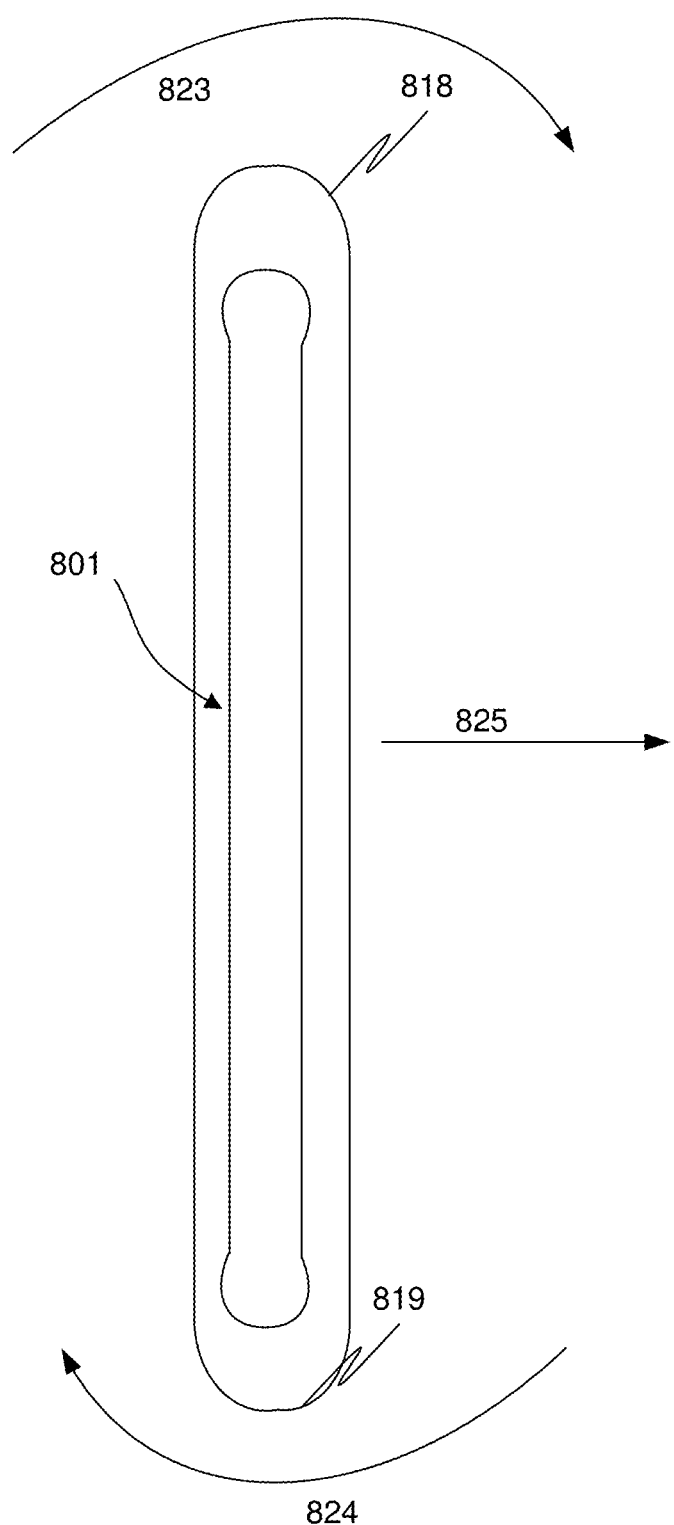

Referring now to FIG. 8C, as illustrated, a Vector 825 indicative of a direction of interest may be based upon a rocking motion 823-824 of the Smart Device 801, such as a movement of an upper edge 818 in a forward arcuate movement 823. The lower edge 819 may also be moved in a complementary arcuate movement 824 or remain stationary. The movement of one or both the upper edge 818-819 also results in movement of one or more Nodes 803-810. The movement of the Nodes 803-810 will be a sufficient distance to register to geospatial positions based upon wireless transmissions. A required distance will be contingent upon a type of wireless transmission referenced to calculate the movement. For example, an infrared beam may require less distance than a Wi-Fi signal, and a Wi-Fi transmission may require less distance than a cell tower transmission which in turn may require less distance than a GPS signal. In some embodiments, as discussed further below, hybrid triangulation may include one or more distances based upon wireless transmissions of different bandwidths or modalities. For example, a first modality may include Wi-Fi transmissions and a second modality may include Bluetooth transmissions, still another modality may include infrared or ultrasonic modalities.

Figure 8D:
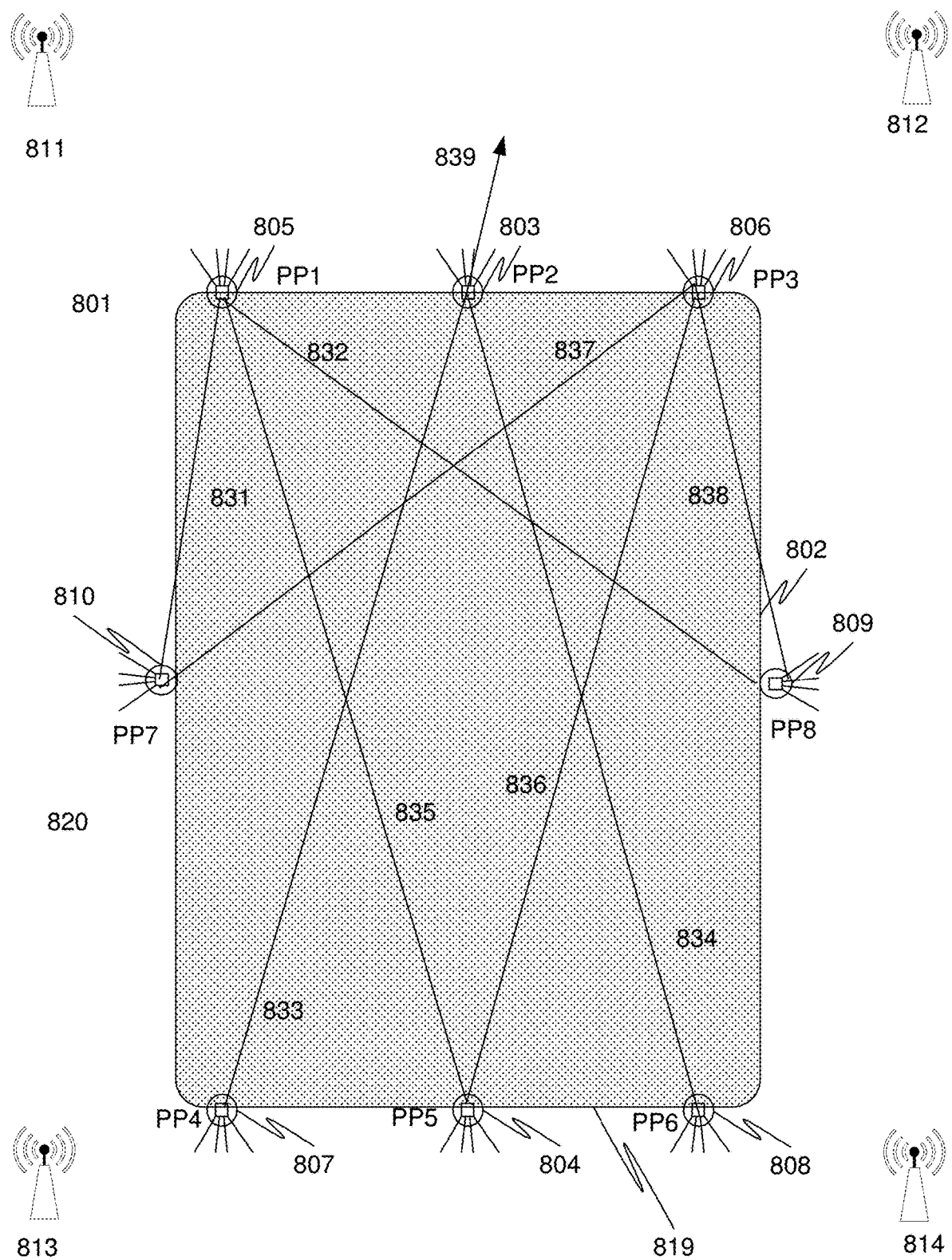

Referring to FIG. 8D, line segments 831-838 are illustrated that intersect various generated position points (PP1-PP8) for Transceivers 803-810. Position points PP1-PP8 may be generated according to the methods and apparatus presented herein, including a mathematical average, median, weighted average, or other calculation of multiple positions determined via triangulation techniques. In addition, a Vector 839 or Ray may be generated based upon one or more of the lines 831-838. In some embodiments, position points may be recorded in high numbers based upon thousands of logical communications per second and a virtual representation of the position points PP1-PP8 may be generated based upon the recorded position points PP1-PP8. Some embodiments may also include a cloud point type representation a device that comprises the Transceivers used to record position point PP1-PP8, wherein the cloud point representation is based upon the multiple positions calculated.

Directional Wireless Modalities

Some modalities, such as those modalities that adhere to the Bluetooth 5.1 or BL5.1 standards, allow a Node to determine an angle of arrival (AoA) or an angle of departure (AoD) for a wireless transmission. An array of antennas may be used to measure aspects of the Bluetooth signaling that may be useful to calculate these AoA and AoD parameters. By calibrating an antenna system, the system may be used to determine angles in one or two dimensions depending on the design of the antenna. The result may be significant improvement in pinpointing the location of origin of a signal.

An array of antennas may be positioned relative to each other and a transmitting transceiver to allow for extraction of an AoA/AoD. Such an array may include a rectangular array; a polar or circular array; a linear array; and a patterned array, where a number of antennas are deployed in a pattern conducive to a particular environment for transceiving. Antennas may be separated by characterized distances from each other, and in some examples, a training protocol for the antenna array results in antenna positioning incorporating superior angle and location precision. Some Nodes may transceive in 2.4-2.482 GHz frequency bands, and thus the RF transmissions may have wavelengths in the roughly 125 mm length scale. A collection of antennas separated by significantly less than the wavelength may function by comparing a phase of RF transmissions arriving at the antennas. An accurate extraction of phase differences can yield a difference in path length that when accumulated can lead to a solution for the angles involved.

Figure 9A:
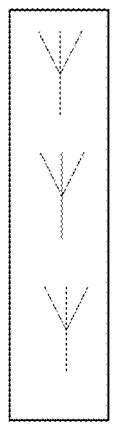
FIGS. 9A-D illustrate exemplary antenna array design examples.
Figure 9B:
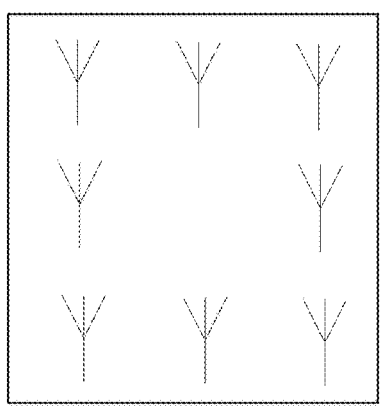
Figure 9C:
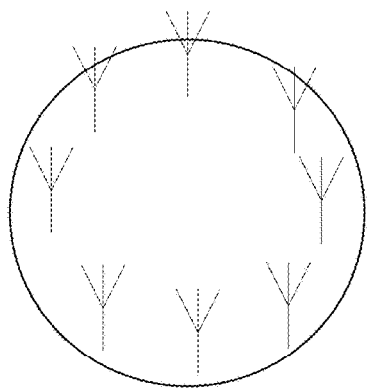
Figure 9D:
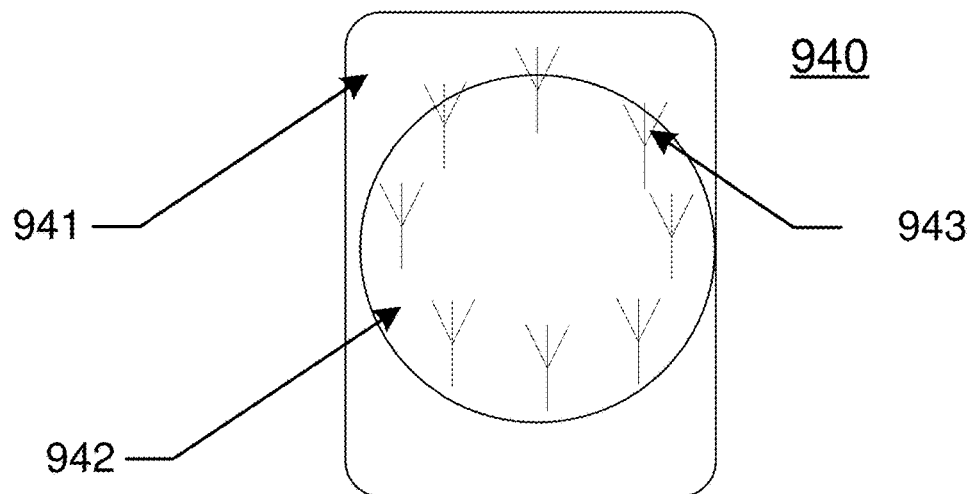

Referring to FIGS. 9A-D a series of exemplary devices employing matrices of antennas for use with Nodes that communicate via a Bluetooth standard, a Wi-Fi standard or other modality, is illustrated. Linear antenna arrays 910 are illustrated in FIG. 9A. Rectangular antenna arrays 920 are illustrated in FIG. 9B. Rectangular antenna arrays 930 are illustrated in FIG. 9C.

Nodes may include antenna arrays combined with batteries and circuitry to form complete self-contained devices. The Nodes or a controller may determine an AoA and/or AoD or other related angular determinations based upon values for variables involved in wireless communications. In an example, a composite device 940 may be formed when a Node 942 with a circular configuration of antenna elements 943 is attached to an exemplary Smart Device 941. The Node 942 attached to the Smart Device 941 may communicate information from and to the Smart Device 941 including calculated results received from or about another Node, such as a Node fixed as a Reference Point Transceiver or a Node with dynamic locations, wherein the wireless communications are conducive to generation of reference angles of transmission and/or receiving.

Figure 10A:
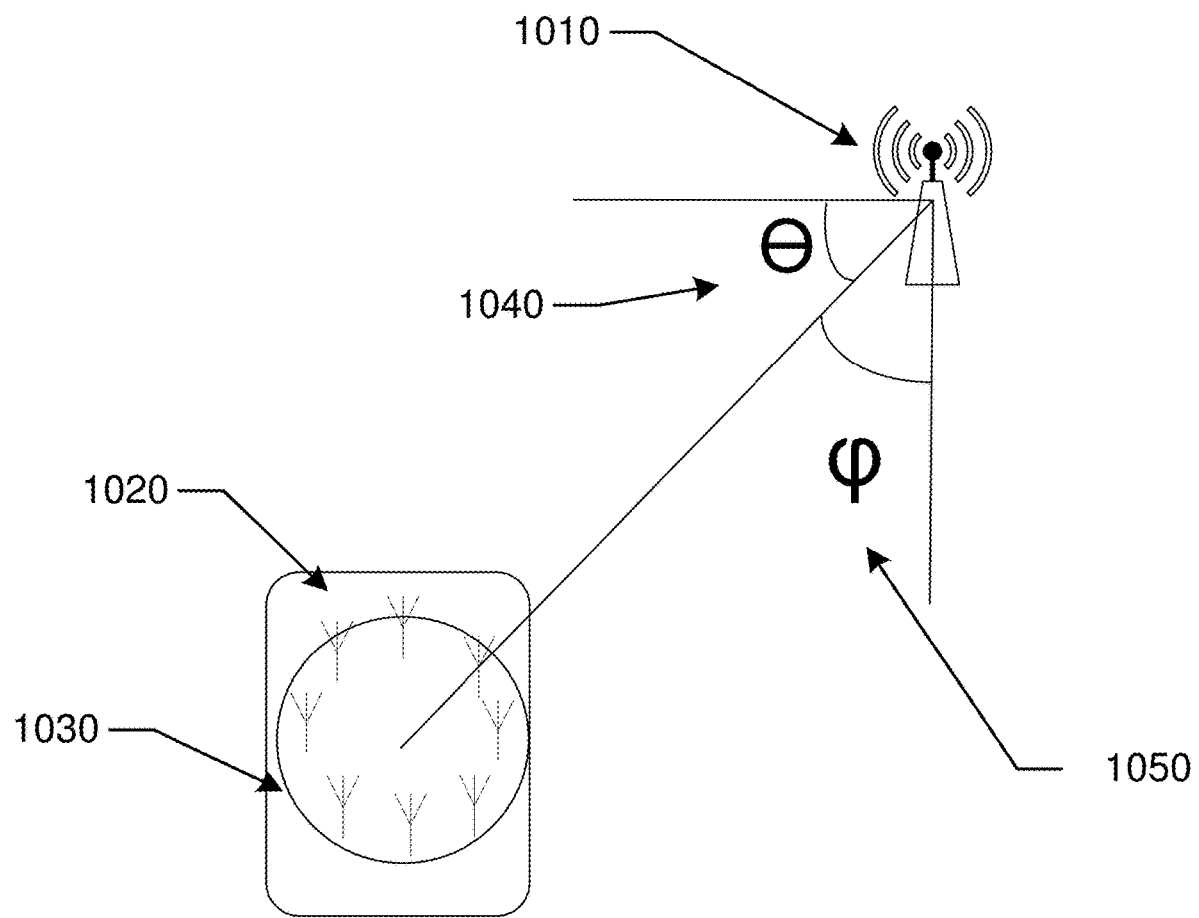
FIGS. 10A-C illustrate location determination with exemplary antenna arrays.

Referring to FIG. 10A, a Smart Device 1020 may be equipped with a Node 1030 that includes a self-contained Bluetooth 5.1 antenna matrix. In the example, the matrix of antennas in the Node 1030 may be configured in a circular pattern. Electronics in the device may capture communication signals sent from a wireless access point 1010. Each of the paths from the wireless access point to the various antennas of the Node 1030 has a slightly different path through air from the wireless access point 1010 to the Smart Device. This may give each of the signals a slightly different phase alignment with each other. The electronics of the Node 1030 may include both hardware and software along, with training history of the antenna array for the device and may be able to use the different phase measurements and training history to determine both an azimuthal angle 1040 and altitude angle 1050 as an example. The resulting direction pinpoints a significantly improved understanding of the location of the Smart Device 1020. In some examples, the calculated result may localize the Smart Device 1020 relative to the wireless access point with an accuracy better than 50 cm. In desirable noise and signal situations, a relative localization accuracy may be as good or better than 50 cm-level accuracy.

Figure 10B:
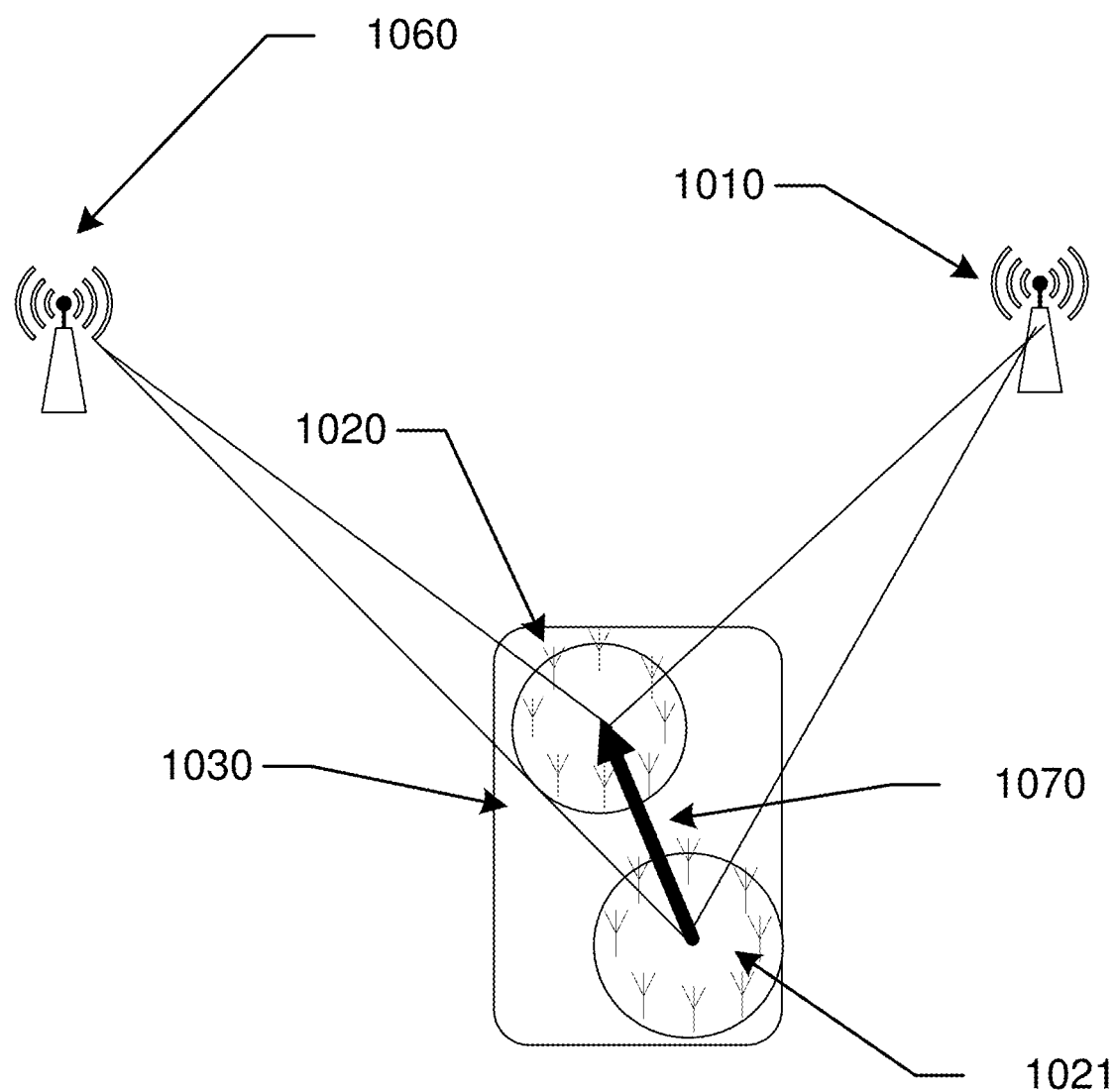

Referring to FIG. 10B, a combination of antenna arrays and electronics to determine the angle of arrival or angle of departure may be placed in proximity to the Smart Device. In some examples, a combination of two or more antenna array devices 1020 and 1021 may be configured to independently sit in a plane proximate to the Smart Device 1030. The antenna arrays may interact with two or more wireless access points 1010 and 1060 which may also be called locators. When the multiple Rays are calculated from each of the locators 1010 and 1060 to each of the antenna array devices 1020 and 1021 a set of positional points for the two antenna array device may result. These positions may again be used to calculate a Ray 1070 of direction between the two points. This Ray may represent the direction that the Smart Device is positioned in at a particular time.

Figure 10C:
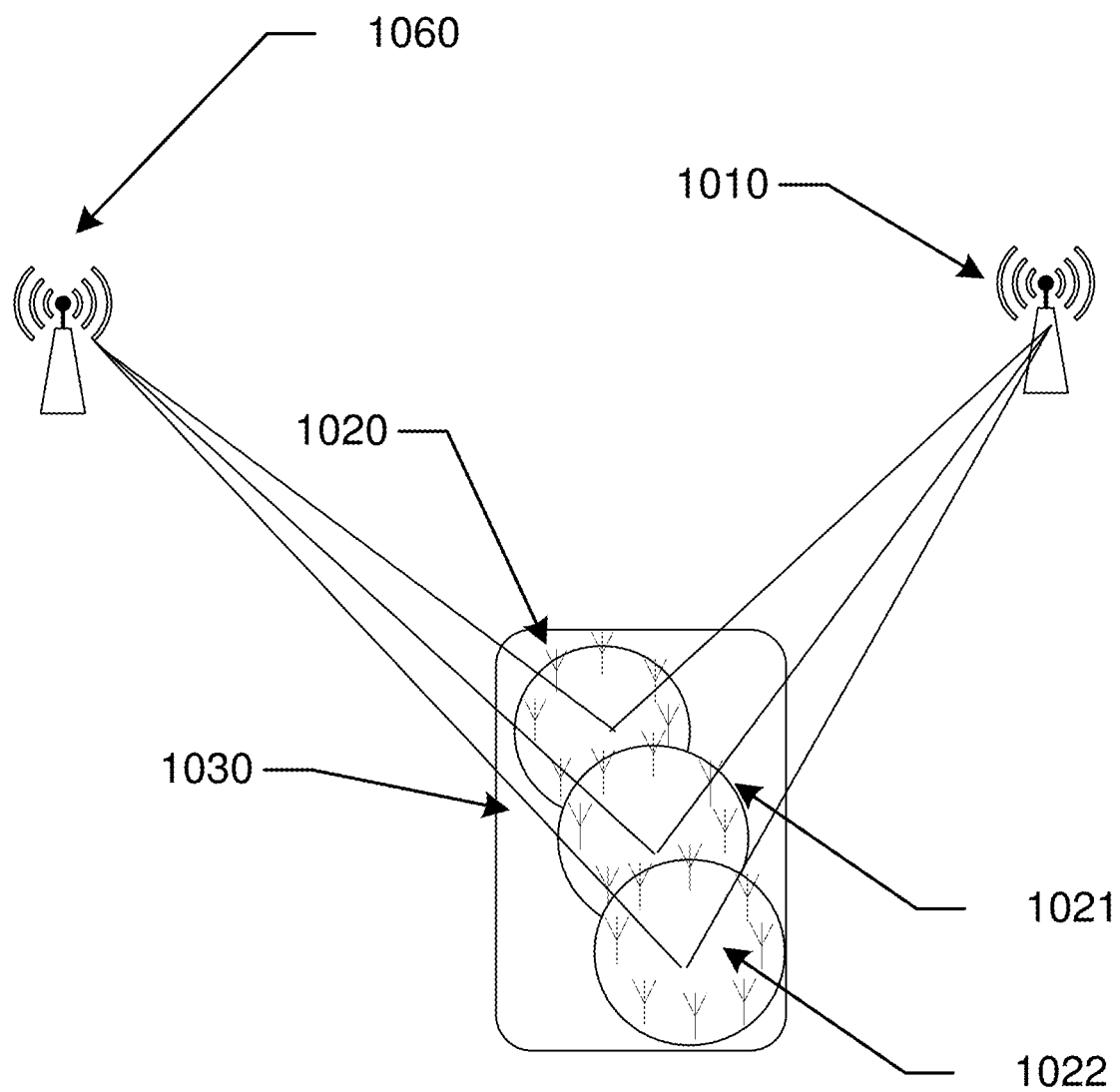

More complex combinations of the arrays of antennas may be configured to increase the signal to noise of the system and improve accuracy. In a non-limiting example, three arrays of antennas 1020, 1021, and 1022, may be found in referencing FIG. 10C. In some examples, the size of the antenna devices may be such that a combination of them may be larger than a Smart Device that they are associated with. In some examples, such as the illustrated example in FIG. 10C, the arrays of antennas may be overlapped in space. The result may physically relate to multiple overlapped regions of the antenna Structure. The resulting interaction of the Structures may be very complex, and training of the algorithms to extract results from the signals received by the complicated Structure may be required to achieve a directional result. The integration of multiple Structures can improve signal-to-noise ratios related to transmission or reception of signals in some examples; however, as the multiple results can be averaged (in some embodiments, a weighted average) to extract a direction of the orientation of the Smart Device.

Referring now to FIG. 11, method steps are illustrated that may be practiced in some embodiments of the present invention. At step 11, a unique identifier is established for each Node to be included in a self-verifying array. The unique identifier may be an alphanumeric string that is unique to available Nodes, a characteristic variable of a signal (e.g., characteristic frequency or wavelength), a public-key encryption scheme, or any similar unique identifier.

At step 12, each Node (Node X) communicates with each other Node (Node X+Y) with which Node X may establish wireless communications.

At step 13, sets of values for variables descriptive of respective wireless communications are generated. Variables may include, for example: which Nodes are involved in a wireless communication (which may be determined for example via a unique Node identifier); timing values related to time of transmission of a data packet; timing values related to a time of arrival of a data packet; an angle of arrival of a wireless transmission; an angle of departure of a wireless transmission; a strength of a received wireless communication; a quality of a received wireless communication; or other variable. Each Node may generate a set of values for the variables for each wireless communication.

At step 14, optionally, each Node may record aspects of a wireless communication that may influence accuracy of one or more values for variables descriptive of respective wireless communications between Nodes. Example of such aspects may include the presence of an obstruction to transmission of wireless communications, a strength of a received transmission (for example a weak strength of a received transmission may indicate a significant distance between the Nodes in communication), and the like.

At step 15, each Node may store sets of values for the variables for respective communications and aspects that may influence accuracy of the sets of values. In some embodiments, this step is optional; a Node may be capable of immediately retransmitting a value for a variable without first storing it. In some embodiments, a Node may perform certain computations relating to the values for the variables, such as taking a weighted average of values received through multiple modalities or Sensors.

At step 16, respective Nodes transmit respective sets of values for the variables for respective communications and aspects that may influence accuracy of the sets of values to any other Node with wireless communication range. In some embodiments, a Node may also transmit the sets of values for the variables for respective communications and aspects that may influence accuracy of the sets of values via hard-wire communication.

At step 17, each Node within communication range receives the transmitted sets of values for the variables and aspects that may influence accuracy of values. By the process of generating sets of values for variables of communications, receiving sets of values of variables for communications, and transmitting the same values, each Node may acquire multiple sets of values relating to itself and to other Nodes, even Nodes that are out of range for direct communication and/or obstructed from direct communication. The multiple sets of values may be used to verify each other. In some embodiments, sets of outlier values may be disregarded.

At step 18, using a controller with a processor and executable software, a position of a particular Node (X) may be generated based upon a composite of sets of values, or a mathematical algorithm involving multiple sets of values. In addition, aspects that may influence the sets of variables may be given mathematical weight in generating a position of Node (X).

At step 19, in some embodiments, a presence of an obstruction may be inferred based upon the multiple sets of values for variables in communication. Still further a position of the perceived obstruction may be generated based upon the same multiple sets of values for variables in communication.

At step 20, a visual representation of a verified location for each Node included in the array may be generated, and in some embodiments, the visual representation may include a position of a perceived obstruction. Each location is verified by sets of values for variables in communications between multiple Nodes. Using this process, a position of a Node may be made available to a Smart Device or another Node that is not within direct communication range and/or is obstructed from direct transmission. Each Node generates values of variables for communication that may be used to determine a particular Node's position relative to other Nodes and/or a base position.

Figure 11A:
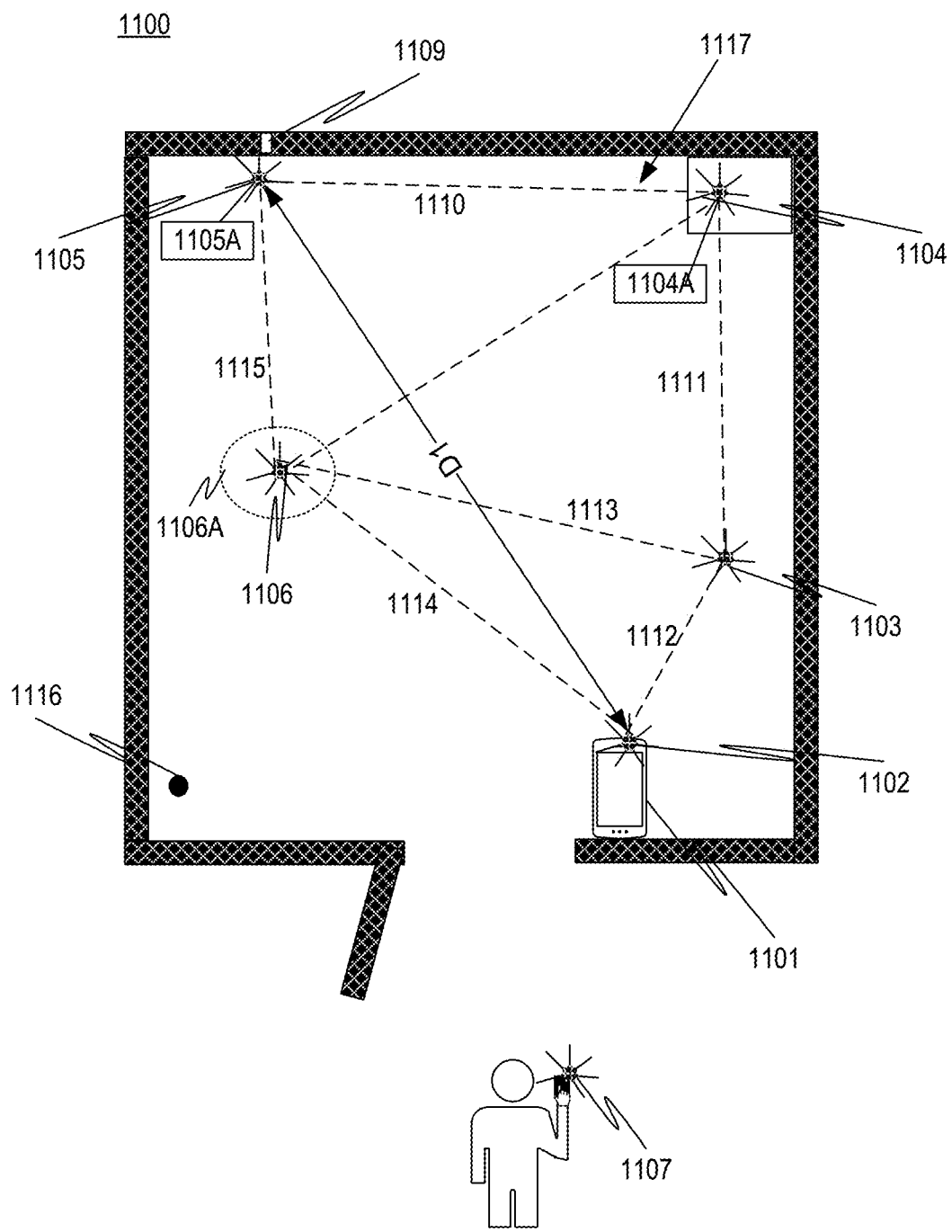
FIG. 11A illustrates a user entering a room with a Smart Device, wherein the room includes various and numerous wireless communicating devices.

Referring now to FIG. 11A, a Structure space 1100 having a multitude of wireless Nodes 1102-1106 is illustrated. Nodes 1102-1106 are shown located within or proximate to Structure space 1100. Nodes 1102-1106 include Transceivers operative to communicate via a wireless modality, such as one or more of: Bluetooth 5.1; BLE5.1; Wi-Fi RTT, infrared, and ultrasonic communications. In some examples, Nodes 1102-1106 include components capable of supporting positioning and data transfer functions useful in establishing a self-verifying array of Nodes (i.e., a SVAN).

Nodes 1102-1106 may establish a self-verifying array 1117 with direct communication paths 1110-1115 between Nodes illustrated by the dashed lines between the Nodes 1102-1106 positioned at disparate locations. Nodes that are within direct communication range are shown forming direct communication connections along the direct communications paths 1110-1115. Communications between Nodes include data useful for determining one or both of: a position relative to each other; and a position of a Node to a base position 1116. Direct communications within the self-verifying array may also provide improved signal to noise ratios. In some embodiments, Sensors may be co-located with one or more Nodes and in logical communication with the Nodes, thus allowing transmission of Sensor data across the Nodes.

According to the present invention, the self-verifying array 1117 enables overall separations of Nodes that are larger than the direct communication range of the individual Nodes 1102-1106. In other words, self-verifying array 1117 may allow a single Node to transmit to locations greater than the Node's own transmission limits using other Nodes in the self-verifying array. For example, Node 1102 and Node 1105 may not be within a direct communication range of each other due to the distance D1 between Node 1102 and Node 1105 exceeding a range supported by a modality of communication used by Node 1102 and Node 1105. However, data generated at Sensor 1105A that is co-located with Node 1105 may be transmitted to Node 1104 and then to Node 1103 and then to Node 1101; alternatively, and/or in addition, data generated at Sensor 1105A may be transmitted to Node 1106 and then to Node 1102, thereby extending the communications range of the modality in use.

In addition to Sensor data, values for variables of communications between various Nodes 1102-1106 may be transmitted amongst each Node 1102-1105, where the values may enable a determination of a relative position of respective Nodes 1102-1105 to each other and/or to a base position 1116. In this manner, a position of any two Nodes 1102-1105 relative to each other and/or to the base position 1116 may be generated. Verification of Node 1102-1105 positions is accomplished via generation of a particular Node 1102-1105 in relation to another Node 1102-1105 and/or a base position 1116 using multiple sets of values of variables involved in disparate communications between disparate Nodes 1102-1105.

In an example, the Structure space 1100 may be considered a Bluetooth arena which is covered by a collection of Nodes 1102-1105 operative to communicate with at least the BLE5.1 standard and thereby form a self-verifying array, such as self-verifying array 1117. In the Structure space 1100, the self-verifying array 1117 may establish a base position 1116 from which positions of the various Nodes 1102-1105 may be represented.

In some examples, the base position 1116 may be a spatially significant feature such as a corner, door threshold, physically marked space, or the like, which is established in a model sense with Nodes 1102-1105 including Bluetooth Transceivers that are fixed within the space 1100. In other examples, the base position 1116 may be established at one of the stationary Node 1102-1105 locations.

Referring again to FIG. 11A, one exemplary Node (such as Smart Device Node 1102) may include an Agent-supported Smart Device. The Smart Device Node 1102 may be located at a fixed position and may serve as the base position. In some examples, the Smart Device may be a pad or touch screen which is mounted to a wall position, or it may be a Kiosk-type device also located in a fixed position.

In other examples, a fixed Node 1103 may be located within the Structure space 1100 such as at a ceiling-mounted position. Here too, this Node 1103 may be established as the base position for Nodes 1102, 1104-1105 across the network. In other examples, a base position 1116 may be at a location offset from a physical, spatially significant architectural feature such as a corner of a Structure or a doorway.

An Agent supporting a Smart Device 1107 with a Bluetooth transmitter may enter the Structure space 1100 containing the self-verifying array 1117 and act as a Node in the self-verifying array. The various positioning capabilities of the various Nodes 1102-1105 in the space 1100 may activate to provide location-positioning data to the Agent-supported Smart Device 1107. In some examples, a base position unit is swapped to the Agent-supported Smart Device 1107, in which case, all positions may be dynamically updated relative to the Agent-supported Smart device 1107. In some examples, multiple (and in some cases temporary) additional coordinate systems may be established in addition to a base definition of coordinate system which may have a fixed base unit. Exemplary coordinate designations may include Cartesian Coordinates, Polar Coordinates, Spherical Coordinates, and Cylindrical Coordinates, wherein Bluetooth-type designations of AoD and/or AoA and radius may be represented as coordinates in a Polar, Spherical, or Cylindrical Coordinate system.

There may be Nodes 1104 that are located upon equipment or appliances 1104A, and may therefore be stationary in most cases. The Node 1104 co-located with the appliance 1104A may be powered by the appliance power supply and also have battery-backup aspects. In the example illustrated, the Node 1104 on the appliance 1104A may be classified as the base unit. However, as illustrated, it may be located at a remote position from a doorway to the space. Thus, the use of a self-verifying array may allow for a remote Smart Device 1107 to be an active Node in the space 100.

There may be Nodes 1105 that are located on wall buttons or in wall-positioned devices. Here too, such a device may be defined as the base position unit. Such a device may be battery-powered and may require means of battery replacement or charging. In some examples, the Node 1105 may have a connection to utility power 1109 and or data conduit. The use of self-verifying array may allow for a User device (not shown) to be tied into a network that connects to the self-verifying array 1117 that covers the bulk of the area of the Structure space 100.

In some examples, a region 1106A of the Structure space 1101 may be generally devoid of coverage to the self-verifying array 1117. In designing the communications environment of the space 1100, therefore, a Node 1106 with a Bluetooth transmitter may be fixedly located to a ceiling, support pole, or other Structure feature in a region 1106A that is otherwise devoid of communications coverage.

A visual representation of a self-verifying array may include some or all of the Nodes include in the array and, in some embodiments, it will include a representation of a perceived obstruction based upon the values for communication variables. Some embodiments of a visual representation may have one or both of layers of spatial grid definition and polar coordinate definition. In a base layer, a coordinate system for the Structure space may be established using a fixed device as a base unit. The origin of this first layer's coordinate system may be established as a zero point in numerous coordinate system types such as cartesian, polar, cylindrical, spherical or other topographical coordinate models.

In some examples, an overlay second layer may include a coordinate system which is spatially similar to the self-verifying array, where for example, each connection of three devices may create a regional coordinate system, and the Structure space 1100 is represented as a mosaic of local coordinate systems within self-verifying-array-defined spaces. In some other examples, an overlay third or more layer may be a dynamic coordinate system where a specific communication Node, which is mobile, is dynamically tracked as the coordinate system origin and the rest of the space is adjusted relative to the moving origin.

Various embodiments may include schemes and layers of coordinate system definitions that become defined for a composite of self-verifying array Nodes 1102-1105. In some examples, one or more of the coordinate layers may be defined, tracked, and communicated by a single network member defined as a base position unit. In other examples, a SVAN may distribute coordinate definition and communication to Nodes 1102-1105 dynamically. A routine update of calculated and measured position and coordinate system may be maintained that not only defines a coordinate system but also indicates where some or all self-verifying array connected Nodes 1102-1105 are located on a grid system. A routine update at a schedule of time may therefore track Nodes 1102-1105 that are moving in time, recalculating their position.

In some examples, a Bluetooth-enabled device may not be authorized or may not have the capabilities to enter the self-verifying array as a Node 1102-1105, but it may emit signals including identification information and may receive communications from the self-verifying array. In such embodiments, the self-verifying array may identify these non-Node-type communication devices and establish their positions. As will be defined in more detail, in some examples, a position determination for a particular non-Node device may be defined in reference to a Node 1102-1105 that the non-Node device communicates with, along with an estimate of a range in which the non-Node device is capable of communicating.

Figure 11B:
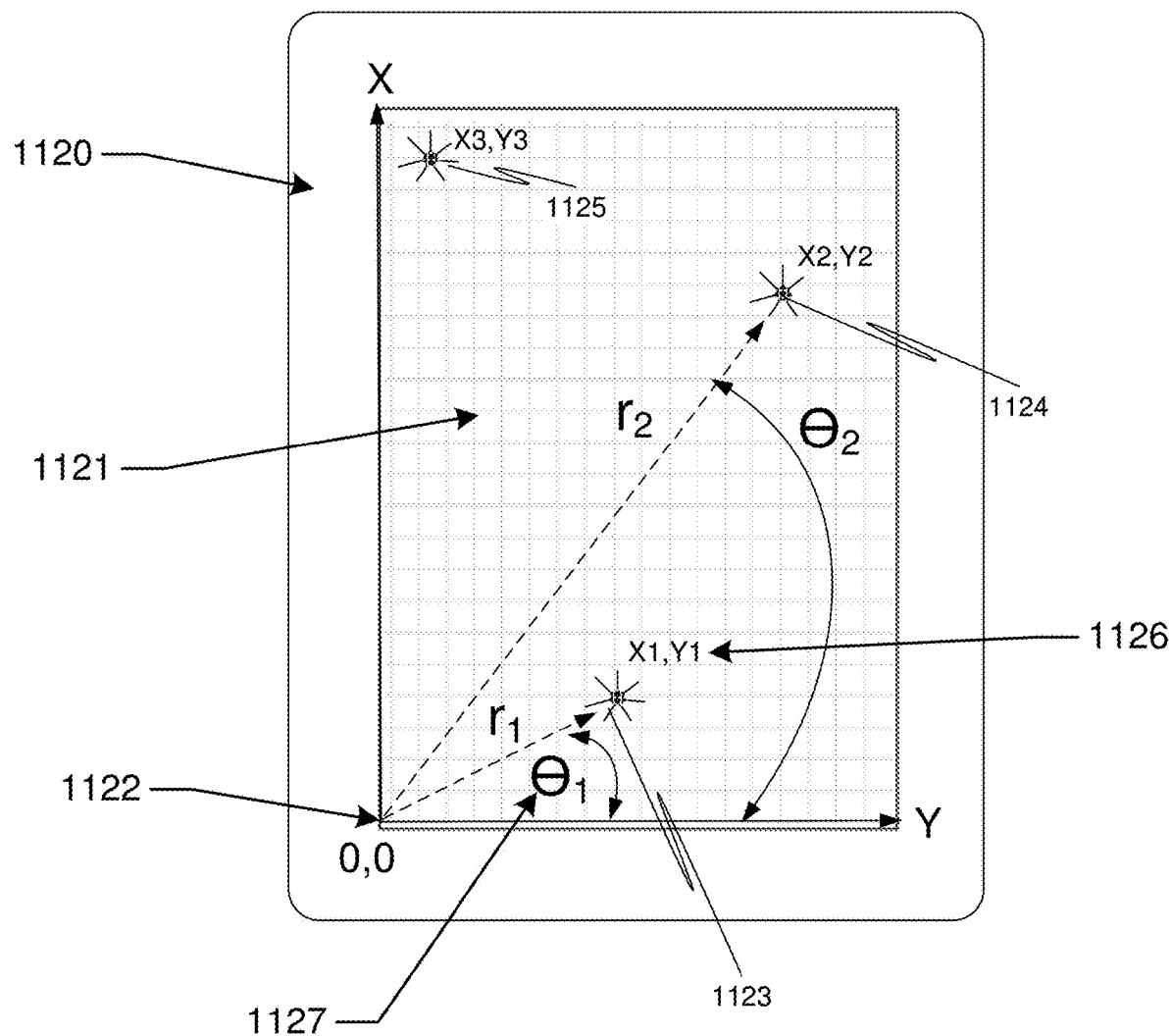
FIG. 11B illustrates a map displayed on a Smart Device with Cartesian Coordinates as well as Polar Coordinates displayed.

Referring now to FIG. 11B, a Smart Device may receive a communication from a Node 1102-1105 in a self-verifying array, wherein the communication includes multiple positional coordinates for each Node included in the array. The communication may also include positional coordinates of items of interest associated with Nodes 1102-1105 on the network, such as an item co-located with a Node 1102-1105. In some examples, the network may be interrogated by the Smart Device to provide information related to one or more Nodes included in the self-verifying array. The data may be used by the Smart Device to generate a user interface 1121 with a pictorial/image representation of the various Bluetooth transmitters and network Node devices. The representation may utilize one or more coordinate systems. For example, a Smart Device 1120 may portray the user interface 1121 may include image representation of a region of the Structure space which may be user selectable on the Smart Device. The image representation in the user interface 1121 may include an origin 1122 designation for a particular coordinate layer. In an example, where the coordinate layer is one where the origin is dynamically updated for the position of the Agent, then the origin may represent the position at which the Agent is located.

In another example, an origin may be congruent with an origin of a coordinate layer for a spatially relevant origin and the Agent may or may not be represented as an item on the user interface 1121. For this example, an Agent may be represented by position 1123. A pictorial representation may show the Agent position 1123 and also present parameters that refer to the Agent position such, as a two dimensional cartesian reference 1126 and/or a polar notation reference 1127. Other wireless Nodes of relevance 1124 and 1125, within the scale of the image may be portrayed as well.

In some examples, the self-verifying array may include a feature where some or all of the network connected Nodes have identification information associated with them. Each of the Nodes may have stored (locally or in another network data layer) a multitude of references such as an identification information internal to a transceiver. For example, a Bluetooth transceiver may transmit identification information like a 48-bit Bluetooth transceiver address, a user-assignable name to the transmitter, or a user-assignable name to an element that the transmitter is a component of may be stored. As an example of an assignable name, in a non-limiting sense, an appliance may be a Node in self-verifying array which may have the name "Downstairs Refrigerator."

In some examples, identification information may be related to different levels of security access that a Node may access, store, transmit, and the like. Information useful for generation of a user interface may be transmitted from a Node via IP on a digital communications network, such as the Internet, and a user may be located anywhere that is connected to the communications network. In this manner, a user interface may be presented to a remote user regardless of the user's location.

In some examples, a stable base unit of the self-verifying array may act as a standard repository and access point for all information stored or archived for the self-verifying array. In other examples, the data storage may be distributed across the self-verifying array. In an example, a standard portion of the data stored on the self-verifying array, such as in a non-limiting sense, the identifications, timestamps, positions, characteristics, and security levels of all Nodes, and identifications and positions of all transmitters within the Structure space/self-verifying array extent may be assembled into a data table/layer.

In some examples, a routine transmittal of a data table/layer may be broadcast throughout the self-verifying array. In an example, every self-verifying array Node may have an assigned broadcast order such that at a standard time indexed to the broadcast order, it will broadcast its current version of the table. All Nodes within range of a transmitting Node will receive the table and update it as the current version. Then, at their prescribed broadcast time, they might transmit the table. There may be rules that overlay such a broadcast to ensure that current data is not updated with previous versions for a Node that does not receive the update before its broadcast time. Such rules may also prevent unauthorized alteration of data through hacking or other network penetration. The Nodes may act as participants in a Blockchain in this manner.

One such rule may be that transmission may occur only when the data table has been updated at the Node. Another rule may inhibit transmission for any Node that is dynamic/moving, or alternatively initiate immediate transceiving for a Node that is dynamic/moving. Transmission may include diverse types of data. Periodic transmissions may be timed based upon a time needed for a transmission, energy required for transmission, available energy, receipt of new data, and the like. Therefore, each Node may have a configuration setting that defines conditions when, how, and for how long it transceives. Such condition may include, for example, a frequency upon which it listens for and upon which it communicates data. The various definitions of coordinate layers may be transmitted.

In some examples, a remote user-connected digital communications network to a self-verifying array Node or a Bluetooth device entering into a self-verifying array Node may request a copy of a standard data table transmission. The data table transmission may include positions of Nodes relative to a fixed origin, to the user position, to particular fixed Nodes of the network or a collection of some or all of these.

Some data layers may be created to store Sensor information that may be obtained at some or all of the Nodes. The data layer may be segregated based on types of Sensor data. For example, all Nodes of a self-verifying array may include a Sensor providing a quantification of one or more of: ambient temperature, humidity, water presence, current draw, vibration, movement, image data, and the like. A timestamped reading of this Sensor quantification may be included into a data layer along with co-located Node identification information.

In other examples, a subset of the devices may include an ambient-light Sensor as part of its infrastructure. In this case, another data layer may be created for this type of Sensor data. In some examples, the pictorial image representation 1121 may include one or more of the data layer Sensor information. The pictorial image representation 1121 may represent the Sensor readings in a textual form, or in other manners such as a color indication at a Node position or at regions around a Node position.

Figure 12A:
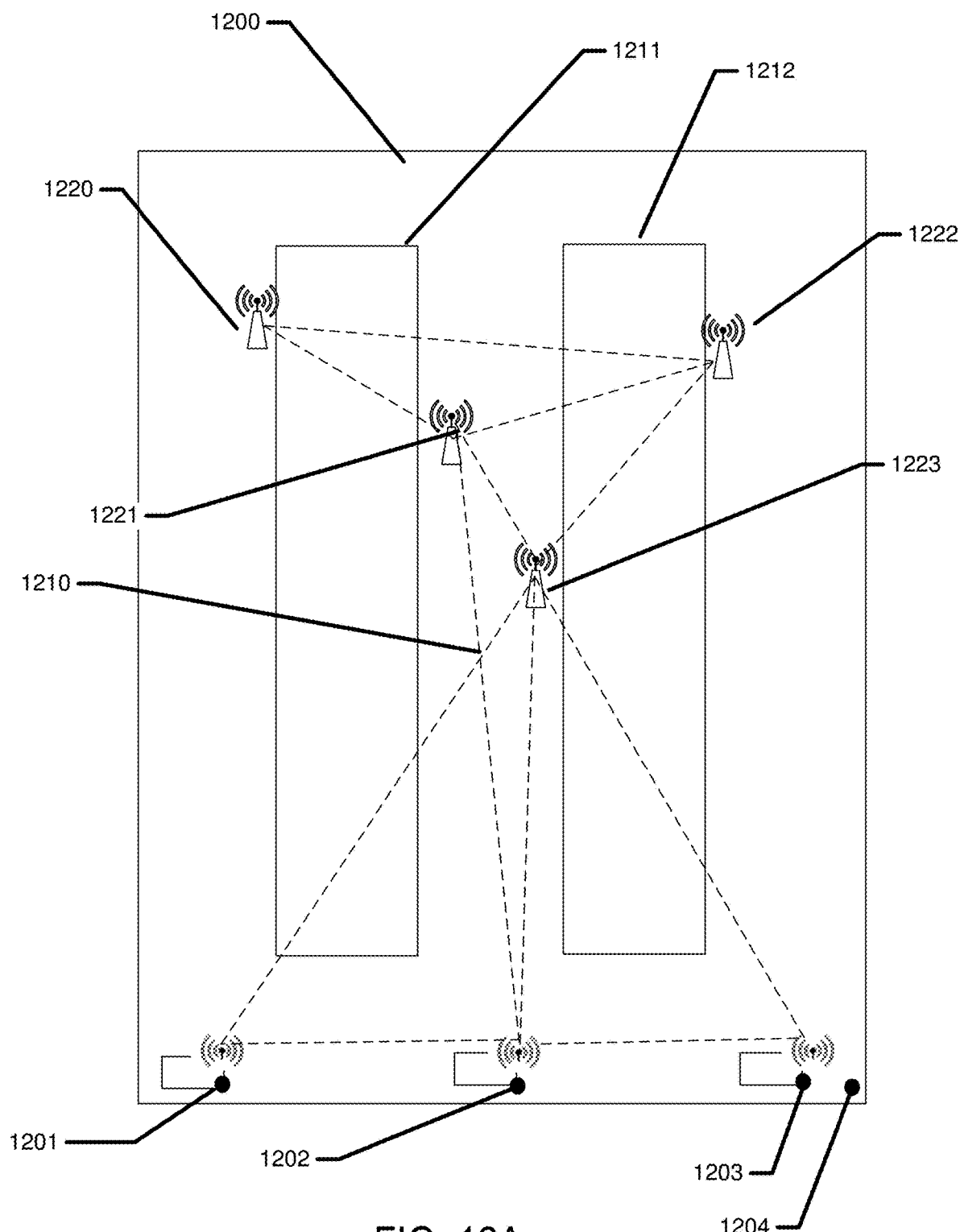
FIG. 12A illustrates a physical location with various stationary and movable wireless Nodes including camera equipped devices.

Referring to FIG. 12A, another representation of a SVAN 1210 is displayed. In this embodiment, space 1200 may include Structures 1211 and 1212. Structures 1211 and 1212 may have a variety of different characteristics that may impact the performance of self-verifying array 1210. For example, Structures 1211 and 1212 may be physically closed (e.g., walls, solid Structures) or partially closed (e.g., shelves). Structures 1211 and 1212 may also comprise solid materials (which may be stored for example at a construction site), equipment such as automobiles, tractors, backhoes, and the like. Accordingly, the presence of these Structures may change the transmission characteristics of a wireless network (e.g., Bluetooth). Some Structures may block signals, impede signals, or partially impede signals. For example, shelves may have physical regions that block and other regions that are fully transmissive.

Shelves may provide an example in which the Structures in the space 1200 may have dynamic characteristics. Such dynamic characteristics may make self-verifying arrays (and corresponding spatial schema) more useful than traditional mapping methods. For example, if a load of metal piping is brought in and placed upon the shelves, a region that was completely transmissive may become impeded to a degree. These characteristics may create different operational characteristics for self-verifying arrays.

In another sense, a shelf may hold a combination of both fixed and mobile devices that comprise a self-verifying array in the space at some given time. This may provide more accurate and more dynamic coverage for the schema. For example, the space 1200 may be interspersed with an assembly of fixed (or roughly fixed) network Nodes that form a grid pattern (as an example) to ensure that a minimal self-verifying array may be established that covers the entire space 1200. This minimal network may be supplemented with "migrant" Nodes that are moved into the space 1200 and become part of the SVAN 1210. From a signal coverage perspective, more participants may improve characteristics. However, more participants may increase information traffic levels, and a control formalism that limits bandwidth differentially to different network participants may be necessary in some examples.

In FIG. 12A, an example of a space 1200 with shelving units that make up Structures 1211 and 1212 is illustrated. The space may have a "global" reference point 1204 for positioning. There may be fixed wireless communication Nodes 1201, 1202, and 1203 (for this example, all Nodes are at least compliant with Bluetooth 5.1 and transmit at least as Bluetooth radio transmitters; however, this deployment is merely illustrative). The fixed wireless communication Nodes 1201-1203 may also include other aspects/components to them such as an integrated camera system. The integrated camera system may provide a visual perspective of a portion of the space that its corresponding wireless radios may cover. In a self-verifying array, Nodes may be collocated or located relative to a Sensor, such as an image-capture device. Based on a known set position of the Sensor relative to the Node, the Node may transmit information captured by the Sensor to other Nodes. Accordingly, a Node out of both Sensor and radio range of another Node may still receive data from the Sensor through the array. The data from the Sensor reflects a range of data in which a physical characteristic is quantified or capable of being quantified by the Sensor. For example, a Sensor may be an image-capture device, limited in range by both wavelength of image capture (e.g., limited to infrared) and spatial range (e.g., field of view of the image-capture device). This may be particularly desirable in embodiments in which the self-verifying array is deployed in or adjacent to an environment having a characteristic adverse to a Sensor. For example, the low temperatures found in a commercial freezer may impair operation of certain Sensors. Temperature-resistant Sensors may be collocated with Nodes within the freezer, while temperature-vulnerable Sensors (including Sensors capable of detecting conditions within the freezer) may be collocated outside the freezer. Through the self-verifying array comprised of these Nodes, data from the Sensors may be freely transferred among the Nodes, including through fiber optic communication throughout the freezer. It may be desirable to deploy spectrometers and hydrometers in this fashion. Moreover, redundant Nodes may be able to redirect Sensor readings from one Node to a base Node, especially in scenarios when an optimal Node pathway may be obstructed, such as by shelving.

The space 1200 may also include other fixed Nodes, such as Node 1223, that may not have cameras included. Node 1223 may be important to ensure that regardless of a makeup of migrant communication Nodes, fixed wireless communication Nodes may be able to form a complete SVAN space 1200 in the absence of items that block radio transmissions. There may also be migrant communication Nodes 1220-1222 affixed on packages, materials, or other items that may be placed and/or stored upon the shelving units.

In some examples, at least a subset of the SVAN-participant Nodes may communicate periodically. The various aspects of data layer communications as have been discussed may occur between the Nodes of the network. At a base level, at least a subset of the Bluetooth transmitters may periodically transmit information such as their unique identifiers, time stamps, known positions and the like. In some embodiments, Nodes may transmit between each other or to a base information about variables between the Nodes, such as computed distances or angles between the Nodes. A Node may receive transmissions from other transmitters and may store the transmissions. In some examples, a Node may act as a repeater by receiving a transmission and then retransmitting the received transmission. A Node acting as a repeater may then take various actions related to the data involved. In an example, the Node may effectively just stream the data where no storage of any kind is made. Alternatively, a Node may store the transmission, then retransmit the transmission (immediately or after a delay) and then delete the stored data. In other examples, a repeater Node may store a received transmission and then retransmit the transmission either for a stated number of times, or until some kind of signal is received after a transmission. Thereafter the Node may also delete the data. In some examples, a Node may store data from an incoming transmission and take the various retransmission actions as have been defined, but then not delete data until its data store is filled. At that point, it may either delete some or all of the stored data, or it may just overwrite stored data with new incoming data and then clean up any remaining data with a deletion or other process.

When a Node acts as a repeater, it may receive data and then merely retransmit the data. Alternatively, a repeater Node may either use the transmission of data or the time during the transmission to acquire and calculate its position and potentially the position of other transmitters in range. During retransmission of the received data, it may also include in the transmission calculations of its own position relative to other transmitters, calculations of other transmitter positions relative to itself, calculations of its own and other transmitter positions relative to an origin, and the like. It may also include other information such as a time stamp for the calculation of positions.

The combined elements of a SVAN may be operated in a way to optimize power management. Some of the network Nodes and transmitting elements may operate in connection with power-providing utility connections in the Structure. Other network Nodes may operate on battery power. Each of the Nodes may self-identify its power source, and either at a decision of a centralized controller or by a cooperative decision making process, optimized decisions may be taken relative to data transmission, low-power operational modes, data storage and the like. In some examples, where multiple Nodes provide redundant coverage and provide information to a central bridge acting as a repeater, the Nodes may alternate in operation to share the power-draw on individual Nodes. For example, if one of these Nodes is connected to a utility power source, that Node may take the full load. The battery-powered elements may have charge-level detectors and may be able to communicate their power-storage level through the network. Accordingly, an optimization may reduce traffic on the lower battery capacity Nodes.

In some examples of operations, a transmitting Node may transmit a message for a number of redundant cycles to ensure that receivers have a chance to detect the message and receive it. In low power operating environments, receivers may transmit acknowledgements that messages have been received. If a base unit of the network acknowledges receipt of the message, control may be transferred to the base unit to ensure that the message is received by all appropriate network members. Message receivers may make a position determination and broadcast their position if it has changed. A self-verifying array of Bluetooth receivers may provide one of a number of Transceiver network layers where other communication protocols based on different standards or frequencies or modalities of transmission may be employed, such as Wi-Fi, UWB, Cellular bandwidth, ultrasonic, infrared and the like. A Node that is a member of different network layers may communicate and receive data between the different network layers in addition to communicating through a Bluetooth low-energy self-verifying array.

Figure 12B:
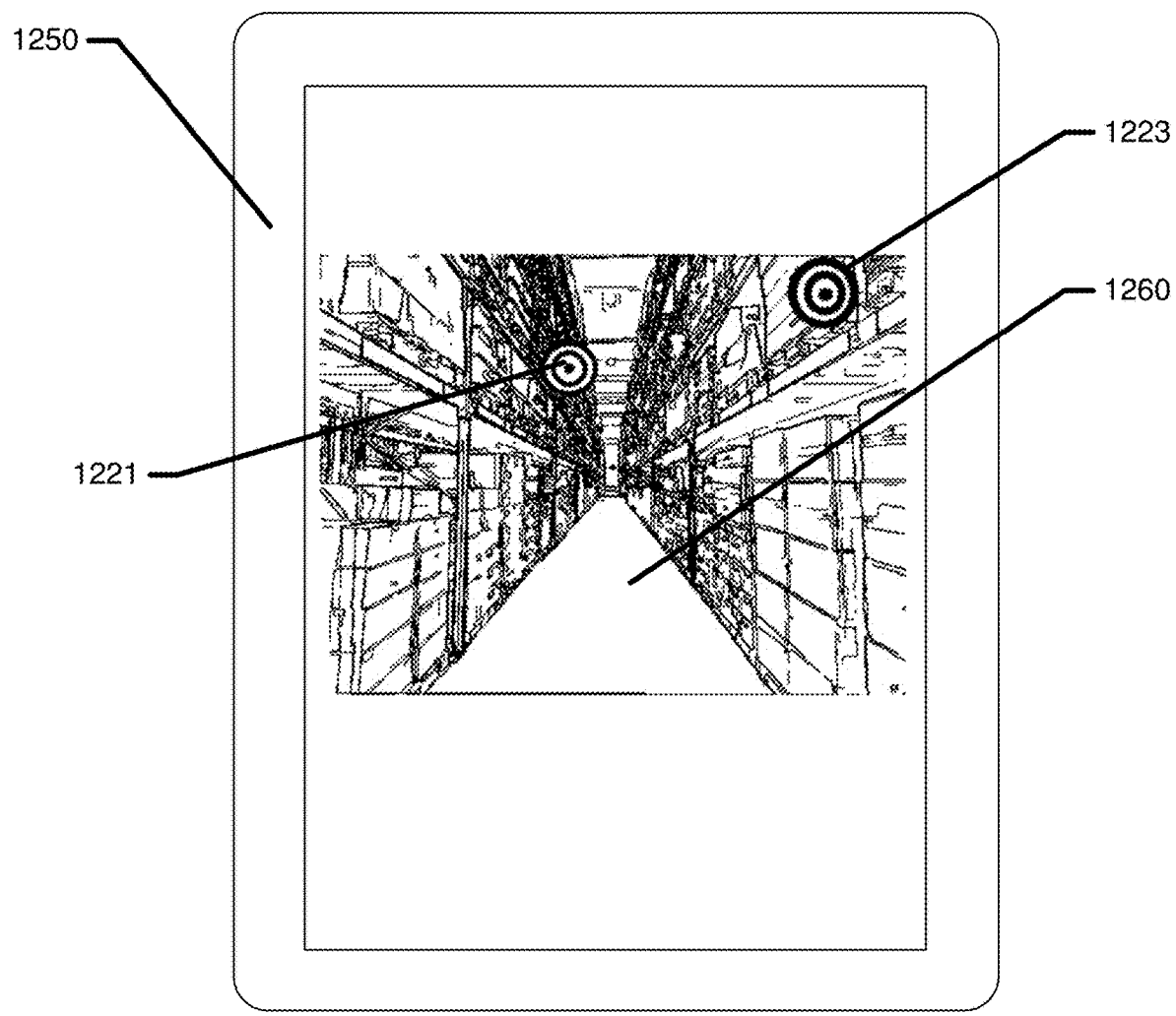
FIG. 12B illustrates a view on a Smart Device incorporating a camera video display with superimposed wireless device location.

Referring to FIG. 12B, an illustration of the view from a camera on a network Node position is presented. A Smart Device 1250 may interact with the self-verifying array and communicate a desire to receive images or video from a camera. In an example, referring back to FIG. 12A, the Node 1201 may have a camera that produces an image that in FIG. 12B is presented on the smart phone as image 1260. Processing either on the Smart Device or on processors connected to the network may collect information about the location of other network Nodes through the various processes as described herein and then determine a correct location on the collected image to display icons over the position of the Nodes 1221 and 1223. There may be numerous other types of information that may be overlaid onto the imagery such as Sensor measurements, textual presentations of data values, data related to status and transactions on the network, and the like.

In some examples, the cameras may be maintained in a fixed position or positioned on mounts that can allow the plane of view of the camera to be moved. The Smart Device 1250 may be supported by an agent such that it is oriented in such a manner to point to a particular view-plane from the perspective of the screen. This may either be from a perspective of looking through the smart screen (i.e., in the field of view of a camera associated with the Smart Device 1250) or, in other examples, supporting a screen of a Smart Device flat (i.e., parallel to a ground plane) and pointing in a direction of interest based on a direction of orientation of the Smart Device 1250. In related applications, it is disclosed that a direction of interest may be determined based on wireless communications. In some examples, orientation aspects of Transceivers upon the Smart Device 1250 may be employed to determine Rays of interest of the user (for example, to point the Smart Device 1250 in a direction of interest to the user). In other examples, other Sensors on the Smart Device such as accelerometers, magnetometers, and the like may be able to infer a direction in which the Smart Device is pointed. Once a direction of interest is determined, the camera may be moved to correspond to a plane perpendicular to a Ray associated with the direction of interest (i.e., such that the Ray is a normal vector to the plane). An assessment of items of interest whose coordinates may lie in the field of view of the selected view plane may be made, thus presenting data to the user and allowing the user to filter out or learn more about the items.

Figure 12C:
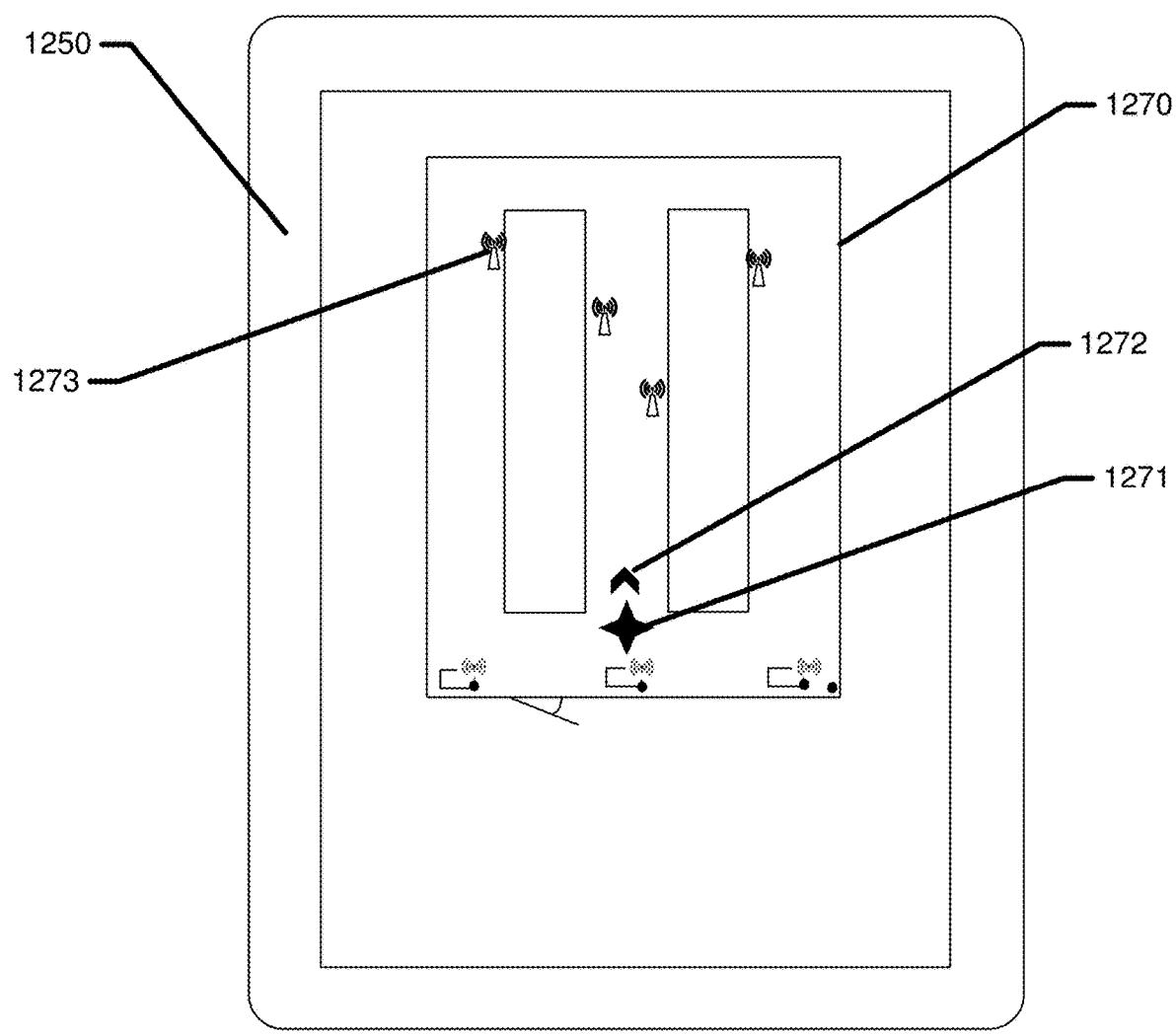
FIG. 12C illustrates a view on a Smart Device showing a map of known device locations as well as known user location and user orientation.

Referring now to FIG. 12C, another type of presentation is illustrated where a plan view or map view of the space 1270 may be presented. In some examples, a Smart Device may access a virtual model (AVM) or other spatial schema that contains spatial data relating to the space that the user is in. The view may also include a presentation of the Structure, including features such as walls, doors, supports, shelving, equipment and the like. The location of network Nodes may be illustrated by icons 1273 at the two-dimensional locations determined by the various position-mapping processes as described herein. The location of the user 1271 may also be superimposed upon the map with a different icon, and this location may be dynamically updated as the user 1271 is moving. There may also be an iconic representation of the heading 1272 of the user which may be determined by the wireless protocols as discussed herein or it may be estimated based on the time-evolution of the position of the user (for example, through dead-reckoning). Items of interest may be presented on the map at any location surrounding the user such as in front, to the side or behind the user. In some other examples, only items in the view-plane (determined by the heading of the user) may be illustrated on the Smart Device 1250. Textual data and other types of information display such as color gradation may also be superimposed on the map to represent data values such as Sensor input, network characteristics, and the like. In some examples, a relative height of items of interest relative to the floor or to the Smart Device may be presented on the image as a text presentation.

Figure 12D:
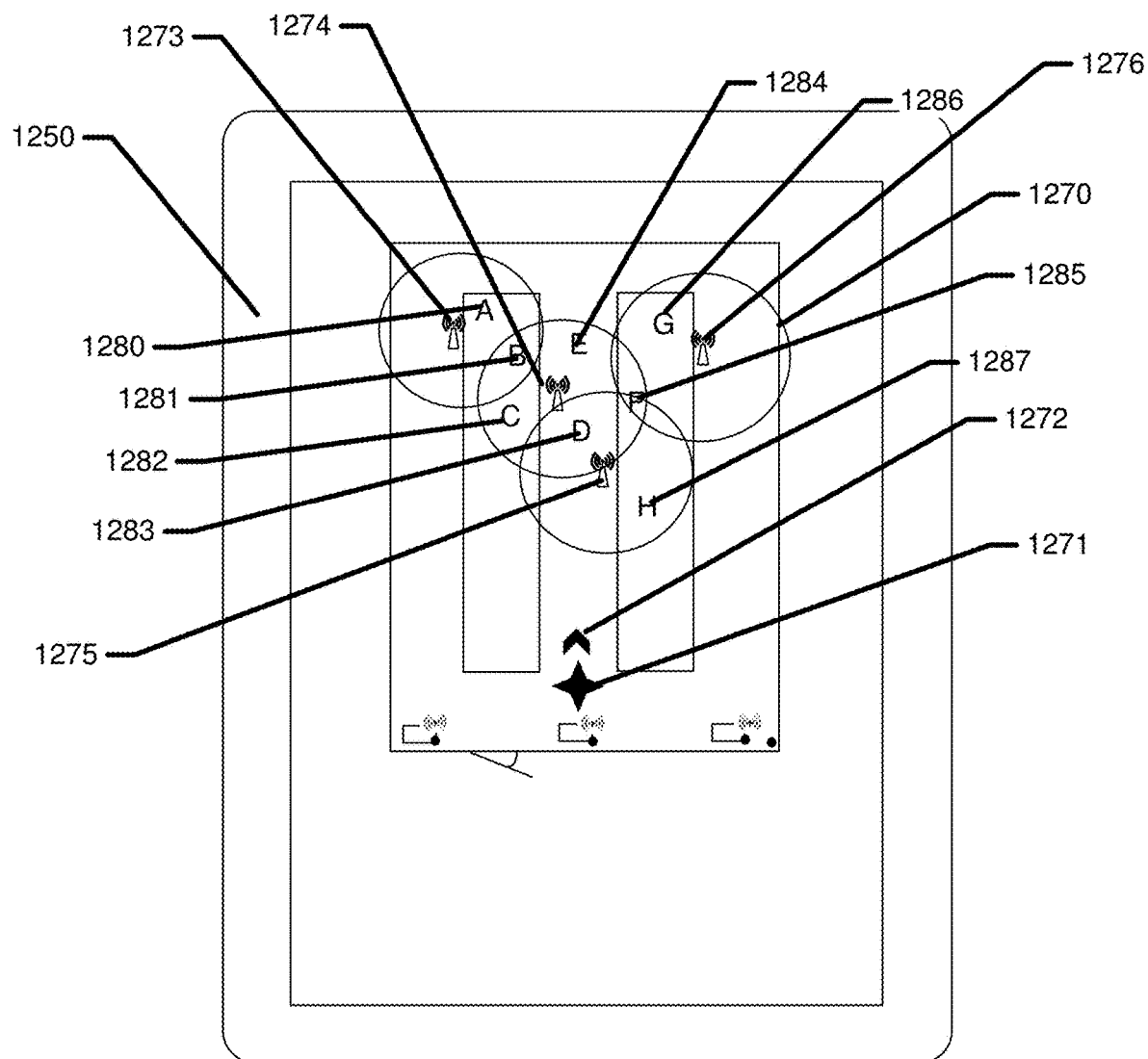
FIG. 12D illustrates a view of devices displayed on a Smart Device showing a map of known location equipped SVAN Node locations as well as regionally associated non-location equipped devices.

Referring to FIG. 12D an extension of location tracking is illustrated for devices that do not have positional capabilities (such as a GPS) but can respond to transmissions within a certain distance. The range of the device can allow a localization to a be within a certain distance from a Node. In some examples, nanowatt Bluetooth Nodes that operate without battery power may be cheaply attached to items for tracking and/or can be affixed with Sensors to provide data acquisition. These devices may typically depend upon energy harvesting for their operation. In some examples, a transmission from a Node of the SVAN may itself carry enough energy to enable an RFID tag or other type of passive tag to respond with a low-energy transmission. Accordingly, a Node may transmit sufficient energy to activate an RFID; such as, for example, an RFID that has an identifier of an item to which it is affixed. The devices may be unable to perform all the wireless functions discussed herein, but they may be capable of transmitting identification data and perhaps Sensor data.

In some examples, RFIDs may be employed. Bluetooth self-verifying array Nodes may also have incorporated RFID tag readers that can similarly transmit a unique identifier in response to a transmission from the self-verifying array Node. In FIG. 12D, a Smart Device 1250 may display a map-form presentation of a space 1270 (similar to the previous discussion with SVAN Nodes located in a two-dimensional coordinate system). In an exemplary embodiment, ultralow-power Bluetooth Nodes or RFID Nodes may be located on elements such as packages or equipment placed on the illustrated shelves. In response to transmissions from the SVAN Nodes, various low-power tags may respond. In some examples, the localization of the low-power tag may be based on further refinement of measurements, such as measurements of the returned signal strength.

Referring again to FIG. 12D, a SVAN Node 1273 may detect two transmitting Nodes (labeled "A" 1280 and "B" 1281 in FIG. 12D). Since Node "B" 1281 may also be detected by a neighboring SVAN Node 1274, it may be inferred that the Node may be in a region located between the two SVAN Nodes (i.e., since Node "B" is located in the overlap of the coverage areas of SVAN Nodes 1273 and 1274, it is likely that Node "B" is located somewhere between SVAN Nodes 1273 and 1274). Other Nodes received by SVAN Node 1274, such as Nodes 1282 and 1284, may not be detected by other SVAN Nodes and thus may be located in non-overlapped regions. As a further illustration, Node "D" 1283 may be detected both by Nodes 1274 and 1275. Node "F" 1285 may be detected by three different SVAN Nodes 1274, 1275 and 1276. Thus, the position of Node "F" may be determined with a high level of confidence. Node "G" 1286 may be located only in SVAN Node 1276. Node "H" 1287 may be located only in SVAN Node 1275. This data may provide localization information for regions around Bluetooth SVAN Nodes.

The non-limiting example discussed has included a Structure with obstructions in the form of shelves; however, obstructions may include any item that interferes with or inhibits or decreases quality of inter-Node communication within the self-verifying array.

Some self-verifying arrays may be established in an outdoor environment, such as a construction site. There may be numerous items, such as equipment, tools, and materials to which Nodes may be attached. In some examples, at a construction site there may be significant utility in establishing fixed Transceiver position as the site is initially established. The self-verifying array may track and locate the various equipment and materials through radio-frequency communications (e.g., via RFID). Furthermore, establishment of fixed points across the construction site may allow for a self-verifying array of significant size to be established. As described in reference to FIG. 12D, there can be RFIDs or Bluetooth Nodes that may be attached to various materials such as structural beams, wallboard pallets, and the like. In these examples, the transmitting Nodes may not have battery elements for cost or environmental conditions reasons. The location of various components of construction may be tracked as they are moved across the site. In some embodiments, an AVM may be used to compare expected movements of components to the observed movements. As the Structure is built and studied during the creation of AVMs, the various Bluetooth Nodes may still be able to provide communications as to components that make up Structure or are embedded within Structure.

Figure 12E:
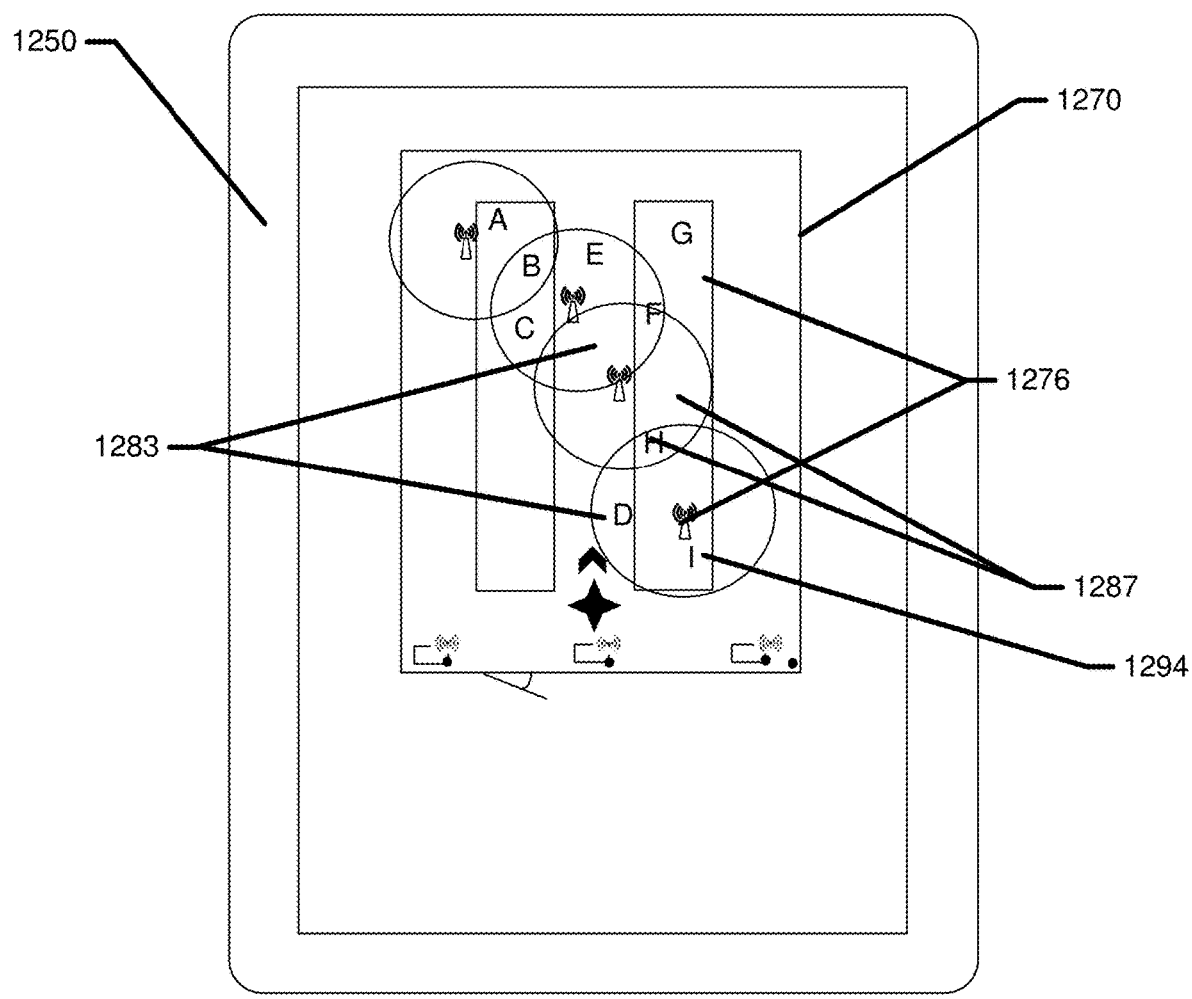
FIG. 12E illustrates a view of a SVAN displayed on a Smart Device showing movement of known location Node locations as well as movement of regionally associated non-location equipped devices.

Referring to FIG. 12E, elements of a self-verifying array in a space 1270 may have dynamic locations and their movement may have ramification. In an example, SVAN Node 1276 may physically move to another location. The various self-verifying array data layers relating to location of elements may update for this move and the updated tables may be communicated to the Nodes of the network as has been described. At the new location, SVAN Node 1276 may signal to devices in its new region for response. There may be transmitting Nodes and RFIDS that are and have been in the new region that SVAN Node 1276 has moved to. For example, item "I" 1294 may be located by SVAN Node 1276 in its new location. As well, items with transmitting Nodes on them may also move as illustrated by the detected movement of item "D" 1283. Another type of change may be that when Node 1276 occupies its new location, item "H" 1287 may be detected in the region of two network Nodes now, and therefore its location may be refined to that region that the two network Nodes overlap in coverage.

Figure 12F:
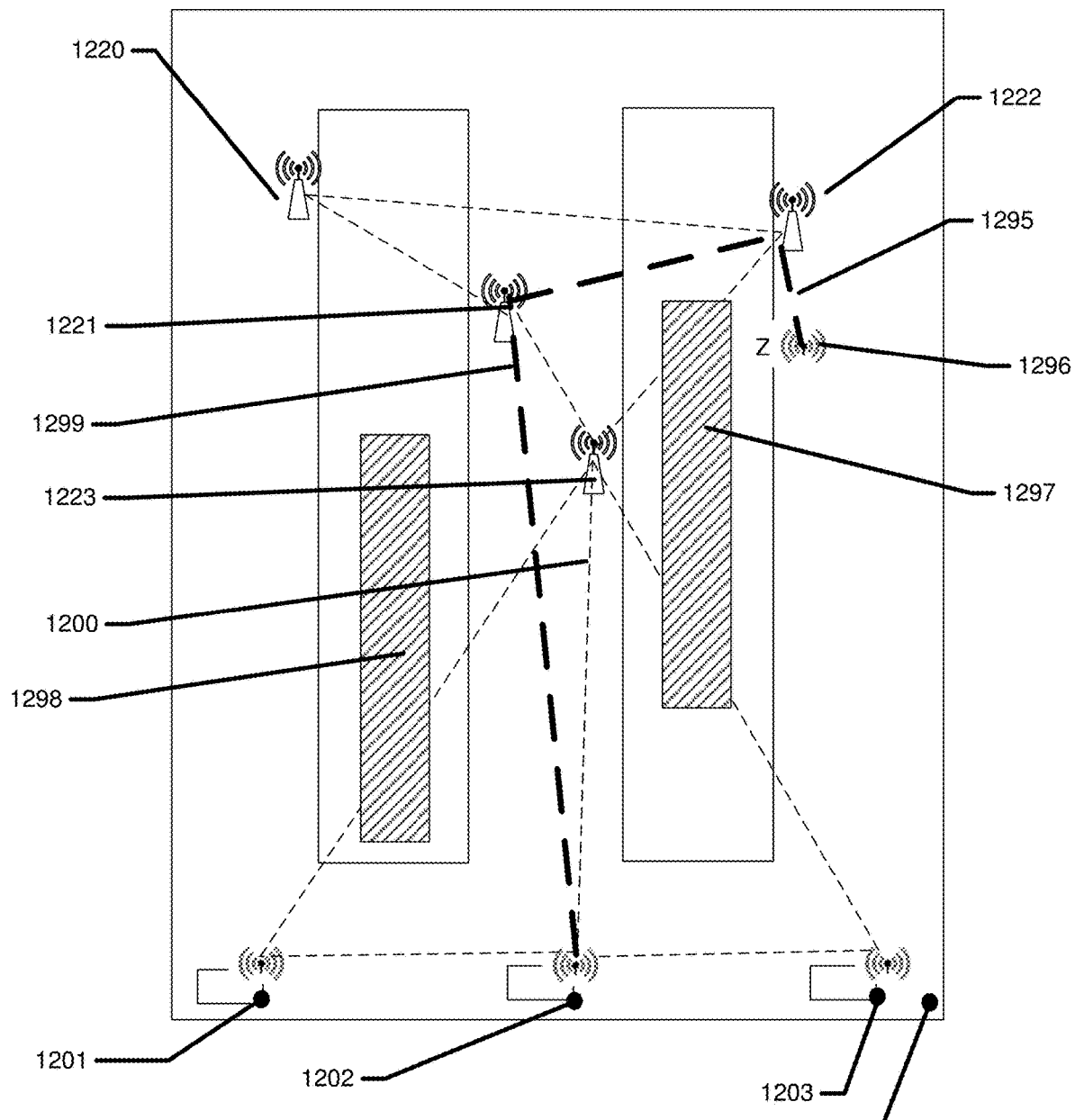
FIG. 12F illustrates a view of a SVAN being used to look around blockages.

Referring now to FIG. 12F, an illustration of a complex space where regions within the space may block or impede wireless communications is provided. In some examples, parts of a Structure like internal walls, conduits, equipment, structural beams, and elevators/shafts may provide permanent or temporary blockage of wireless transmission. For example, as an elevator passes through a particular floor, it may block transmissions through the elevator shaft that may otherwise occur. Shelves may be temporarily have materials or equipment moved to positions on the shelves as illustrated by regions 1297 and 1298 that may block wireless transmissions. The self-verifying array 1200 and its Nodes 1201-1203 and 1220-1223 may be able to cooperate and provide coverage of the self-verifying array around such blockage. For example, a wireless communication Node 1296 may be too far from Node 1203 to communicate directly with it. And communication from other fixed Nodes like 1201 and 1202 may be blocked by the blockage as discussed. The SVAN may still communicate 1295 with the SVAN Node 1296 by connecting a path 1299 shown in thick dashed lines essentially communicating with line of sight paths around the blockages.

Figure 13A:
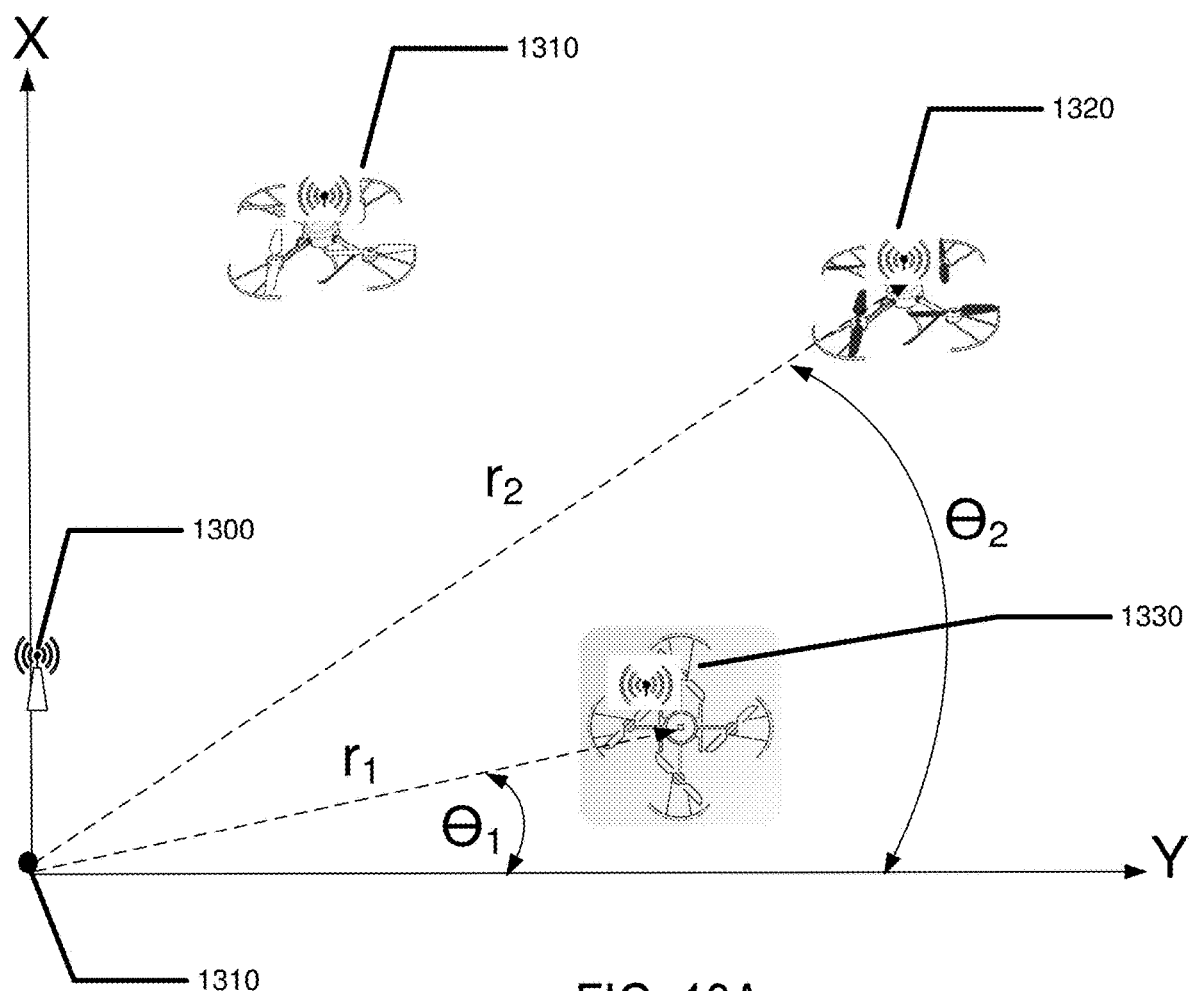
FIG. 13A illustrates a set of mobile Nodes represented in polar coordinates.

Referring to FIG. 13A, mobile elements such as UAV and UGV with wireless transmitting Nodes attached are illustrated. Mobile elements may function within self-verifying arrays to create dynamic physical extensions of the self-verifying array. The mobile elements 1310, 1320 and 1330 are illustrated as UAVs. As the mobile elements move, they may allow other Nodes or wireless access Nodes to make communications. In some examples, there may be at least a first fixed element 1300 that is part of the SVAN. It may define an origin point in some systems, but in other examples, it may be offset from an origin point 1310. As a mobile element 1320 moves through space, its position may be updated by communication between the fixed element 1300 and itself 1320. The location determine may in some examples be referenced to the origin. In polar notation, it may be located at $r_2$, $\theta_2$, for example, where the angular components are taken with respect to an axis having at least a point perpendicular to mobile element 1320 (e.g., a ground plane).

When the mobile elements are able to communicate with a fixed element, a determination of the fixed element's position relative to a local coordinate system may be straightforward since the fixed element can know its position with relatively high accuracy. A moving device that can continually measure its position relative to the fixed element can come close to that accuracy in position determination as well and can improve its determination by taking more measurements. As mentioned previously, elements in an operating space may be either statically or dynamically positioned and block or impede wireless transmission through them. Mobile communication elements create interesting solutions in such an environment because a team of communication elements can position itself in such a manner to "look around" such difficult transmission zones. At the same time, the difficult transmission zone may block the ability of a mobile element from communicating directly with a fixed communication Node. In such cases, a first mobile element may determine its position relative to a second mobile element, where the second mobile element has communication capability with fixed self-verifying array communication Nodes. In some examples, a self-verifying array may consist entirely of mobile elements, and then its practical coordinate system may be a local one that is determined in a moving coordinate system related to one or more of the mobile elements relative position.

Figure 13B:
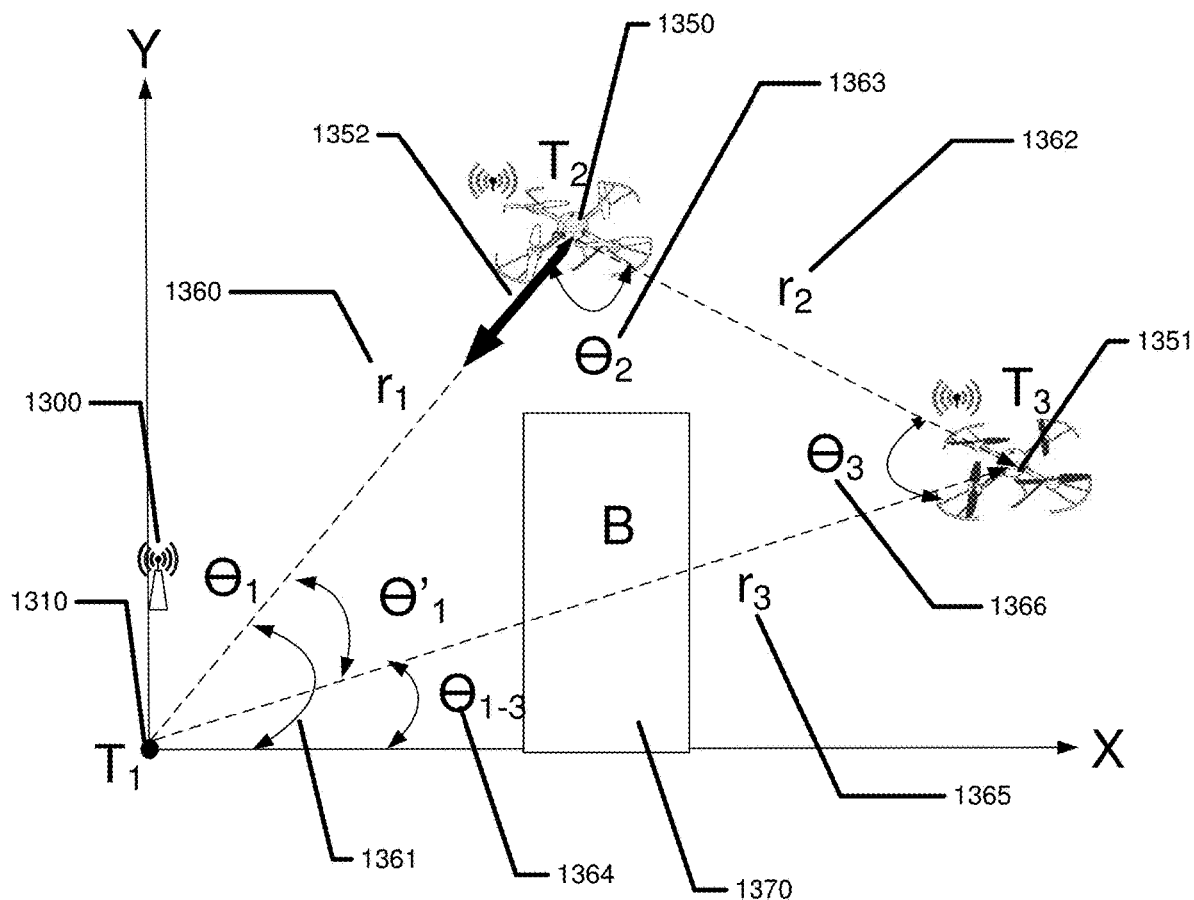
FIG. 13B illustrates an ability of a set of mobile Nodes to cooperate around blocked transmission zones with line of sight.

Referring now to FIG. 13B, an exemplary embodiment of this non-line-of-sight position detection is shown. In some examples, there may be mobile elements 1350, 1351 with wireless communications capabilities that create at least a portion of a SVAN of wireless communicating devices. In some examples, the wireless communicating devices may include capability for Bluetooth protocol communications. In still further examples, the Bluetooth protocol communications devices may include capabilities for establishing self-verifying arrays as well as capabilities of performing positioning based on AoA measurements such as is defined in the Bluetooth 5.1 standard. A fixed element 1300 which has a known offset to position $T_1$ may locate a mobile Node 1350 (such as a UAV) at position $T_2$ in accordance with the orienteering methods described above. In some examples, the mobile Node 1350 at position $T_2$ may have moved into position $T_2$ in order to have a line-of-sight with the mobile element 1351 at position $T_3$. For illustration and discussion, the devices are shown with line-of-sight between $T_1$ and $T_2$ and between $T_2$ and $T_3$. In some examples, the wireless communication modalities described herein may be capable of passing through walls or other blockades, however, a blockade may resist or interfere with such wireless transmission. In some examples, a wireless modality deployed may just not be able to penetrate a given wall or other obstruction.

Accordingly, the second reference Transceiver $T_2$ of the mobile Node 1350, due to its movement, may be deployed within the line of sight of both $T_1$ and $T_3$ to assist with determining an accurate location of $T_3$ notwithstanding the lack of sight between $T_1$ and $T_3$. Although this Figure shows a lack of line-of-sight between fixed device 1300 and the mobile element 1351 as caused by blockade B 1370, line-of-sight may also be defeated by, for example, an excessive distance between $T_1$ and $T_3$ (i.e., $r_3$ 1365). For example, Bluetooth 5.1 has a range of approximately 1.4 km at certain frequencies. Thus, where $r_3 \gg 1.4$ km, the present method may be desirable for Transceivers that use Bluetooth 5.1.

Using the methods described above, the fixed element 1300 referenced to $T_1$ may determine the location of the mobile Node 1350 $T_2$ by line-of-sight communication. For example, the location may be determined based on the angle of arrival of signals, as angle $\theta_1$ 1361 from $T_2$ and the distance $r_1$ 1360 between $T_1$ and $T_2$ as measured by timing signals. For ease of calculations and discussion, the local coordinate system of mobile Node 1350 at $T_2$ may be oriented to a reference direction 1352 pointed to location $T_1$ from $T_2$. The mobile Node 1350 at $T_2$ may in turn detect the location of the mobile element 1351 at $T_3$, using (in some embodiments) the methods described herein. If $T_2$ uses the methods described herein to determine the location of $T_3$, it may determine that the mobile element 1351 at $T_3$ is located a distance $r_2$ 1362 from it and relative to its reference direction 1352, it may be located at an angle $\theta_2$ 1363.

The mobile Node 1350 may aid the system of SVAN elements to determine the positions of each of the element relative to each other by relaying the relative location of the mobile element 1351 at $T_3$ as detected to the fixed element at 1300 which is referenced to the point $T_1$. One of the components of the SVAN, which may even include connected servers that are connected to one of the self-verifying array Nodes, may then perform algorithmic calculations to trigonometrically compute several useful values, such as: the effective distance between $T_1$ and $T_3$, notwithstanding blockade B 1370, i.e., $r_3$ 1365; the effective angle of arrival of a signal from $T_3$, i.e., $\theta_3$ 1366; the angle between $T_3$ and an axis formed by $T_1$, i.e., $\theta_{1-3}$ 1364; and the like.

Figure 15:
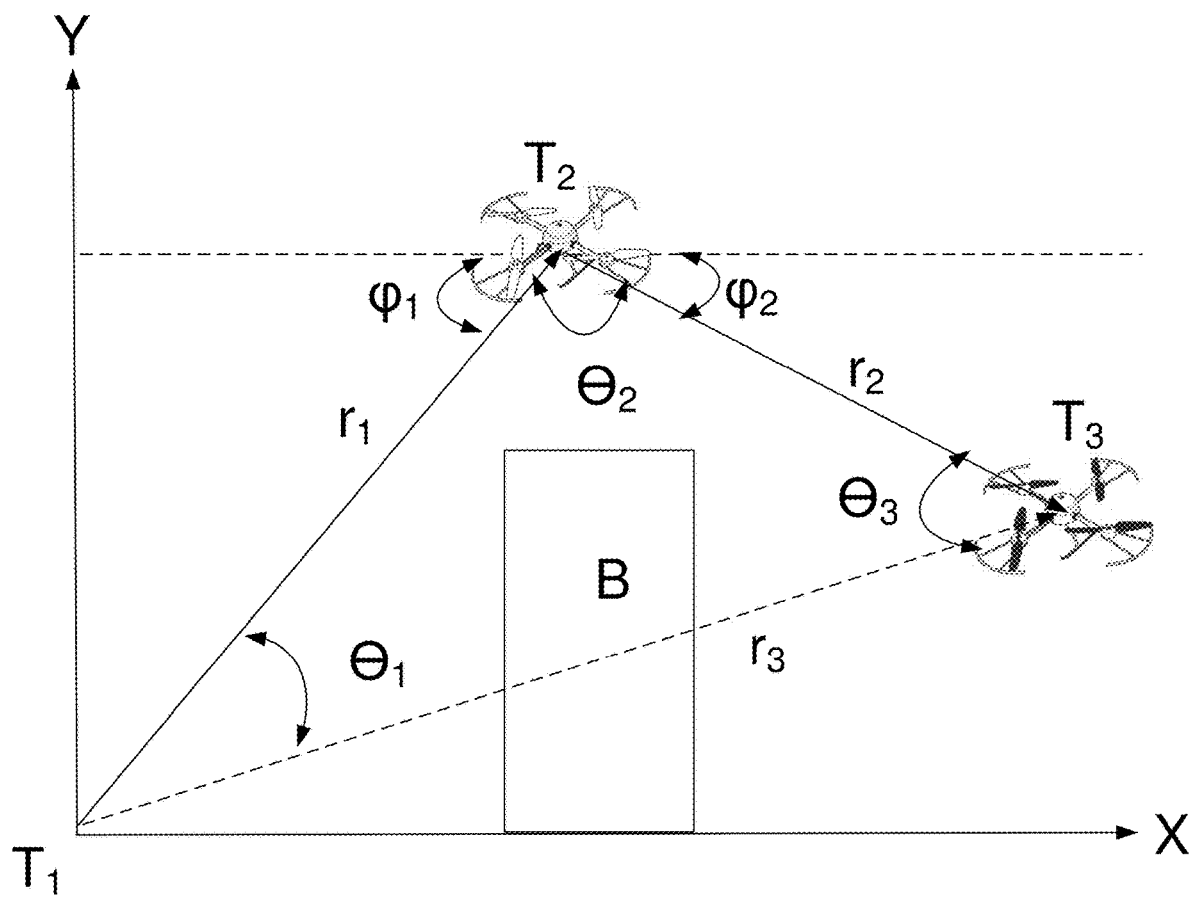
FIG. 15 illustrates exemplary methods of computing the distance between two Nodes not having line-of-sight communications between each other.

Referring briefly to FIG. 15, an exemplary method of computing the distance between two nodes not having line-of-sight communications between each other is shown. In this example, it will be assumed that the nodes and the vectors between them can accurately be projected into a two-dimensional, coplanar space, as shown in FIG. 15. This may also be appropriate in situations in which, for example, three linearly independent axes can be determined (e.g., x, y, and z), but one of those axes is not of interest. For example, if a flight path is to be determined in a warehouse, one might treat all blockades as having a height equal to that of the entire warehouse, and then seek to avoid blockades on the x and y axes. In exemplary embodiments, the axes may be tangible guides, such as a floor or a wall.

For the purposes of this discussion, let the distances between Nodes $T_1$ and $T_2$, $T_2$ and $T_3$, and $T_3$ and $T_1$ be $r_1$, $r_2$, and $r_3$, respectively. Let the angles between $r_3$ and $r_1$, $r_1$ and $r_2$, and $r_2$ and $r_3$ be $\theta_1$, $\theta_2$, and $\theta_3$, respectively. As described above, the magnitudes of $r_1$ and $r_2$ may be known using the methods disclosed herein. The present invention also allows the position of $T_3$ to be communicated to $T_1$ using $T_2$ as a relay in a variety of ways; one exemplary way is as follows.

A straightforward way of computing the magnitude of $r_3$ is to use the law of cosines. Doing so requires knowledge of at least $\theta_1$, $\theta_2$, or $\theta_3$. $\theta_2$ can be determined in multiple ways, depending on the specifics of the deployment of $T_1$, $T_2$, and $T_3$, as well as the specific Bluetooth 5.1 implementations of each. For example, in some embodiments, $\theta_2$ may merely be any of: the angle of arrival at $T_2$ or the angle of departure at $T_2$. In embodiments in which a central controller effectively creates a map of the Nodes and translates them into a coordinate system, then $\theta_2$ may be determined using a dot product or other norm between the vectors represented by $r_1$ and $r_2$. In other embodiments, $\theta_2$ may be determined geometrically as discussed in further detail below. In still other embodiments (particularly those employing a central controller), the vector represented by $r_2$ may be translated to the origin (shown in FIG. 15 as $T_1$) or otherwise measured to determine its magnitudes in each axis of the chosen coordinate system. This may then be used to determine the magnitude of $r_3$, as in the embodiment shown in FIG. 15, $r_3$ is the vector sum of $r_1$ and $r_2$.

Assuming $r_1$, $r_2$, and $\theta_2$ are known with accuracy, then the law of cosines provides that $r_3$ is simply equal to the positive square root of $r_1^2 + r_2^2 - 2r_1 r_2 \cos(\theta_2)$. (This computation may also be applicable in three-dimensional models.) In practice, however, some or all of these quantities may be subject to uncertainty. Accordingly, in some embodiments, several methods of computing $r_3$ (some of which are discussed below) may be used, and a weighted average of these computations may be taken to more accurately determine $r_3$. Moreover, the methods discussed below may produce additional quantities that may be desirable in some embodiments, such as a virtual angle of arrival of a signal from node $T_3$ to node $T_1$.

In some embodiments, $\theta_2$ may not be cleanly determinable as simply an angle of arrival/departure of a signal at $T_2$. However, in some embodiments, the angles of arrival/departure at $T_2$ may be determined with reference to an axis drawn parallel to the x axis, as shown in dashed lines in the figure. Let these angles be $\varphi_1$ and $\varphi_2$. If $\varphi_1$ and $\varphi_2$ are determined with accuracy, then $\theta_2$ is $180° - \varphi_1 - \varphi_2$, and the computation of $r_3$ can proceed as discussed above.

Given $r_3$, other useful quantities may be computed. For example, although the figure shows $\theta_3$, it may not be immediately quantifiable as an angle of arrival/departure because $\theta_3$ represents the angle between $r_2$ (i.e., the vector connecting $T_2$ to $T_3$, the magnitude of which is known a priori in some embodiments due to the line-of-sight tracking described herein) and $r_3$ (which is a virtual vector that has unknown characteristics a priori due to the lack of a line of sight between $T_3$ and $T_1$). But once $r_3$ and $\theta_2$ have been determined, then $\theta_3$ is the arcsine of $(r_1/r_3) \sin \theta_2$. Similarly, $\theta_1$ is the arcsine of $(r_2/r_3) \sin \theta_2$.

Referring back to FIG. 13B, analysis techniques, such as artificial-intelligence techniques, may also use a difference in a position calculated trigonometrically and via delayed line-of-sight to calculate an interference factor of a particular wall, material, etc. (such as blockade B). This may be used in subsequent transmissions that may pass through the particular wall, material, etc. to more accurately estimate the impact of the wall, material, etc. on the transmission. While the blockade B 1370 is stationary and static, it may be possible to determine a calibration factor for signal changes caused by blockade B 1370 that may allow for attenuated signals that come from self-verifying array Nodes that are behind the blockade to none the less be directly estimated for their relative position.

In addition, a known delay can be used to determine attributes of an obstruction, such as material type, thickness, proximity, etc. This may be particularly true when the blockade is uniform in its characteristics. Moreover, the trigonometric techniques discussed herein may assist in determining a lack of an obstruction between $T_1$ and $T_2$ at a given wavelength by comparing the expected trigonometric result with an empirically determined line-of-sight result.

It may be useful in controlling a particular space, such as a construction site, to utilize a team of mobile devices to survey and surveil the space. In addition to the ability to surveil a region that has regions of blocked/impeded transmission, the mobile network can establish routine (but transitory) bridge links in a self-verifying array to communication Nodes that are remote, as has been described. In addition to these abilities, a mobile element that has an RFID reader capability may also pass over a space and "inventory" RFID tags attached to items for security, location and condition tracking.

As mentioned previously, low-energy Bluetooth-based Nodes may also be interrogated by mobile elements where these Nodes may also provide sensing capabilities. As a non-limiting example, a construction site may be modelled in an early version of an AVM for the Structure and it may track the location of components that will be assembled into the Structure as well as tools that may be used to construct the Structure as they arrive and, in some cases, leave a job site.

In some embodiments, a mobile Node is moved about to multiple locations within a physical area, such as during variations occurring during a construction job site. As the Node is moved, a height and two-dimensional coordinates of the mobile Node may be varied such that it becomes possible for the mobile Node to communicate with other Nodes in or proximate to the physical area.

In some embodiments, the mobile Node may additionally communicate with other transceiver, such as a Bluetooth Node transmitter, an RFID transceiver, ultrasonic transceiver, infrared transceiver and the like. In some embodiments, the mobile Node may additionally transmit wireless energy to a receiving Node, RFID, or transmitter Node specifically to energize the receiving Node, RFID, or transmitter Node, and enable transceiving by the energy receiving Node, RFID, or transmitter Node.

Referring now to FIG. 14, method steps that may be implemented in some embodiments of the present invention are illustrated. At method step 1401, in some examples, a user may begin by installing wireless access points into a building Structure as it is built. In other embodiments, the wireless access points may be added into the Structure after it is built.

Continuing to method step 1402, a process may next be initiated that may establish a self-verifying array between the installed wireless access points and other devices that are within the communications range of the installed wireless access points. Security protocols may control whether a particular communications element that is within range of such a self-verifying array may gain access.

Continuing to method step 1403, the self-verifying array may detect an entry of a wireless transmitter into an area covered by the self-verifying array. Entry may involve a physical movement of the wireless transmitter or the virtual movement of the coverage of the self-verifying array to include the wireless transmitter. Entry may also include reception of a previously unreceived signal from a wireless transmitter. In some embodiments, entry may include reception of a previously unreceived frequency of a signal from a wireless transmitter. For example, it may be desirable not to detect the wireless transmitter until a chosen time, at which point a switch or other apparatus may vary the frequency of the signal from the wireless transmitter.

Depending on various security protocols and generalized network protocols, an optional method step at 1404 may be performed to incorporate a newly detected wireless transmitter (such as a mobile device) into communications with the self-verifying array. Proceeding to Step 1405, the network may optionally be configured by a user to direct a movement of one of its mobile wireless access points into a new location while still maintaining its communications capabilities with the self-verifying array. Proceeding to Step 1406, the network may optionally be configured by a user to direct a movement of one of its mobile wireless access points to a location where it can simultaneously be connected to the self-verifying array while also establishing communications interchange with a device capable of wireless communications where the device may otherwise not be in range with the self-verifying array.

Commercial Implementations of Self-Verifying Array of Nodes

Self-verifying arrays of Nodes are applicable in many diverse commercial implementations. The following paragraphs describe several diverse implementations utilizing a SVAN.

Referring now to FIG. 16, method steps are illustrated for deploying a SVAN to quantify conditions in a parking area. The parking area may include, for example, a garage or parking lot. Specific embodiments may include one or more of: a rental car parking area; a commercial parking area; a residential parking area; a municipal parking area and the like.

At step 1601, a first Node may be fixedly attached to, placed inside of, or otherwise co-located with a vehicle. The Node will move with the vehicle as the vehicle moves.

At step 1602, a unique identifier associated with the first Node may also be associated with the vehicle with which the Node is co-located. For example, a database may store an association with the unique identifier of the first Node with a Vehicle Identification Number (VIN) of the vehicle.

At step 1603, reference position Nodes other than the first Node may be located at strategic placements within or proximate to the parking area. In some embodiments, the strategic placements selected for reference point Nodes may be based upon one or more of: a shape of parking area; a wireless modality distance capability; a presence of obstacles within an area occupied by a SVAN; at ends of rows defined for parking vehicles; at some or all defined parking spots for parking vehicles at one or more points of interest in a parking lot, such as a point of entry or egress, an office, a walkway, connecting transportation (railway or bus), an elevator or stairwell and the like.

At step 1604, one or more Nodes included in a SVAN may be designated as a Base Node. Base Nodes may be operative to perform functions not necessarily performed by Nodes that are not Base Nodes. For example, Base Nodes may aggregate data over time, perform controller functions, transmit data via more than one wireless modality, be powered by utility-based alternating current, or communicate via a hardwired medium (e.g., via ethernet cabling).

At step 1605, one or more of the Nodes may communicate with other Nodes. Preferably, each Node will communicate with each other node within range of a communication Modality. In some embodiments, a pattern of Node communication may be followed.

At step 1606, in some embodiments, a pattern of communication may stagger a time of wireless communication in order to avoid interference of one communication by another communication. A pattern of communication may therefore include a "cascade" or hierarchical tree of wireless communication transmission and receipt. For example, a Base Node may communicate first, followed by a first generation of Nodes that receive a communication from the Base Node, and followed by communicating from the first generation of Nodes with a second generation of Nodes (e.g., Nodes that are out of range or obstructed from communicating with the Base Node), then to third generation Nodes, etc.

At step 1607, one or more Nodes within the SVAN may be designated to communicate with a network access device extraneous to the SVAN. For example, a designated Node may aggregate data, such as an aggregation of values for communication variables or sensor-generated data; and communicate the aggregated data to a destination outside of the SVAN (such as, via a cellular transmission or an IP Protocol transmission).

At step 1608, in some embodiments, a SVAN may be defined based upon an ability of SVAN participant Nodes to communicate with each other via a primary communication Modality. For example, a primary communication modality may include a Bluetooth modality, Wi-Fi, Wi-Fi RTT, sub-GHz radio transmission and the like. A secondary communication modality may include IP transmission, a cellular transmission, sub-GHz communication and the like.

At step 1609, some Nodes may be excluded, based upon an inclusion or exclusion criteria. For example, in some embodiments, only Nodes with unique IDs associated with sedans may be included in a SVAN, or only Nodes with unique IDs associated with vehicles prepped for deployment (e.g., immediate rental) may be included in a SVAN, alternatively, Nodes with IDs associated with vehicles recently returned and/or in need of service may be excluded from a SVAN.

At step 1610, communication variable values may be aggregated. For example, one or more Nodes or a controller may aggregate and store data that is based upon, or quantifies, what transpires during a wireless communication. Examples of data that quantifies, or is based upon, what transpires during a wireless communication, may include, by way of non-limiting example, one or more of: a time of transmission, a time of receipt of a transmission, a phase angle of receipt of a transmission of a single antenna, a respective phase angle of receipt of same transmission by multiple antennas (which may include multiple antennas in one or more arrays of antennas). Other variables may include an amplitude of a received transmission, and a noise factor of a received transmission.

At step 1611, a respective location of some or all of the Nodes in the SVAN may be generated, based upon the values for communication variables that are descriptive of communications with the respective nodes.

At step 1612, in some embodiments, an algorithm (such as those discussed herein) may be provided with values from the aggregated communication variable values to determine a location of a Node. Multiple sets of values and/or multiple algorithms may be used to disparately determine a set of locations for a particular Node. The set of locations for the particular Node may in turn by mathematically reconciled to determine a best location for the Node. For example, outlier sets of values may be set aside, included sets of values, and/or the set of locations for the particular Node may be used to generate an average, a median, a weighted average, or other combined value.

At step 1613, a location of some or all Nodes in a SVAN may be plotted in a graphical representation. The location for a Node may be the locations determined as described herein. In some embodiments, the unique IDs for plotted Nodes may be included in the graphical representation. Alternatively, or in addition to, the unique IDs, an annotation associated with a particular Node may be included in the graphical representation. A graphical representation may include one or both of two-dimensional and three-dimensional models of space occupied by the SVAN. In some embodiments, these spatial models may be augmented with a time variable (e.g., by displaying a change in an area covered by a SVAN over time).

At step 1614, in some embodiments, a position of an Agent-supported Smart Device may be determined relative to one or more of the Nodes in a SVAN. The Agent-supported Smart Device may be a smart phone carried by a person or a smart device attached to a UAV or UGV. In some embodiments, the smart device will be programmed to communicate with a Base Node when the determines that it is within communication range with the Base Node using a predetermined communication modality. For example, a GPS position calculated by smart phone may indicate that the smart phone is within Bluetooth 5.1 range of a particular Base Node. The smart phone, acting as a Node, may then initiate Bluetooth 5.1 communication with the particular Base Node.

At step 1615, using Orienteering methods, the SVAN may guide an Agent supporting a Smart Device to a particular vehicle. For example, a customer who has rented a car may be guided to that car via a graphical user interface on a smart phone. A controller may receive position information of the rented car and the customer's smart phone and modify the graphical user interface on the customer's smart phone to provide directions to the rented car. As the customer's smart phone begins the process by communicating with a first set of Nodes (that are within communication range of the customer's smart phone), and as the customer traverses a parking area (or areas proximate to the parking area), the customer's smart phone may transition to communicating with additional Nodes as those additional Nodes come with range of the smart phone. A graphical user interface will be modified as the customer traverses the parking area to reflect in real time a relative of the customer and the rented car (or other programmed destination, such as a rental car, office, or elevator).

At step 1616, in some embodiments, an angle of a viewing screen of the customer's smart phone relative to a ground plane may be determined as the customer communicates with the SVAN. The angle of a viewing screen may help determine if an image captured via operation of a smart phone onboard-CCD image generator or other Image Capture Device is suitable for inclusion in a graphical user interface. For example, most smart device-onboard CCD Image Capture Devices have a field of view that is generally perpendicular to a viewing screen of a smart phone. Consequently, a customer may hold up the customer's smart phone at an angle generally perpendicular to the ground plane and capture a view of an area towards which the customer is walking.

At step 1617, a graphical user interface may be overlaid on top of an image captured by the CCD Image Capture Device in a position perpendicular to the ground plane. Positions of Nodes within the field of view of the CCD device may be indicated in combination with the image data captured by the CCD device, based upon the verified position of the CCD device, an angle at which the CCD device is being supported and a direction of interest determined via automated Orienteering apparatus and methods.

Embodiments may include the positions of the Nodes within the field of view of an Image Capture Device associated with the smart phone being indicated as the vehicles with which they are associated and information related to those vehicles. Information may include, for example, an indication of which vehicle is being rented by a particular customer associated with the smart device; which vehicles need service; a vehicle type (compact, midsize, truck, specialty); which vehicles are recently returned; which vehicles are ready to be rented, etc.

At step 1618, the graphical user interface may also include annotations or other details as they relate to the Nodes and/or the associated vehicles and/or aspects included in the field of view, such as a parking row number, an exit, an office, or other detail.

At step 1619, in another aspect, some embodiments may include an overlay of image data captured in a field of view with information descriptive of, or related to a Node with a position within the Field of View. Node information may include, for example, the unique ID associated with the Node, a Node model, battery charge remaining, signal strength, time of last communication, details of data stored on the Node, amount of storage left in the Node, etc. In some embodiments, Nodes included in a GUI may be limited to those Nodes associated with vehicles and not display Nodes deployed as reference position Nodes or associated with other items.

At step 1620, in still another aspect, in some embodiments, a Node fixed to or within a vehicle may continue to communicate after it exits a parking area. For example, if a Node is able to communicate with another Node, one or both of the Nodes external to the parking area may note a GPS location and store the GPS location in a manner associated with the Node to Node communication. If a Node is in a vehicle that is in motion, the Node may also note aspects of the travel of the vehicle in which the Node is located, such as, one or more of: speed, acceleration, vehicle diagnostics. Similarly, the Node may note a speed, acceleration and location of a Node with which it is communicating. All or some communication data generated as a result of the Node-to-Node communication may be transmitted via a modality other than a modality used for the Node-to-Node communication. For example, if Node-to-Node communication is accomplished via a Bluetooth modality or a sub-GHz modality, the information resulting from the Node-to-Node communication may be retransmitted via a cellular or IP modality to an off-SVAN destination. Off-SVAN destinations may include, for example, a server, a controller or a smart device, in logical communication with the Internet or a cellular connection, Referring now to FIG. 17, method steps are illustrated for deploying a SVAN to manage activities, materials and people on a construction site. The construction site may include contract workers, tradesmen, management, guests, equipment, emerging building structure, undeployed materials and materials included in the structure, and the like.

At step 1701, a unique Node ID is associated with one or more of: onsite Agent, material, equipment, structural aspect, or reference point (e.g., pole placed onsite specifically to provide positional reference).

At step 1702, a first Node may be fixedly attached to, placed inside of, or otherwise co-located with one or more of: an onsite Agent, material, equipment, structural aspect, or a reference point.

At step 1703, reference point Nodes are located at strategic points within or proximate to the Construction site. In some embodiments, the strategic placements selected for reference point Nodes may be based upon one or more of: a shape of the construction area; a wireless modality distance capability; a presence of obstacles within an area occupied by a SVAN; at ends of constructed elements on a construction site, and the like.

At step 1704, one or more Nodes included in a SVAN may be designated as a Base Node. Base Nodes may be operative to perform functions not necessarily performed by Nodes that are not Base Nodes. For example, Base Nodes may aggregate data over time, perform controller functions, transmit data via more than one wireless Modality, be powered by utility-based alternating current, or communicate via a hardwired medium (e.g., ethernet cabling).

At step 1705, one or more of the Nodes may communicate with other Nodes. Preferably, each Node will communicate with each other node within range of a communication modality. In some embodiments, a pattern of Node communication may be followed.

At step 1706, in some embodiments, a pattern of communication may stagger a time of wireless communication in order to avoid interference of one communication by another communication. A pattern of communication may therefore include a "cascade" or hierarchical tree of wireless communication transmission and receipt. For example, a Base Node may communicate first, followed by a first generation of Nodes that receive a communication from the Base Node, follow up by communication from the first generation of Nodes with a second generation of Nodes (e.g., Nodes that are out of range or obstructed from communicating with the Base Node), then to third generation Nodes, etc.

At step 1707, one or more Nodes within the SVAN may be designated to communicate with a network access device extraneous to the SVAN. For example, a designated Node may aggregate data, such as an aggregation of values for communication variables or sensor-generated data; and communicate the aggregated data to a destination outside of the SVAN (such as via a cellular transmission or an IP transmission).

At step 1708, in some embodiments, a SVAN may be defined based upon an ability of SVAN participant Nodes to communicate with each other via a primary communication modality. For example, a primary communication modality may include a Bluetooth modality, Wi-Fi, Wi-Fi RTT, sub GHz radio transmission and the like, and a secondary communication modality may include IP Protocol transmission, a cellular transmission, sub-GHz communication and the like.

At step 1709, some Nodes may be excluded based upon an inclusion or exclusion criteria. For example, in some embodiments, only Nodes with unique IDs associated with a particular type of equipment may be included in a SVAN, or only Nodes with unique IDs associated with materials prepped for deployment (e.g., immediate assembly into a structure) may be included in a SVAN. Alternatively, Nodes with IDs associated with construction equipment recently returned or in need of service may be excluded from a SVAN.

At step 1710, communication variable values may be aggregated. For example, one or more Nodes or a controller may aggregate and store data that is based upon, or quantifies, what transpires during a wireless communication. Examples of data that quantifies, or is based upon, what transpires during a wireless communication, may include, by way of non-limiting example, one or more of: a time of transmission, a time of receipt of a transmission, a phase angle of receipt of a transmission of a single antenna, a respective phase angle of receipt of same transmission by multiple antennas (which may include multiple antennas in one or more arrays of antennas). Other variables may include an amplitude of a received transmission, and a noise factor of a received transmission.

At step 1711, a respective location of some or all of the Nodes in the SVAN may be generated, based upon the values for communication variables that are descriptive of communications with the respective nodes. Methods and variables involved in determining a location for a Node are discussed extensively herein.

At step 1712, in some embodiments, an algorithm (such as those discussed herein) may be provided with values from the aggregated communication variable values to determine a location of a Node. Multiple sets of values and/or multiple algorithms may be used to disparately determine a set of locations for a particular Node. The set of locations for the particular Node may in turn be mathematically reconciled to determine a best location for the Node. For example, outlier sets of values may be set aside. Included sets of values and/or the set of locations for the particular Node may be used to generate an average, weighted average, or other combined value.

At step 1713, a location of some or all Nodes in a SVAN may be plotted in a graphical representation. The location for a Node may be the locations determined as described herein. In some embodiments, the unique IDs for plotted Nodes may be included in the graphical representation. Alternatively, or in addition to, the unique IDs, an annotation associated with a particular Node may be included in the graphical representation. A graphical representation may include one or both of two-dimensional and three-dimensional models of space occupied by the SVAN.

At step 1714, in some embodiments, a position of an Agent-supported Smart Device may be determined relative to one or more of the Nodes in a SVAN. The Agent-supported Smart Device may be a smart phone carried by a person or a smart device attached to a UAV or UGV. In some embodiments, the Smart Device will be programmed to communicate with a Base Node when the Smart Device determines that it is within communication range with the Base Node using a predetermined communication modality. For example, a GPS position calculated by a smart phone may indicate that the smart phone is within Bluetooth 5.1 range of a particular Base Node. The smart phone, acting as a Node, may then initiate Bluetooth 5.1 communication with the particular Base Node.

At step 1715, using Orienteering methods, the SVAN may guide an Agent supporting a Smart Device to a particular piece of equipment, a set of materials, a staging area, a drop off area, an office, or the like. For example, a worker who has placed a piece of equipment on a construction lot may be guided to that equipment via a graphical user interface on a smart phone. A controller may receive position information of the equipment and the customer's smart phone and modify the graphical user interface on the customer's smart phone to provide directions to the equipment. An Agent's Smart Device may begin the process by communicating with a first set of Nodes (that are within communication range of the customer's smart phone), and as the customer traverses a construction site (or areas proximate to the construction site), the customer's smart phone may transition to communicating with additional Nodes as those additional Nodes come with range of the smart phone. A graphical user interface may be modified as the customer traverses the construction site to reflect in real time a relative location of the customer and the equipment.

In general, a user interface may be displayed upon a Smart Device, touch screen or other human ascertainable mechanism. The interface may display positions of Nodes and/or associated Sensors, associated Structure aspects, communications paths between Nodes, communications interrupted by perceived obstructions, locations of items of interest, locations of Agents, locations of non-Agent persons and the like.

At step 1716, in some embodiments, an angle of a viewing screen of the customer's smart phone relative to a ground plane may be determined as the customer communicates with the SVAN. The angle of a viewing screen may help determine if an image captured via operation of a smart phone onboard CCD image generator or other Image Capture Device is suitable for inclusion in a graphical user interface. For example, most smart device-onboard CCD Image Capture Devices have a field of view that is generally perpendicular to a viewing screen of a smart phone. Consequently, a customer may hold up the customer's smart phone at an angle generally perpendicular to the ground plane and capture a view of an area towards which the customer is walking.

At step 1717, a graphical user interface may be overlaid on top of an image captured by the CCD image capture device in a position perpendicular to the ground plane. Positions of Nodes within the field of view of the CCD device may be indicated in combination with the image data captured by the CCD device, based upon the verified position of the CCD device, an angle at which the CCD device is being supported and a direction of interest determined via automated Orienteering apparatus and methods.

At step 1718, the graphical user interface may also include annotations or other details as they relate to the Nodes and/or the associated equipment, material, structural aspects, agents and/or aspects included in the Field of View, such as a site topographic drawing references or other detail.

At step 1719, in another aspect, some embodiments may include an overlay of image data captured in a field of view with information descriptive of, or related to a Node with a position within the Field of View. Node information may include, for example the unique ID associated with the Node, a Node model, battery charge remaining, signal strength, time of last communication, details of data stored on the Node, amount of storage left in the Node, etc. In some embodiments, Nodes included in a GUI may be limited to those Nodes associated with equipment, materials, agents, and the like. The GUI may not display Nodes deployed as reference position Nodes or associated with other items.

At step 1720, in some embodiments, Node information may be integrated into Augmented Virtual Model (CAD), as well as any sensor co-located with Nodes.

Referring now to FIG. 18, method steps are illustrated for deploying a SVAN to quantify conditions in a parking area. The parking area may include, for example, a garage or parking lot. Specific embodiments may include one or more of: a rental car parking area; a commercial parking area; a residential parking area; a municipal parking area and the like.

At step 1801, a unique ID number is associated with a Node ID.

At step 1802, respective Nodes are placed within, or proximate to, multiple respective defined occupancy areas. The occupancy areas may include, by way of non-limiting example, a hotel room and a healthcare provider room.

At step 1803, a Sensor and/or Sensor assembly, such as a multi-sensor module, is placed win logical communication with at least one Node that is within or proximate to each disparate defined occupancy space. In some embodiments, the strategic placement of Nodes may be based upon one or more of: a shape of the construction area; a wireless modality distance capability; a presence of obstacles within an area occupied by a SVAN; at ends of constructed elements on a construction site, and the like.

At step 1804, one or more Nodes included in a SVAN may be designated as a Base Node. Base Nodes may be operative to perform functions not necessarily performed by Nodes that are not Base Nodes. For example, Base Nodes may aggregate data over time, perform Controller functions, transmit data via more than one wireless Modality, be powered by utility-based A/C current, and/or communicate via a hardwired medium (e.g., ethernet cabling).

At step 1805, one or more of the Nodes may communicate with other Nodes. Preferably, each Node will communicate with each other Node within range of a communication modality. In some embodiments, a pattern of Node communication may be followed (e.g., through the cascading process described above).

At step 1806, in some embodiments, a pattern of communication may stagger a time of wireless communication in order to avoid interference of one communication by another communication. A pattern of communication may therefore include a "cascade" or hierarchical tree of wireless communication transmission and receipt. For example, a Base Node may communicate first, followed by a first generation of Nodes that receive a communication from the Base Node, followed by communication by the first generation of Nodes with a second generation of Nodes (e.g., Nodes that are out of range or obstructed from communicating with the Base Node), then to third generation Nodes, etc.

At step 1807, one or more Nodes within the SVAN may be designated to communicate with a network access device extraneous to the SVAN. For example, a designated Node may aggregate data, such as an aggregation of values for communication variables, Sensor-generated data; and communicate the aggregated data to a destination outside of the SVAN (such as, via a cellular transmission or an IP transmission).

At step 1808, in some embodiments, a SVAN may be defined based upon an ability of SVAN participant Nodes to communicate with each other via a primary communication modality. For example, a primary communication modality may include a Bluetooth modality, Wi-Fi, Wi-Fi RTT, sub-GHz radio transmission and the like, and a secondary communication modality may include IP transmission, a cellular transmission, sub-GHz communication and the like.

At step 1809, some Nodes may be excluded, based upon an inclusion or exclusion criteria. For example, in some embodiments, only Nodes with unique IDs associated with a particular occupant, or only Nodes with unique IDs associated with occupancy areas that Sensor readings indicate are vacant, may be included in a SVAN. Similarly, Nodes with IDs associated with a group of persons or an item of equipment, as well as reference point position Nodes, may be included in inclusion or exclusion criteria.

At step 1810, communication variable values may be aggregated. For example, one or more Nodes or a controller may aggregate and store data that is based upon, or quantifies, what transpires during a wireless communication. Examples of data that quantifies, or is based upon, what transpires during a wireless communication, may include, by way of non-limiting example, one or more of: a time of transmission, a time of receipt of a transmission, a phase angle of receipt of a transmission of a single antenna, a respective phase angle of receipt of same transmission by multiple antennas (which may include multiple antennas in one or more arrays of antennas). Other variables may include an amplitude of a received transmission, and a noise factor of a received transmission. Data generated by Sensors associated with the respective Nodes may also be aggregated.

At step 1811, a respective location of some, or all, of the Nodes in the SVAN may be generated, based upon the values for communication variables that are descriptive of communications with the respective nodes. Methods and variables involved in determining a location for a Node are discussed extensively herein.

At step 1812, in some embodiments, an algorithm (such as those discussed herein) may be provided with values from the aggregated communication variable values to determine a location of a Node. Multiple sets of values and/or multiple algorithms may be used to disparately determine a set of locations for a particular Node. The set of locations for the particular Node may in turn by mathematically reconciled to determine a best location for the Node. For example, outlier sets of values may be set aside, included sets of values, and/or the set of locations for the particular Node may be used to generate an average, a mean of other combined value.

At step 1813, a location of some, or all, Nodes in a SVAN may be plotted in a graphical representation. The location for a Node may be the locations determined as described herein. In some embodiments, the unique IDs for plotted Nodes may be included in the graphical representation. Alternatively, or in addition to, the unique IDs, an annotation associated with a particular Node may be included in the graphical representation. A graphical representation may include one or both of two-dimensional and three-dimensional models of space occupied by the SVAN.

At step 1814, in some embodiments, a position of an Agent-supported Smart Device may be determined relative to one or more of the Nodes in a SVAN. The Agent-supported Smart Device may be a smart phone carried by a person, or a Smart Device attached to a UAV or UGV. In some embodiments, the Smart Device will be programmed to communicate with a Base Node when the Smart Device determines that it is within communication range with the Base Node using a predetermined communication modality. For example, a GPS position calculated by a smart phone may indicate that the smart phone is within Bluetooth 5.1 range of a particular Base Node. The smart phone, acting as a Node may then initiate Bluetooth 5.1 communication with the particular Base Node.

At step 1815, using Orienteering methods, the SVAN may guide an Agent supporting a smart device to a particular piece of occupancy area, such as an occupancy area that Sensor data indicates is vacant or an area that the Sensor data indicates is occupied.

In some embodiments, a controller may receive position information of the occupancy area and the Agent's smart phone and modify the graphical user interface on the Agent's smart phone to provide directions to a selected occupancy area. The Agent's smart phone may begin by being guided via processing of values for variables of communications with a first set of Nodes (what are within communication range of the Agent's smart phone), and as the Agent traverses a structure containing the occupancy areas (or areas proximate to the occupancy area), the Agent's smart phone may transition to communicating with additional Nodes as those additional Nodes come within range of the smart phone. A graphical user interface may be modified as the Agent traverses the c structure containing the occupancy areas to reflect in real time a relative location of the Agent and an occupancy area of interest At step 1816, in some embodiments, an angle of a viewing screen of the Agent's smart phone relative to a ground plane may be determined as the Agent communicates with the SVAN. The angle of a viewing screen may help determine if an image captured via operation of a smart phone onboard CCD image generator (e.g., charged coupled device camera) is suitable for inclusion in a graphical user interface. For example, most smart device onboard CCD image capture devices have a field of view that is generally perpendicular to a viewing screen of a smart phone. Consequently, an Agent may hold up the Agent's smart phone at an angle generally perpendicular to the ground plane and capture a view of an area towards which the Agent is walking.

At step 1817, a graphical user interface may be overlaid on top of an image captured by the CCD Image Capture Device in a position perpendicular to the ground plane, and positions of Nodes within the field of view of the CCD device may be indicated in combination with the image data captured by the CCD device, based upon the verified position of the CCD device, an angle at which the CCD device is being supported and a direction of interest determined via automated Orienteering apparatus and methods.

At step 1818, the graphical user interface may also include annotations or other details as they relate to the Nodes and/or the associated occupancy areas and/or aspects included in the field of view, such as a site topographic drawing references or other detail.

At step 1819, in another aspect, some embodiments may include an overlay of image data captured in a field of view with information descriptive of, or related to, a Node with a position within the field of view. Node information may include, for example, the unique ID associated with the Node, a Node model, battery charge remaining, signal strength, time of last communication, details of data stored on the Node, amount of storage left in the Node, etc. In some embodiments, Nodes included in a GUI may be limited to those Nodes associated with a particular occupancy area, or group of occupancy areas. The GUI may or may not, upon discretion of a User or system manager, display Nodes deployed as reference position Nodes or associated with other items.

At step 1820, in some embodiments, Node information and occupancy areas may be integrated into an Augmented Virtual Model (AVM) as well as data from any Sensor co-located with Nodes.

Referring now to FIG. 19, method steps are illustrated for deploying a SVAN and displaying or communicating geolocated information. At step 1901, the method may include associating a respective unique identifier for each of at least a first Node; a second Node and a third Node included in an array of Nodes, wherein each of the first Node; second Node and third Node comprises: a processor, a digital storage, a communication module and an antenna.

At step 1902, the method may include designating a base position in relation to the first Node.

At step 1903, the method may include wirelessly communicating between multiple Nodes comprising at least the first Node the second Node, the third Node and a fourth Node, wherein the fourth node includes an agent supporting a smart device with a wireless communication capability who enters a structure space comprising at least the first Node, the second Node and the third Node, and wherein the fourth Node comprises an antenna array.

At step 1904, the method may include generating values for the first Node; the second Node and the third Node, for communication variables based upon the wirelessly communicating between the first Node, the second Node and the third Node, wherein the communication variables may include: one or more of a start time of a respective wireless communication transmission (T1), a receipt time of the respective wireless communication (T2), or a calculated transmission time. The communication variables may also include one or more of a phase difference of the respective wireless communication transmission between a respective first antenna and a respective second antenna, or a calculated angle of arrival based upon the phase difference.

At step 1905, the method may include calculating relative position coordinates for the first Node, the second Node and the third node based on the communication variables of step 1904.

At step 1906, the method may include generating values, for the fourth Node, for communication variables based upon the wirelessly communicating between the first Node, the second Node and the third Node, wherein the communication variables may include one or more of a start time of a respective wireless communication transmission (T1), a receipt time of the respective wireless communication (T2), or a calculated transmission time. The communication variables may also include one or more of a phase difference of the respective wireless communication transmission between at least a respective first antenna and a respective second antenna within the antenna array of the smart device.

At step 1907, the method may include calculating a relative position and a relative orientation of the fourth node of the smart device based on the communication variables of step 1906, wherein the relative orientation determines a direction of interest of the user in the structure space.

At step 1908, the method may include communicating information stored within the self-verifying array of nodes to the smart device, wherein a selection of data to transmit as the information utilizes the relative orientation and relative position calculated for the fourth Node.

CONCLUSION

Particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order show, or sequential order, to achieve desirable results. In certain implementations, multitasking and parallel processing may be advantageous. Nevertheless, it will be understood that various modifications may be made without departing from the spirit and scope of the claimed invention.

The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including but not limited to. To facilitate understanding, like reference numerals have been used, where possible, to designate like elements common to the figures.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted the terms "comprising", "including", and "having" can be used interchangeably.

Certain features that are described in this specification in the context of separate embodiments can also be implemented in combination in a single embodiment. Conversely, various features that are described in the context of a single embodiment can also be implemented in combination in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while method steps may be depicted in the drawings in a particular order, this should not be understood as requiring that such operations be performed in the particular order shown or in a sequential order, or that all illustrated operations be performed, to achieve desirable results.

What is claimed is:

1. A method of communicating geolocated information to a user in a self-verifying array of Nodes, the method comprising:
 a) associating a respective unique identifier for each of at least a first Node; a second Node and a third Node included in an array of Nodes, wherein each of the first Node; second Node and third Node comprises: a processor, a digital storage, a communication module and an antenna;
 b) designating a base position in relation to the first Node;
 c) wirelessly communicating between multiple Nodes comprising at least the first Node the second Node, the third Node and a fourth Node, wherein the fourth node comprises an agent supporting a smart device with a wireless communication capability who enters a structure space comprising at least the first Node, the second Node and the third Node, and wherein the fourth Node comprises an antenna array;

d) for the first Node; the second Node and the third Node, generating values for communication variables based upon the wirelessly communicating between the first Node, the second Node and the third Node, wherein the communication variables comprise:

one or more of a start time of a respective wireless communication transmission (T1), a receipt time of the respective wireless communication (T2), or a calculated transmission time; and one or more of a phase difference of the respective wireless communication transmission between a respective first antenna and a respective second antenna, or a calculated angle of arrival based upon the phase difference;

e) calculating relative position coordinates for the first Node, the second Node and the third node based on the communication variables of step d);

f) for the fourth Node, generating values for communication variables based upon the wirelessly communicating between the first Node, the second Node and the third Node, wherein the communication variables comprise:

one or more of a start time of a respective wireless communication transmission (T1), a receipt time of the respective wireless communication (T2), or a calculated transmission time; and one or more of a phase difference of the respective wireless communication transmission between at least a respective first antenna and a respective second antenna within the antenna array of the smart device;

g) calculating a relative position and a relative orientation of the fourth node of the smart device based on the communication variables of step f), wherein the relative orientation determines a direction of interest of the user in the structure space; and h) communicating information stored within the self-verifying array of nodes to the smart device, wherein a selection of data to transmit as the information utilizes the relative orientation and relative position calculated for the fourth Node.

2. The method of claim 1 wherein an exchange of password information is performed to verify an engagement of the fourth node into the self-verifying array of nodes.

3. The method of claim 1 wherein the information communicated in step h) is subsequently displayed with a user interface of the smart device.

4. The method of claim 3 wherein the agent interacts with the user interface to select the information communicated.

5. The method of claim 3, additionally comprising the step of, with a controller, generating a graphical user interface comprising a location of each Node.

6. The method of claim 3 additionally comprising generating an overlay of image data with a controller.

7. The method of claim 6 wherein the overlay of image data is associated with a position coordinate within the structure space comprising the first Node, the second Node, and the third Node.

8. The method of claim 6 wherein a database used when generating the overlay of image data resides within a combined data storage capability of the self-verifying array of nodes, and wherein a local residence of the database improves a performance.

9. The method of claim 3 further comprising:

i) tracking a change in relative position coordinates of the fourth node with a repetition of the generating of communication variables of step f);

j) calculating updated values of the relative position and the relative orientation of the fourth node of the smart device of step g); and k) updating the communicating of information of step h) based on the updated relative position and updated relative orientation of the fourth node.

10. The method of claim 1 further comprising:

l) storing additional values for communication variables for communications involving a Node in addition to the first Node; the second Node and the third Node in a respective digital storage of each of the first Node; second Node and third Node;

m) transmitting at least some of the values for communication variables stored in the respective digital storage of each of the first Node; second Node and third Node to a controller;

n) receiving at the controller for communication variables; and o) with the controller, generating a respective set of position coordinates indicative of a position of each of the first Node; the second Node and the third Node relative to the base position, each respective set of position coordinates based upon values included in an aggregate of values for communication variables received into the controller that are associated with the respective unique identifier of the first Node; the second Node and the third Node.

11. The method of claim 1 additionally comprising the step of designating the base position as co-located with a position of the first Node.

12. The method of claim 1 additionally comprising the step of designating the base position as offset from the first Node, according to a set of offset coordinates.

13. The method of claim 1 wherein the step of wirelessly communicating between multiple Nodes comprises an ultra-wideband communication.

14. The method of claim 1 additionally comprising the step of tracking a dynamic Base position by generating multiple respective sets of coordinates that quantify the Base position.

15. The method of claim 1, additionally comprising the step of designating a position of a Sensor as co-located with one of: the base position, first Node, second Node, and third Node.

16. The method of claim 1, additionally comprising the step of designating a position of a Sensor as co-located with fourth node.

17. The method of claim 1, wherein, the communication variables of step f) additionally comprise an amplitude of a received communication.

18. The method of claim 1, wherein, the values of the communication variables additionally comprise an indication of radio wave noise included in received communication.

19. The method of claim 1, additionally comprising the step of, with a controller, generating a position of a perceived obstruction based upon the communications variables.

20. The method of claim 19, additionally comprising the step of, with a controller, generating a description of an influence of the perceived obstruction on the values for communications variables.

* * * * *